(12) United States Patent
Wan et al.

(10) Patent No.: US 12,260,156 B2
(45) Date of Patent: Mar. 25, 2025

(54) AUTOMATED TOOLS FOR INCREMENTAL GENERATION OF BUILDING MAPPING INFORMATION

(71) Applicant: MFTB Holdco, Inc., Seattle, WA (US)

(72) Inventors: Zhiqiang Wan, Wyoming, RI (US); Will A. Hutchcroft, Seattle, WA (US); Manjunath Narayana, Chino Hills, CA (US); Ivaylo Boyadzhiev, Seattle, WA (US); Yuguang Li, Seattle, WA (US)

(73) Assignee: MFTB Holdco, Inc., Seattle, WA (US)

( * ) Notice: Subject to any disclaimer, the term of this patent is extended or adjusted under 35 U.S.C. 154(b) by 421 days.

(21) Appl. No.: 17/872,914

(22) Filed: Jul. 25, 2022

(65) Prior Publication Data
US 2024/0029352 A1   Jan. 25, 2024

(51) Int. Cl.
*G06F 30/13* (2020.01)
*G06T 7/11* (2017.01)
(Continued)

(52) U.S. Cl.
CPC ............ *G06F 30/13* (2020.01); *G06T 7/11* (2017.01); *G06T 7/55* (2017.01); *G06T 7/70* (2017.01);
(Continued)

(58) Field of Classification Search
None
See application file for complete search history.

(56) References Cited

U.S. PATENT DOCUMENTS 5,140,352 A   8/1992   Moore et al.
6,031,540 A   2/2000   Golin et al.
(Continued)

FOREIGN PATENT DOCUMENTS

EP   2413097 A2   2/2012
EP   2505961 A2   10/2012
(Continued)

OTHER PUBLICATIONS

CubiCasa | From video to floor plan in under 5 minutes, retrieved on Mar. 26, 2019, from https://www.cubi.casa/, 6 pages.
(Continued)

*Primary Examiner* — Jwalant Amin
(74) *Attorney, Agent, or Firm* — VLP Law Group LLP; James A. D. White

(57) ABSTRACT

Techniques are described for computing devices to perform automated operations related to using images acquired in a building as part of an automated generation process of a floor plan or other mapping information for the building, in some cases without using depth information from depth-sensing equipment about distances from the images' acquisition locations to objects in the surrounding building, and for subsequent use in further automated manners, such as controlling navigation of mobile devices and/or for display to end users in a corresponding graphical user interface. The automated analysis and assessment of the building images may, for example, include incrementally generating partial versions of the mapping information, determining acquisition instructions related to further acquisition of additional images and/or other types of data (e.g., to reduce uncertainty associated with portions of the partial mapping information or otherwise obtain missing data), and providing corresponding guidance in or more manners.

26 Claims, 21 Drawing Sheets
(11 of 21 Drawing Sheet(s) Filed in Color)

(51) Int. Cl.
  *G06T 7/55* (2017.01)
  *G06T 7/70* (2017.01)
  *G06T 17/05* (2011.01)
  *H04N 23/698* (2023.01)
  *G06F 30/12* (2020.01)

(52) U.S. Cl.
  CPC .......... *G06T 17/05* (2013.01); *H04N 23/698* (2023.01); *G06F 30/12* (2020.01); *G06T 2200/08* (2013.01); *G06T 2200/24* (2013.01); *G06T 2207/20021* (2013.01); *G06T 2207/20212* (2013.01); *G06T 2207/30244* (2013.01)

(56) References Cited

U.S. PATENT DOCUMENTS

| | | |
|---|---|---|
| 6,141,034 A | 10/2000 | McCutchen |
| 6,317,166 B1 | 11/2001 | McCutchen |
| 6,320,584 B1 | 11/2001 | Golin et al. |
| 6,323,858 B1 | 11/2001 | Gilbert et al. |
| 6,337,683 B1 | 1/2002 | Gilbert et al. |
| 6,654,019 B2 | 11/2003 | Gilbert et al. |
| 6,683,608 B2 | 1/2004 | Golin et al. |
| 6,690,374 B2 | 2/2004 | Park et al. |
| 6,731,305 B1 | 5/2004 | Park et al. |
| 6,738,073 B2 | 5/2004 | Park et al. |
| 7,050,085 B1 | 5/2006 | Park et al. |
| 7,129,971 B2 | 10/2006 | McCutchen |
| 7,196,722 B2 | 3/2007 | White et al. |
| 7,525,567 B2 | 4/2009 | McCutchen |
| 7,620,909 B2 | 11/2009 | Park et al. |
| 7,627,235 B2 | 12/2009 | McCutchen et al. |
| 7,782,319 B2 | 8/2010 | Ghosh et al. |
| 7,791,638 B2 | 9/2010 | McCutchen |
| 7,909,241 B2 | 3/2011 | Stone et al. |
| 7,973,838 B2 | 7/2011 | McCutchen |
| 8,072,455 B2 | 12/2011 | Temesvari et al. |
| 8,094,182 B2 | 1/2012 | Park et al. |
| RE43,786 E | 11/2012 | Cooper |
| 8,463,020 B1 | 6/2013 | Schuckmann et al. |
| 8,517,256 B2 | 8/2013 | Stone et al. |
| 8,520,060 B2 | 8/2013 | Zomet et al. |
| 8,523,066 B2 | 9/2013 | Stone et al. |
| 8,523,067 B2 | 9/2013 | Stone et al. |
| 8,528,816 B2 | 9/2013 | Stone et al. |
| 8,540,153 B2 | 9/2013 | Stone et al. |
| 8,594,428 B2 | 11/2013 | Aharoni et al. |
| 8,654,180 B2 | 2/2014 | Zomet et al. |
| 8,666,815 B1 | 3/2014 | Chau |
| 8,699,005 B2 | 4/2014 | Likholyot |
| 8,705,892 B2 | 4/2014 | Aguilera et al. |
| RE44,924 E | 6/2014 | Cooper et al. |
| 8,854,684 B2 | 10/2014 | Zomet |
| 8,861,840 B2 | 10/2014 | Bell et al. |
| 8,861,841 B2 | 10/2014 | Bell et al. |
| 8,879,828 B2 | 11/2014 | Bell et al. |
| 8,953,871 B2 | 2/2015 | Zomet |
| 8,989,440 B2 | 3/2015 | Klusza et al. |
| 8,996,336 B2 | 3/2015 | Malka et al. |
| 9,021,947 B2 | 5/2015 | Landa |
| 9,026,947 B2 | 5/2015 | Lee et al. |
| 9,035,968 B2 | 5/2015 | Zomet |
| 9,041,796 B2 | 5/2015 | Malka et al. |
| 9,071,714 B2 | 6/2015 | Zomet |
| 9,129,438 B2 | 9/2015 | Aarts et al. |
| 9,151,608 B2 | 10/2015 | Malka et al. |
| 9,165,410 B1 | 10/2015 | Bell et al. |
| 9,171,405 B1 | 10/2015 | Bell et al. |
| 9,324,190 B2 | 4/2016 | Bell et al. |
| 9,361,717 B2 | 6/2016 | Zomet |
| 9,396,586 B2 | 7/2016 | Bell et al. |
| 9,438,759 B2 | 9/2016 | Zomet |
| 9,438,775 B2 | 9/2016 | Powers et al. |
| 9,489,775 B1 | 11/2016 | Bell et al. |
| 9,495,783 B1 | 11/2016 | Samarasekera et al. |
| 9,576,401 B2 | 2/2017 | Zomet |
| 9,619,933 B2 | 4/2017 | Spinella-Marno et al. |
| 9,635,252 B2 | 4/2017 | Accardo et al. |
| 9,641,702 B2 | 5/2017 | Bin-Nun et al. |
| 9,760,994 B1 | 9/2017 | Bell et al. |
| 9,786,097 B2 | 10/2017 | Bell et al. |
| 9,787,904 B2 | 10/2017 | Birkler et al. |
| 9,836,885 B1 | 12/2017 | Eraker et al. |
| 9,852,351 B2 | 12/2017 | Aguilera Perez et al. |
| 9,953,111 B2 | 4/2018 | Bell et al. |
| 9,953,430 B1 | 4/2018 | Zakhor |
| 9,990,760 B2 | 6/2018 | Aguilera Perez et al. |
| 9,990,767 B1 | 6/2018 | Sheffield et al. |
| 10,026,224 B2 | 7/2018 | Bell et al. |
| 10,030,979 B2 | 7/2018 | Bjorke et al. |
| 10,055,876 B2 | 8/2018 | Ford et al. |
| 10,068,344 B2 | 9/2018 | Jovanovic et al. |
| 10,083,522 B2 | 9/2018 | Jovanovic et al. |
| 10,102,639 B2 | 10/2018 | Bell et al. |
| 10,102,673 B2 | 10/2018 | Eraker et al. |
| 10,120,397 B1 | 11/2018 | Zakhor et al. |
| 10,122,997 B1 | 11/2018 | Sheffield et al. |
| 10,127,718 B2 | 11/2018 | Zakhor et al. |
| 10,127,722 B2 | 11/2018 | Shakib et al. |
| 10,139,985 B2 | 11/2018 | Mildrew et al. |
| 10,163,261 B2 | 12/2018 | Bell et al. |
| 10,163,271 B1 | 12/2018 | Powers et al. |
| 10,181,215 B2 | 1/2019 | Sedeffow |
| 10,192,115 B1 | 1/2019 | Sheffield et al. |
| 10,204,185 B2 | 2/2019 | Mrowca et al. |
| 10,210,285 B2 | 2/2019 | Wong et al. |
| 10,235,797 B1 | 3/2019 | Sheffield et al. |
| 10,242,400 B1 | 3/2019 | Eraker et al. |
| 10,339,716 B1 | 7/2019 | Powers et al. |
| 10,366,531 B2 | 7/2019 | Sheffield |
| 10,375,306 B2 | 8/2019 | Shan et al. |
| 10,395,435 B2 | 8/2019 | Powers et al. |
| 10,530,997 B2 | 1/2020 | Shan et al. |
| 10,643,386 B2 | 5/2020 | Li et al. |
| 10,708,507 B1 | 7/2020 | Dawson et al. |
| 10,809,066 B2 | 10/2020 | Colburn et al. |
| 10,825,247 B1 | 11/2020 | Vincent et al. |
| 10,834,317 B2 | 11/2020 | Shan et al. |
| 10,937,247 B1* | 3/2021 | Chuah ............ G06T 7/70 |
| 11,024,079 B1* | 6/2021 | Chuah ............ G06T 7/246 |
| 11,057,561 B2 | 7/2021 | Shan et al. |
| 11,164,361 B2 | 11/2021 | Moulon et al. |
| 11,164,368 B2 | 11/2021 | Vincent et al. |
| 11,165,959 B2 | 11/2021 | Shan et al. |
| 11,217,019 B2 | 1/2022 | Li et al. |
| 11,238,652 B2 | 2/2022 | Impas et al. |
| 11,243,656 B2 | 2/2022 | Li et al. |
| 11,252,329 B1 | 2/2022 | Cier et al. |
| 11,284,006 B2 | 3/2022 | Dawson et al. |
| 11,348,269 B1 | 5/2022 | Ebrahimi Afrouzi et al. |
| 11,830,135 B1* | 11/2023 | Khosravan ............ G06Q 90/20 |
| 2006/0256109 A1 | 11/2006 | Acker et al. |
| 2007/0210937 A1 | 9/2007 | Smith et al. |
| 2008/0126022 A1* | 5/2008 | Hoguet ............ G06F 30/398 703/1 |
| 2010/0232709 A1 | 9/2010 | Zhang et al. |
| 2012/0075414 A1 | 3/2012 | Park et al. |
| 2012/0293613 A1 | 11/2012 | Powers et al. |
| 2013/0050407 A1 | 2/2013 | Brinda et al. |
| 2013/0342533 A1 | 12/2013 | Bell et al. |
| 2014/0043436 A1 | 2/2014 | Bell et al. |
| 2014/0044343 A1 | 2/2014 | Bell et al. |
| 2014/0044344 A1 | 2/2014 | Bell et al. |
| 2014/0125658 A1 | 5/2014 | Bell et al. |
| 2014/0125767 A1 | 5/2014 | Bell et al. |
| 2014/0125768 A1 | 5/2014 | Bell et al. |
| 2014/0125769 A1 | 5/2014 | Bell et al. |
| 2014/0125770 A1 | 5/2014 | Bell et al. |
| 2014/0236482 A1 | 8/2014 | Dorum et al. |
| 2014/0267631 A1 | 9/2014 | Powers et al. |
| 2014/0307100 A1 | 10/2014 | Myllykoski et al. |
| 2014/0320674 A1 | 10/2014 | Kuang |
| 2015/0116691 A1 | 4/2015 | Likholyot |

(56) References Cited

U.S. PATENT DOCUMENTS

| | | |
|---|---|---|
| 2015/0189165 A1 | 7/2015 | Milosevski et al. |
| 2015/0262421 A1 | 9/2015 | Bell et al. |
| 2015/0269785 A1 | 9/2015 | Bell et al. |
| 2015/0302636 A1 | 10/2015 | Arnoldus et al. |
| 2015/0310596 A1 | 10/2015 | Sheridan et al. |
| 2015/0332464 A1 | 11/2015 | O'Keefe et al. |
| 2016/0055268 A1 | 2/2016 | Bell et al. |
| 2016/0134860 A1 | 5/2016 | Jovanovic et al. |
| 2016/0140676 A1 | 5/2016 | Fritze et al. |
| 2016/0217225 A1 | 7/2016 | Bell et al. |
| 2016/0260250 A1 | 9/2016 | Jovanovic et al. |
| 2016/0286119 A1 | 9/2016 | Rondinelli |
| 2016/0300385 A1 | 10/2016 | Bell et al. |
| 2017/0034430 A1 | 2/2017 | Fu et al. |
| 2017/0067739 A1 | 3/2017 | Siercks et al. |
| 2017/0194768 A1 | 7/2017 | Powers et al. |
| 2017/0195654 A1 | 7/2017 | Powers et al. |
| 2017/0263050 A1 | 9/2017 | Ha et al. |
| 2017/0324941 A1 | 11/2017 | Birkler |
| 2017/0330273 A1 | 11/2017 | Holt et al. |
| 2017/0337737 A1 | 11/2017 | Edwards et al. |
| 2018/0007340 A1 | 1/2018 | Stachowski |
| 2018/0025536 A1 | 1/2018 | Bell et al. |
| 2018/0075168 A1 | 3/2018 | Tiwari et al. |
| 2018/0075652 A1* | 3/2018 | Kim ................... G06T 17/00 |
| 2018/0101803 A1* | 4/2018 | Tiwari ............. G06Q 10/06313 |
| 2018/0139431 A1 | 5/2018 | Simek et al. |
| 2018/0143023 A1 | 5/2018 | Bjorke et al. |
| 2018/0143756 A1 | 5/2018 | Mildrew et al. |
| 2018/0144487 A1 | 5/2018 | Bell et al. |
| 2018/0144535 A1 | 5/2018 | Ford et al. |
| 2018/0144547 A1 | 5/2018 | Shakib et al. |
| 2018/0144555 A1 | 5/2018 | Ford et al. |
| 2018/0146121 A1 | 5/2018 | Hensler et al. |
| 2018/0146193 A1 | 5/2018 | Safreed et al. |
| 2018/0146212 A1 | 5/2018 | Hensler et al. |
| 2018/0165871 A1 | 6/2018 | Mrowca |
| 2018/0203955 A1 | 7/2018 | Bell et al. |
| 2018/0241985 A1 | 8/2018 | O'Keefe et al. |
| 2018/0293793 A1 | 10/2018 | Bell et al. |
| 2018/0300936 A1 | 10/2018 | Ford et al. |
| 2018/0306588 A1 | 10/2018 | Bjorke et al. |
| 2018/0348854 A1 | 12/2018 | Powers et al. |
| 2018/0365496 A1 | 12/2018 | Hovden et al. |
| 2019/0012833 A1 | 1/2019 | Eraker et al. |
| 2019/0026956 A1 | 1/2019 | Gausebeck et al. |
| 2019/0026957 A1 | 1/2019 | Gausebeck |
| 2019/0026958 A1 | 1/2019 | Gausebeck et al. |
| 2019/0035165 A1 | 1/2019 | Gausebeck |
| 2019/0041972 A1 | 2/2019 | Bae |
| 2019/0050137 A1 | 2/2019 | Mildrew et al. |
| 2019/0051050 A1 | 2/2019 | Bell et al. |
| 2019/0051054 A1 | 2/2019 | Jovanovic et al. |
| 2019/0087067 A1 | 3/2019 | Hovden et al. |
| 2019/0122422 A1 | 4/2019 | Sheffield et al. |
| 2019/0164335 A1 | 5/2019 | Sheffield et al. |
| 2019/0180104 A1 | 6/2019 | Sheffield et al. |
| 2019/0251645 A1 | 8/2019 | Winans |
| 2019/0287164 A1 | 9/2019 | Eraker et al. |
| 2020/0336675 A1 | 10/2020 | Dawson et al. |
| 2020/0389602 A1* | 12/2020 | Dawson ............... H04N 23/635 |
| 2020/0408532 A1 | 12/2020 | Colburn et al. |
| 2021/0044760 A1 | 2/2021 | Dawson et al. |
| 2021/0377442 A1 | 12/2021 | Boyadzhiev et al. |
| 2021/0385378 A1 | 12/2021 | Cier et al. |
| 2022/0003555 A1 | 1/2022 | Colburn et al. |
| 2022/0028156 A1 | 1/2022 | Boyadzhiev et al. |
| 2022/0028159 A1 | 1/2022 | Vincent et al. |
| 2022/0076019 A1 | 3/2022 | Moulon et al. |
| 2022/0092227 A1 | 3/2022 | Yin et al. |
| 2022/0114291 A1 | 4/2022 | Li et al. |
| 2022/0164493 A1 | 5/2022 | Li et al. |
| 2022/0189122 A1 | 6/2022 | Li et al. |
| 2023/0206393 A1* | 6/2023 | Hutchcroft ............. G06V 10/26 382/284 |
| 2023/0409766 A1* | 12/2023 | Narayana ............. H04N 23/698 |

FOREIGN PATENT DOCUMENTS

| | | |
|---|---|---|
| EP | 2506170 A2 | 10/2012 |
| EP | 4027301 A1 | 7/2022 |
| KR | 101770648 B1 | 8/2017 |
| KR | 101930796 B1 | 12/2018 |
| WO | 2005091894 A2 | 10/2005 |
| WO | 2016154306 A1 | 9/2016 |
| WO | 2018204279 A1 | 11/2018 |
| WO | 2019083832 A1 | 5/2019 |
| WO | 2019104049 A1 | 5/2019 |
| WO | 2019118599 A2 | 6/2019 |

OTHER PUBLICATIONS

CubiCasa FAQ & Manual, retrieved on Mar. 26, 2019, from https://www.cubi.casa/faq/, 5 pages.

Cupix Home, retrieved on Mar. 26, 2019, from https://www.cupix.com/, 1 page.

Cupix—FAQ, retrieved on Mar. 26, 2019, from https://www.cupix.com/faq.html, 3 pages.

iGUIDE: 3D Virtual Tours, retrieved on Mar. 26, 2019, from https://goiguide.com/, 6 pages.

immoviewer.com | Automated Video Creation & Simple Affordable 3D 360 Tours, retrieved on Mar. 26, 2019, from https://www.immoviewer.com/, 5 pages.

MagicPlan | #1 Floor Plan App, Construction & Surveying Samples, retrieved on Mar. 26, 2019, from https://www.magicplan.app/, 9 pages.

EyeSpy360 Virtual Tours | Virtual Tour with any 360 camera, retrieved on Mar. 27, 2019, from https://www.eyespy360.com/en-us/, 15 pages.

Indoor Reality, retrieved on Mar. 27, 2019, from https://www.indoorreality.com/, 9 pages.

InsideMaps, retrieved on Mar. 27, 2019, from https://www.insidemaps.com/, 7 pages.

IStaging | Augmented & Virtual Reality Platform For Business, retrieved on Mar. 27, 2019, from https://www.istaging.com/en/, 7 pages.

Metareal, retrieved on Mar. 27, 2019, from https://www.metareal.com/, 4 pages.

PLNAR—The AR 3D Measuring / Modeling Platform, retrieved on Mar. 27, 2019, from https://www.plnar.co, 6 pages.

YouVR Global, retrieved on Mar. 27, 2019, from https://global.youvr.io/, 9 pages.

GeoCV, retrieved on Mar. 28, 2019, from https://geocv.com/, 4 pages.

Biersdorfer, J.D., "How To Make A 3-D Model Of Your Home Renovation Vision," in The New York Times, Feb. 13, 2019, retrieved Mar. 28, 2019, 6 pages.

Chen et al. "Rise of the indoor crowd: Reconstruction of building interior view via mobile crowdsourcing." In: Proceedings of the 13th ACM Conference on Embedded Networked Sensor Systems. Nov. 4, 2015, 13 pages.

Immersive 3D for the Real World, retrieved from https://matterport.com/, on Mar. 27, 2017, 5 pages.

Learn About Our Complete 3D System, retrieved from https://matterport.com/how-it-works/, on Mar. 27, 2017, 6 pages.

Surefield FAQ, retrieved from https://surefield.com/faq, on Mar. 27, 2017, 1 page.

Why Surefield, retrieved from https://surefield.com/why-surefield, on Mar. 27, 2017, 7 pages.

Schneider, V., "Create immersive photo experiences with Google Photo Sphere," retrieved from http://geojournalism.org/2015/02/create-immersive-photo-experiences-with-google-photo-sphere/, on Mar. 27, 2017, 7 pages.

Tango (platform), Wikipedia, retrieved from https://en.wikipedia.org/wiki/Tango_(platform), on Jun. 12, 2018, 5 pages.

(56) References Cited

OTHER PUBLICATIONS

Zou et al. "LayoutNet: Reconstructing the 3D Room Layout from a Single RGB Image" in arXiv:1803.08999, submitted Mar. 23, 2018, 9 pages.
Lee et al. "RoomNet: End-to-End Room Layout Estimation" in arXiv:1703.00241v2, submitted Aug. 7, 2017, 10 pages.
Time-of-flight camera, Wikipedia, retrieved from https://en.wikipedia.org/wiki/Time-of-flight_camera, on Aug. 30, 2018, 8 pages.
Magicplan—Android Apps on Go . . . , retrieved from https://play.google.com/store/apps/details?id=com.sensopia.magicplan, on Feb. 21, 2018, 5 pages.
Pintore et al., "AtlantaNet: Inferring the 3D Indoor Layout from a Single 360 Image beyond the Manhattan World Assumption", ECCV 2020, 16 pages.
Cowles, Jeremy, "Differentiable Rendering", Aug. 19, 2018, accessed Dec. 7, 2020 at https://towardsdatascience.com/differentiable-rendering-d00a4b0f14be, 3 pages.
Yang et al., "DuLa-Net: A Dual-Projection Network for Estimating Room Layouts from a Single RGB Panorama", in arXiv:1811.11977[cs.v2], submitted Apr. 2, 2019, 14 pages.
Sun et al., "HoHoNet: 360 Indoor Holistic Understanding with Latent Horizontal Features", in arXiv:2011.11498[cs.v2], submitted Nov. 24, 2020, 15 pages.
Nguyen-Phuoc et al., "RenderNet: A deep convolutional network for differentiable rendering from 3D shapes", in arXiv:1806.06575[cs.v3], submitted Apr. 1, 2019, 17 pages.
Convolutional neural network, Wikipedia, retrieved from https://en.wikipedia.org/wiki/Convolutional_neural_network, on Dec. 7, 2020, 25 pages.
Hamilton et al., "Inductive Representation Learning on Large Graphs", in 31st Conference on Neural Information Processing Systems (NIPS 2017), 2017, 19 pages.
Kipf et al., "Variational Graph Auto-Encoders", in arXiv:1611.07308v1 [stat.ML], submitted Nov. 21, 2016, 3 pages.
Cao et al., "MolGAN: An Implicit Generative Model For Small Molecular Graphs", in arXiv:1805.11973v1 [stat.ML], submitted May 30, 2018, 11 pages.
Chen et al., "Intelligent Home 3D: Automatic 3D-House Design from Linguistic Descriptions Only", in arXiv:2003.00397v1 [cs.CV], submitted Mar. 1, 2020, 14 pages.
Cucurull et al., "Context-Aware Visual Compatibility Prediction", in arXiv:1902.03646v2 [cs.CV], submitted Feb. 12, 2019, 10 pages.
Fan et al., "Labeled Graph Generative Adversarial Networks", in arXiv:1906.03220v1 [cs.LG], submitted Jun. 7, 2019, 14 pages.
Gong et al., "Exploiting Edge Features in Graph Neural Networks", in arXiv:1809.02709v2 [cs.LG], submitted Jan. 28, 2019, 10 pages.
Genghis Goodman, "A Machine Learning Approach to Artificial Floorplan Generation", University of Kentucky Theses and Dissertations—Computer Science, 2019, accessible at https://uknowledge.uky.edu/cs_etds/89, 40 pages.
Grover et al., "node2vec: Scalable Feature Learning for Networks", in arXiv:1607.00653v1 [cs.SI], submitted Jul. 3, 2016, 10 pages.
Nauata et al., "House-GAN: Relational Generative Adversarial Networks for Graph-constrained House Layout Generation", in arXiv:2003.06988v1 [cs.CV], submitted Mar. 16, 2020, 17 pages.
Kang et al., "A Review of Techniques for 3D Reconstruction of Indoor Environments", in ISPRS International Journal Of Geo-Information 2020, May 19, 2020, 31 pages.
Kipf et al., "Semi-Supervised Classification With Graph Convolutional Networks", in arXiv:1609.02907v4 [cs.LG], submitted Feb. 22, 2017, 14 pages.
Li et al., "Graph Matching Networks for Learning the Similarity of Graph Structured Objects", in Proceedings of the 36th International Conference on Machine Learning (PMLR 97), 2019, 18 pages.
Liu et al., "Hyperbolic Graph Neural Networks", in 33rd Conference on Neural Information Processing Systems (NeurIPS 2019), 2019, 12 pages.
Merrell et al., "Computer-Generated Residential Building Layouts", in ACM Transactions on Graphics, Dec. 2010, 13 pages.

\* cited by examiner

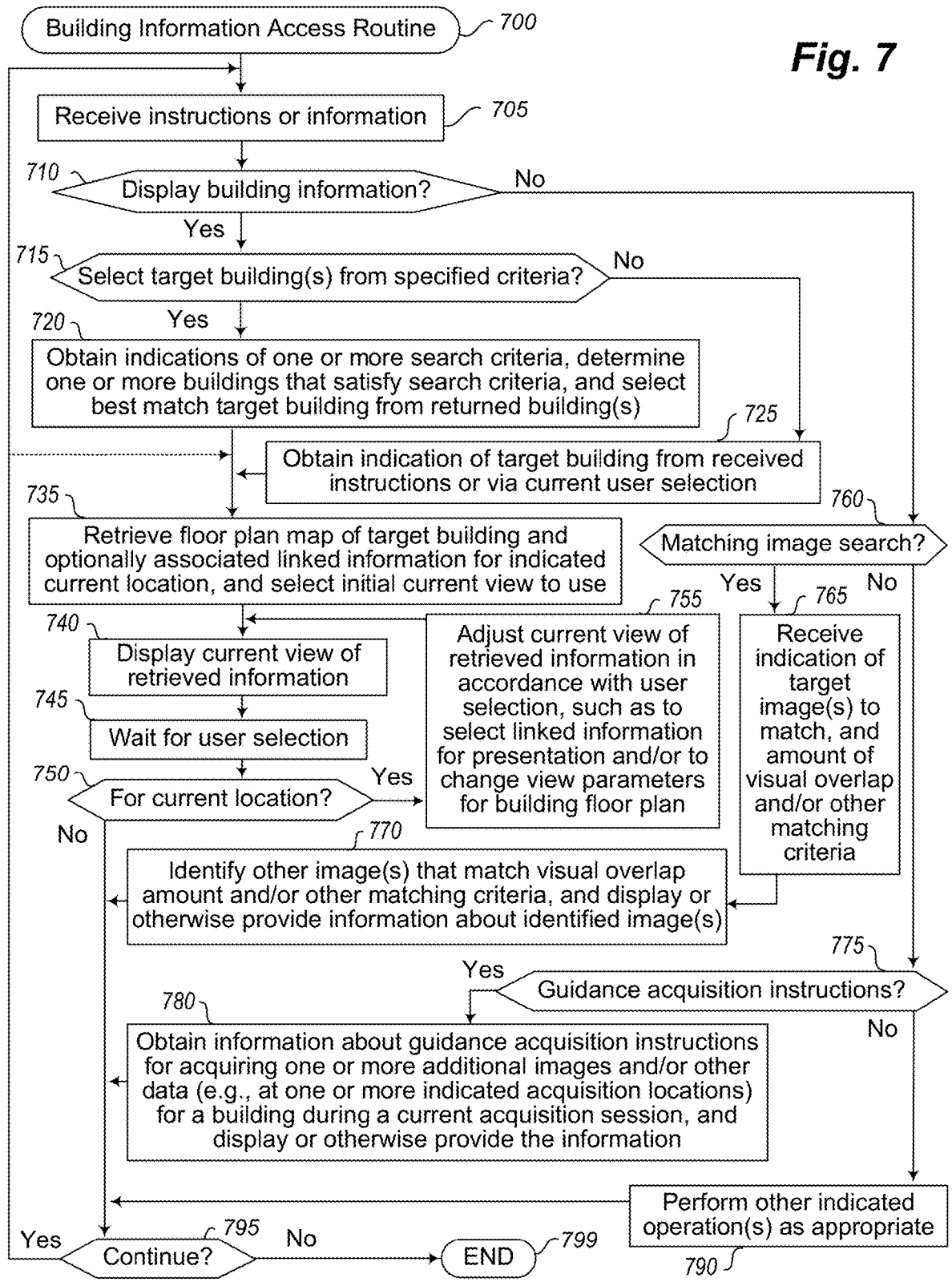

AUTOMATED TOOLS FOR INCREMENTAL GENERATION OF BUILDING MAPPING INFORMATION

TECHNICAL FIELD

The following disclosure relates generally to using automated tools and associated techniques to generate mapping information for a defined area based at least in part on images acquired in the defined area, such as to automatically and incrementally generate a floor plan for a building using images that are acquired at acquisition locations for the building in accordance with automatically determined instructions for further image acquisitions, as well as subsequently using the generated mapping information.

BACKGROUND

In various fields and circumstances, such as architectural analysis, property inspection, real estate acquisition and development, remodeling and improvement services, general contracting and other circumstances, it may be desirable to view information about the interior of a house, office, or other building without having to physically travel to and enter the building, including to determine actual as-built information about the building rather than design information from before the building is constructed. However, it can be difficult to effectively capture, represent and use such building interior information, including to display visual information captured within building interiors to users at remote locations (e.g., to enable a user to fully understand the layout and other details of the interior, including to control the display in a user-selected manner). In addition, while a floor plan of a building may provide some information about layout and other details of a building interior, such use of floor plans has some drawbacks in certain situations, including that floor plans can be difficult to construct and maintain, to accurately scale and populate with information about room interiors, to visualize and otherwise use, etc.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 7 illustrates an example flow diagram for a Building Information Access system routine in accordance with an embodiment of the present disclosure.

DETAILED DESCRIPTION

Figure 1:
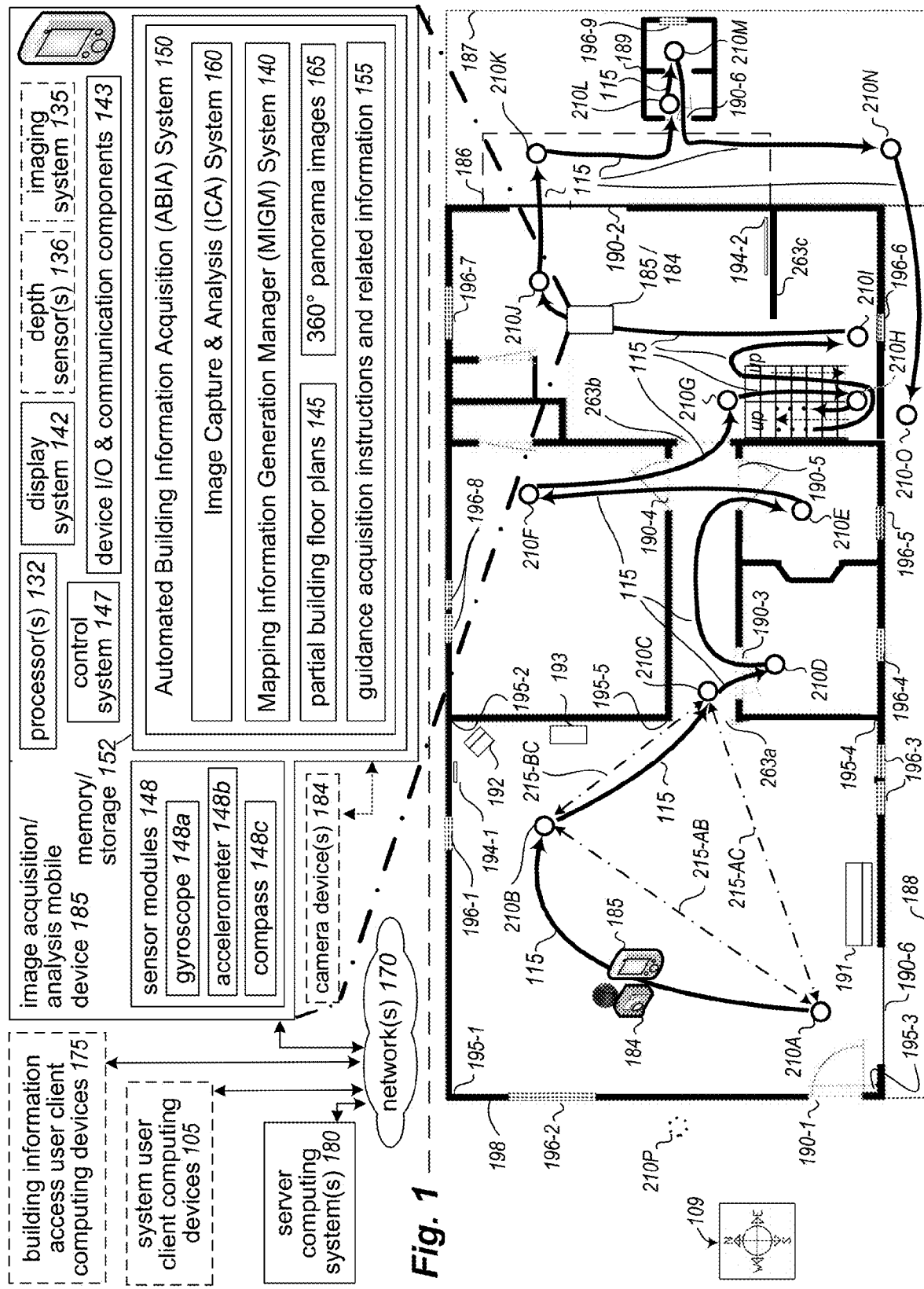
FIG. 1 includes diagrams depicting an exemplary building environment and computing system(s) for use in embodiments of the present disclosure, including to generate and present information representing the building.

The present disclosure describes techniques for using one or more computing devices to perform automated operations related to, as part of automatically generating mapping information of a defined area for subsequent use in one or more further automated manners, performing automated analyses of visual data of images acquired in the defined area in order to incrementally generate the mapping information and to determine acquisition instructions related to further acquisition of additional images and/or other types of data for use in further generation of the mapping information. In at least some embodiments, the defined area includes an interior of a multi-room building (e.g., a house, office, etc.), the images include panorama images acquired at the building (e.g., 360° panorama images acquired at various acquisition locations within rooms of the building), and the generated information includes a floor plan of the building, such as a 2D (two-dimensional) overhead view (e.g., an orthographic top view) of a schematic floor map that is generated using information from the images—in at least some such embodiments, the generating of the mapping information is further performed without having or using depth information acquired from depth-sensing equipment about distances from the images' acquisition locations to walls or other objects in the surrounding building interior. The automated analysis of a building image may include determining an initial shape of a surrounding room (e.g., for at least some walls of the room that are visible in the image), optionally with determined levels of uncertainty for some or all parts of the initial room shape (e.g., for particular walls or portions of them) and/or with determined positions of structural wall elements (e.g., windows, doorways, non-doorway wall openings, etc.), as well as automatically determining whether visual overlap exists between that building image's visual data and additional visual data of one or more other previously acquired building images. That determined information may be used in automatically determining additional data to acquire for the building (e.g., additional acquisition locations at which to acquire images and/or other data, such as to reduce or eliminate uncertainty in room shapes or to otherwise supply missing data), and may also be used in automatically determining revised room shapes, such as by determining relative positions of the room shapes of multiple rooms (e.g., based on visual overlap between building images acquired in those rooms), generating a segmentation mask for a combination of those positioned room shapes, generating a polygon structure that represents an outline or contour of that segmentation mask, and separating that polygon structure into the revised room shapes, optionally with information about determined structural wall elements and/or determined room shape uncertainty information being associated with the revised room shapes. Some or all of the determined information may further be displayed or otherwise provided during acquisition of the building images (e.g., in a GUI, or graphical user interface, that is displayed on a mobile image acquisition computing device having one or more cameras used for acquiring the images), such as to cause or otherwise direct the acquisition of additional data for use in generating further mapping information for the building. Once completed, the resulting generated floor plan and/or other generated mapping-related information may be subsequently used in one or more manners in various embodiments, such as for controlling navigation of mobile devices (e.g., autonomous vehicles), for display on one or more client devices in corresponding GUIs, etc. Additional details are included below regarding the automated operations of the computing device(s) involved in generation and use of the mapping information, and some or all of the techniques described herein may, in at least some embodiments, be performed at least in part via automated operations of an Automated Building Information Acquisition ("ABIA") system, as discussed further below.

In at least some embodiments and situations, some or all of the images acquired for a building are 360° panorama images that are each acquired at one of multiple acquisition locations in or around the building, such as with each panorama image covering 360 degrees horizontally around a vertical axis (e.g., by using an image acquisition device with a camera having one or more fisheye lenses to capture a panorama image that extends 360 degrees horizontally, such as in a single moment, or by otherwise generating 360° panorama images, such as by horizontally rotating a camera at an acquisition location that captures a sequence of video frames or other constituent images during the rotating). In addition, in at least some such embodiments, such panorama images may be provided and used in a spherical format having an equirectangular projection in which straight vertical data (e.g., the sides of a typical rectangular door frame) in the room remains straight in the image and in which straight horizontal data (e.g., the top of a typical rectangular door frame) in the room remains straight in the image if it is shown at a horizontal midline of the image but is increasingly curved in the image in a convex manner relative to the horizontal midline as the distance increases in the image from the horizontal midline. It will be appreciated that a 360° panorama image may in some situations be represented in a spherical format and cover up to 360° around a vertical axis, such that a user viewing such a panorama image may move the viewing direction within the panorama image to different orientations to cause different subset images (or "views") to be rendered within the panorama image (including, if the panorama image is represented in a spherical format, to convert the image being rendered into a planar coordinate system, such as for a perspective image view before it is displayed). Furthermore, acquisition metadata regarding the capture of such panorama images and/or other images (e.g., photos and other perspective images with an angle of view less than 180° and in a rectilinear format in which horizontal and vertical straight lines in the room remain straight in the perspective images) may be obtained and used in various manners, such as data acquired from IMU (inertial measurement unit) sensors or other sensors of a mobile image acquisition device as it is carried by a user or otherwise moved (including to assist in a determining an acquisition 'pose' for an image that includes an acquisition location at which the image was captured and an orientation or direction associated with the image, such as a direction of the camera lens for a non-panoramic photo image, a starting and/or ending direction for a panorama image, etc.), and/or other data from other associated sensors (e.g., depth data from one or more depth sensors or other distance-measuring devices at an image acquisition location to measure distances to walls of the room or other objects in the room surrounding the acquisition location). Additional details are included below regarding automated operations of device(s) implementing an Image Capture and Analysis (ICA) system involved in acquiring images and optionally acquisition metadata, as well as in optionally performing preprocessing of the images before later use (e.g., to render 360° panorama images in an equirectangular format).

The automated operations of the computing device(s) to provide the described techniques may in some embodiments and situations further include automated operations of a Mapping Information Generation Manager (MIGM) system to implement an automated generation process that produces a partial or complete floor plan and/or other mapping information for a building based at least in part on the visual data of images (e.g., 360° panorama images) acquired at multiple acquisition locations in and optionally around the building. In at least some such embodiments, the automated operations of the MIGM system may include assessing images and/or their associated acquisition metadata (e.g., images and/or metadata provided in part or in whole by the ICA system) in order to generate information about room shapes and layouts of rooms of a building for use during generation of a floor plan of the building, whether during the acquisition of the images (e.g., to incrementally generate partial floor plans as the images are acquired, such as to assist with further image acquisition) and/or after the image acquisition is completed (e.g., to generate a complete floor plan after all the images are acquired)—as part of doing so, the automated operations may further include identifying structural and other visual features of the rooms, including walls/floors/ceilings and borders between them, inter-room passages (e.g., doorways, non-doorway openings, stairs, halls, etc.), and other structural elements (e.g., windows, fireplaces, islands, etc.), and using such information as part of joining room shapes together as part of generating a building floor plan. For example, generation of a floor plan for the building and optionally other associated mapping information may include using the inter-room passage information (e.g., as reflected in visual overlap between images acquired in adjacent rooms, such as through a doorway or other non-doorway wall opening connecting those rooms) and other information to determine relative global positions of the associated room shapes to each other in a common coordinate system or other common frame of reference (e.g., without knowing the actual measurements of the rooms)—in addition, if distance scaling information is available for one or more of the images, corresponding distance measurements may be determined, such as to allow room sizes and other distances to be determined and further used for the generated floor plan. A generated floor plan may, for example, include a 2D overview view or other formats (e.g., a 3D, or three-dimensional, model), and other types of mapping information may include, for example, a virtual tour of inter-connected images (e.g., 360° panorama images) with directional information in each image to one or more other images (e.g., user-selectable links to other nearby images that, when selected, cause a transition to a respective other image associated with the selected link). Additional details are included below related to such generation and use of floor plans and/or other building mapping information based on images and/or their associated acquisition metadata.

In addition, the automated operations of the computing device(s) to provide the described techniques may in some embodiments and situations further include operations of the ABIA system to analyze building images as part of automatically determining additional data to acquire for the building (e.g., additional locations at which to acquire images and/or other data, such as to reduce or eliminate uncertainty in room shapes or to otherwise supply missing data)—in at least some such embodiments, ICA and/or MIGM systems may be used by the ABIA system to perform some of the analyses and/or other activities, such as by having ICA and/or MIGM systems that are part of the ABIA system or by the ABIA system otherwise directing some or all operations of separate ICA and/or MIGM systems, while in other embodiments the ABIA system may instead receive and use images and/or floor plan information from other separate sources without using ICA and/or MIGM systems. For example, as previously noted, the automated operations of the ABIA system may in at least some embodiments include, as each of some or all images for a building are acquired, assessing the visual data of the image (and optionally other information related to the image, such as image acquisition metadata) to determine an initial shape of a surrounding room (e.g., for at least some walls of the room that are visible in the image), whether directly or by using the MIGM system to perform the determination, and such as by using one or more trained machine learning models (e.g., deep convolutional neural network machine learning models)—as part of the determination, boundaries for walls visible in the image may be determined (e.g., inter-wall border boundaries, wall-to-floor and/or wall-to ceiling border boundaries, etc.), such as to generate a resulting 2D and/or 3D room shape, as well as to determine positions of structural wall elements (e.g., windows, doorways, non-doorway wall openings, etc.) within the room shapes. In some embodiments, initial room shape determination may be performed based on other data in addition to the visual data of the images, such as from one or more IMU sensors (e.g., using one or more of SLAM (Simultaneous Location And Mapping), or SfM (Structure from Motion), or MVS (Multi-View Stereo) analysis).

In addition, levels or other assessments of uncertainty may be determined for some or all parts of the initial room shape (e.g., for particular walls or portions of them) that is generated from an image, such as based at least in part on a distance of a wall (or wall portion) from an acquisition location at which the image is acquired (e.g., with distances automatically estimated or otherwise determined based on analysis of the image's visual data) and/or on other factors (e.g., resolution of the image, lighting, etc.), and in some embodiments and situations as output of one or more trained machine learning models used to determine the initial room shape from the image. Moreover, if multiple images are acquired in a room (or otherwise have visual data of at least some walls of that room, such as from an acquisition location outside of the room but with a view into the room through a doorway wall opening or non-doorway wall opening), multiple room shapes and associated information generated from those multiple images may be combined as part of producing the initial room shape for the room, such as by selecting, from the multiple room shapes, information about parts of the room shape (e.g., a position of a given wall for the room) that have a lowest amount of uncertainty amongst the multiple room shapes to use as part of the initial room shape for the room, and/or by combining the multiple room shapes and associated uncertainty information in other manners (e.g., using a weighted average to combine different positions of a wall or wall portion, such as by giving greater weight to room position information that has less associated uncertainty, with the overall uncertainty about give wall or wall portion position accordingly).

With respect to automatically determining additional data to acquire for the building, such room shape information and associated uncertainty information may, for example, be used as part of generating guidance acquisition instructions regarding additional images and/or other data to acquire to reduce or eliminate the uncertainty, such as to acquire one or more other images in additional parts of the room (e.g., closer to an area in which one or more walls or wall portions have an amount of uncertainty above a defined threshold, to provide a view of one or more walls or wall portions that are not visible in other visual data for the room, to move around an in-room obstacle that is blocking a view of one or more walls or to otherwise adapt data acquisition to the obstacle, etc.). In addition, the generation of the guidance acquisition instructions related to a room may otherwise address acquiring additional data, whether in addition to or instead of guidance acquisition instructions that are based on determined room shape uncertainty information—for example, such guidance acquisition instructions may direct a user participating in the image acquisition to change the lighting (e.g., open a window shade, turn on an in-room light, activate lighting provided by or with the mobile image acquisition device, etc.), to move within the room in a certain manner (e.g., away from a wall, such as by a specified distance; toward or to the center of the room; in a specified direction, such as for a specified distance; etc.), to open a door (to provide visual overlap with an adjacent room in a subsequent image that is acquired with the door open), etc., and to acquire one or more further images and/or other data after performing such activities, whether from the same acquisition locations at which one or more prior images were acquired and/or at one or more additional acquisition locations.

In addition to automatically determining additional data to acquire for the building based on individual room shape information, such determination of additional data to acquire and generation of corresponding guidance acquisition instructions may further be based on multiple room shapes and/or other factors, such as to extend a partial floor plan in one or more directions by acquiring images in additional rooms in those directions, to acquire intermediate data between two or more room shape groups (each having at least one room shape) for which interconnection data is not yet available, to acquire images in one or more room types or specific rooms that are expected but not yet represented (e.g., a kitchen, a third bedroom in a building listed as having three bedrooms, additional rooms to account for missing square footage that is expected, etc.). For example, as previously noted, the automated operations of the ABIA system may in at least some embodiments include, as each of some or all images for a building are acquired, further assessing the visual data of the image to determine a relationship of the visual data of that image to one or more other acquired images, such as visual overlap between the visual data of multiple images (e.g., whether and/or how much inter-image line-of-sight and/or inter-image overlap exists between the image's visual data and that of at least one other acquired image), such as to determine building areas with co-visibility between multiple images—such visual overlap data between two or more images may then be used to determine relative positions of the acquisition locations at which those two or more images are acquired, and to similarly determine relative positions of the room shapes determined from those images. In some embodiments and situations, additional information may be used as part of such determination of relative positions of acquisition locations and associated room shapes, whether in addition to or instead of such visual overlap data, such as common structural wall elements in walls of two or more room shapes (e.g., doorway wall openings, non-doorway wall openings, windows, etc.) and/or other location information associated with acquisition locations (e.g., GPS coordinates). As previously noted and discussed in greater detail elsewhere herein, such determination of relative positions of acquisition locations and associated room shapes may be further used as part of generating partial building floor plans (e.g., incrementally as each additional image is acquired and/or each additional room has associated data acquired)—such generation of a combination of multiple room shapes that are positioned relative to each other may include generating a segmentation mask for a combination of multiple positioned room shapes, generating a polygon structure that represents an outline of that segmentation mask, and separating that polygon structure into the revised room shapes, optionally with information about determined structural wall elements and/or determined room shape uncertainty information associated with the revised room shapes. In addition, analysis of an image may further determine additional factors in at least some embodiments that may be used in determining guidance acquisition instructions (such as to correct one or more problems in the image), such as whether and/or how much line-of-sight exists through at least one doorway in the image's visual data; a distance between an acquisition location of the image and at least one wall; visibility of at least a portion of a user involved in acquiring the image or of other obstructions or obstacles in the image's visual data that block visibility of one or more walls, such as furniture, walls, etc.; a lack of coverage of the room, such as all of the walls; etc.). Additional details are included below related to such determination of additional data to acquire for the building and generation of corresponding guidance acquisition instructions, including with respect to the non-exclusive examples of FIGS. 2E-2L.

Once such a determination of additional data to acquire for the building and resulting generation of corresponding guidance acquisition instructions is performed (e.g., after each image is acquired), such guidance acquisition instructions may be used in various manners to cause or otherwise direct or influence the acquisition of additional data for use in generating further mapping information for the building. For example, in some embodiments and situations, the guidance acquisition instructions may be provided to a mobile image acquisition device that has self-movement capabilities (e.g., an aerial or ground-based drone) to automatically direct the device to move as directed and/or to otherwise take specified actions to acquire one or more additional images or other data. In other embodiments and situations, some or all of the guidance acquisition instructions may instead be provided to one or more users involved in the image acquisition (e.g., one or more users who operate one or more mobile image acquisition devices), such as via display or other presentation in a GUI (e.g., a GUI displayed on a mobile image acquisition device and/or an associated device), optionally in conjunction with a display of a partial building floor plan having one or more room shapes (e.g., by overlaying information about guidance acquisition instructions on a displayed partial building floor plan, such as to show positions on the floor plan of additional acquisition locations and/or movement directions and/or referenced objects such as doors or obstacles to be opened or moved or traversed) and/or display of one or more of the acquired images (e.g., by overlaying the same or similar types of information about guidance acquisition instructions on one or more displayed images). Such guidance acquisition instructions may in some embodiments and situations further identify problems to be addressed by changes or other indicated actions, whether automatically or based on actions of the one or more associated users, such as automated instructions to automatically change image acquisition device settings and/or other parameters such as lighting, rotation speed and/or height of equipment on which the image acquisition device rests or is mounted, etc.; instructions or other feedback to one or more users involved in acquiring the image, such as to a photographer user about one or more problems with the current image to cause improvement in acquisition of one or more subsequent images and/or improvement in reacquiring a new image from the same acquisition location to replace the current image; etc.). In at least some such embodiments, additional information may further be provided to the user(s) along with the guidance acquisition instructions, such as to display in the GUI one or more of the following: an initial room shape determination of a room containing the current image's acquisition location based at least in part on the visual data of the current image (e.g., an initial room shape determined on the image acquisition device); a final room shape determination for that room (e.g., determined on one or more remote computing devices to which the current image and any associated acquisition metadata is transmitted); a partial version of the floor plan and/or other mapping information generated from the current image and any prior images acquired for the building; etc.—in addition, once the acquisition of the images for the building is complete (e.g., at the end of one or more image acquisition sessions in the building to acquire the images), a final version of the floor plan and/or other mapping information generated for the building from the set of acquired images may similarly be displayed in the GUI and/or otherwise provided to the user(s) involved in the image acquisition and/or to other users.

Such provided guidance acquisition instructions may then cause improvement in the further generation process for the floor plan and/or other mapping information for the building, such as to cause reacquisition of a current image due to its problems (e.g., in an automated manner without human interaction, based on prompting a human user to perform the reacquisition, etc.) that results in a new improved replacement image lacking some or all of those problems, to cause improvement in the acquisition of one or more subsequent images for the building (e.g., in an automated manner without human interaction, such as to automatically change settings of the image acquisition equipment and/or to otherwise modify a surrounding environment for subsequent images, such as with respect to lighting and/or by determining additional acquisition locations at which to acquire subsequent images; based on prompting a human user to perform the acquisition of the subsequent images in a manner that reduces or eliminates the problem; etc.), to cause changes in the generation process for the building's mapping information (e.g., to use more and/or different resources, to change types of processing techniques, etc.), etc. Additional details are included below related to such determination and providing of guidance acquisition instructions, including with respect to non-exclusive examples of FIGS. 2E-2L.

In addition, in at least some embodiments, the ABIA system may perform further types of automated operations to improve the generation process of mapping information for a building based at least in part on visual data of images acquired for the building, including to determine and provide additional types of guidance acquisition instructions (e.g., to one or more users involved in the acquisition process of some or all of the images for the building, such as by displaying the additional guidance acquisition instructions to the user(s) in one or more displayed GUIs). As one non-exclusive example, the ABIA system may, before acquiring any images for use in the generation process of mapping information for a building, determine and provide initial acquisition instructions, such as based on factors that are not specific to the building and/or based on other information associated with the building (e.g., based on publicly available information about the building, such as size, style/type, information about rooms, etc.; based on the one or more users involved in the image acquisition process, such as based on historical results for the user(s) and/or experience or other related attribute(s) of the user(s) and/or on preferences or instructions of the user(s); based on images of an exterior of the building and/or its associated property that are not used in the generation process, such as from a satellite or other overhead image such as from a drone and/or airplane, or from a street or other exterior location; etc.). As another non-exclusive example, whether in addition to or instead of providing guidance acquisition instructions, the ABIA system may determine and provide one or more types of status information during the image acquisition process (e.g., during one or more image acquisition sessions in which the images for use in the generation process are acquired), such as to represent an amount of the image acquisition process that is completed and/or is remaining (e.g., a predicted or otherwise estimated percentage or other amount that is completed and/or remaining, such as a quantity of time used and/or until completion, a percentage completed and/or remaining, an amount of square feet and/or quantity of rooms and types of rooms completed and/or remaining, etc.).

The described techniques provide various benefits in various embodiments, including to allow floor plans of multi-room buildings and other structures to be generated from images acquired in the buildings or other structures via automated operations of one or more computing systems, including in some embodiments without having or using acquired depth information from depth sensors about distances from images' acquisition locations to walls or other objects in a surrounding building or other structure. Furthermore, such automated techniques allow such a floor plan to be generated much more quickly than previously existing techniques, and in at least some embodiments with greater accuracy, based at least in part on using information acquired from the actual building environment (rather than from plans on how the building should theoretically be constructed), including in some cases based on using 360° panorama images in an equirectangular format that display an entire room and allow efficient user identification of elements of interest in the room, as well as enabling the capture of changes to structural elements that occur after a building is initially constructed, and including in some embodiments to perform automated operations to interact with one or more users to obtain one or more types of user-supplied input that is used for further automated analysis. Such described techniques further provide benefits in allowing improved automated navigation of a building by mobile devices (e.g., semi-autonomous or fully-autonomous vehicles), including to significantly reduce their computing power used and time used to attempt to otherwise learn a building's layout. In addition, in some embodiments the described techniques may be used to provide an improved GUI in which an end user may more accurately and quickly obtain information about a building's interior (e.g., for use in navigating that interior, such as via a virtual tour), including in response to search requests, as part of providing personalized information to the end user, as part of providing value estimates and/or other information about a building to an end user, etc. Various other benefits are also provided by the described techniques, some of which are further described elsewhere herein.

For illustrative purposes, some embodiments are described below in which specific types of information are acquired, used and/or presented in specific ways for specific types of structures and by using specific types of devices—however, it will be understood that the described techniques may be used in other manners in other embodiments, and that the invention is thus not limited to the exemplary details provided. As one non-exclusive example, while floor plans may be generated for houses that do not include detailed measurements for particular rooms or for the overall houses, it will be appreciated that other types of floor plans or other mapping information may be similarly generated in other embodiments, including to generate 3D model floor plans, and to do so for buildings (or other structures or layouts) separate from houses. As another non-exclusive example, while certain types of images may be discussed in certain examples (e.g., 360° panorama images), it will be appreciated that other types of images (including video frames) and visual data may be similarly used in some embodiments, whether in addition to or instead of such image types. As yet another non-exclusive example, while floor plans for houses or other buildings may be used for display to assist viewers in navigating the buildings, generated mapping information may be used in other manners in other embodiments. In addition, the term "building" refers herein to any partially or fully enclosed structure, typically but not necessarily encompassing one or more rooms that visually or otherwise divide the interior space of the structure—non-limiting examples of such buildings include houses, apartment buildings or individual apartments therein, condominiums, accessory dwelling units ("ADUs"), office buildings, commercial buildings or other wholesale and retail structures (e.g., shopping malls, department stores, warehouses, etc.), etc. The terms "acquire" or "capture" as used herein with reference to a building interior, acquisition location, or other location (unless context clearly indicates otherwise) may refer to any recording, storage, or other logging of media, sensor data, and/or other information related to spatial and/or visual characteristics of the building interior or subsets thereof, such as by a recording device and/or by another device that receives information from the recording device. In addition, various details are provided in the drawings and text for exemplary purposes, but are not intended to limit the scope of the invention. For example, sizes and relative positions of elements in the drawings are not necessarily drawn to scale, with some details omitted and/or provided with greater prominence (e.g., via size and positioning) to enhance legibility and/or clarity. Furthermore, identical reference numbers may be used in the drawings to identify similar elements or acts.

As noted above, the described techniques may include automated operations of the MIGM system to implement an automated generation process to produce a floor plan and/or other mapping information for a building based at least in part on the visual data of images acquired at multiple acquisition locations in and optionally around the building. In at least some embodiments and situations, room shape and/or layout information for a room may be determined that includes a shape of the room (e.g., a 2D overhead view of a rectangular shape or other shape of walls of the room) and/or locations of inter-room wall openings in the room, optionally along with additional information such as types of inter-room wall openings (e.g., a door or stair or other inter-room wall opening), sizes of inter-room wall openings (e.g., width and/or height), types of the rooms (e.g., kitchen, bathroom, bedroom, etc.), dimensions of the rooms (e.g., widths and/or heights of each of the walls), etc. Some or all such room layout information for a room may be determined from one or more images captured in the room in various manners in various embodiments, such as by applying machine learning techniques to automatically assess the image(s) (e.g., supplying the image(s) as input to one or more neural networks that have been trained using other images and associated room layout information to identify one or more such types of room layout information, and obtaining the corresponding room layout information as output from the trained neural networks), and/or by using information supplied by one or more users (e.g., MIGM system operator users) that assess the image(s) to determine some or all of the room layout information. In some embodiments in which acquisition metadata for an image captured at an acquisition location in a room includes depth data from one or more depth sensors at the acquisition location to surrounding walls or other objects of the room, such depth information may be used to determine some or all such room layout information, such as by using such depth information together with other of the described image assessment techniques. Thus, such assessment techniques of one or more images acquired in a room may provide various types of room information in various embodiments and situations, including to identify structural and other visual features of the room, such as to identify one or more of the following: borders between adjacent walls; borders between walls and a floor; borders between walls and a ceiling; windows and/or sky-lights; passages into and/or out of the room, such as doors and stairs and other wall openings; other structures (e.g., represented as cuboid shapes), such as countertops, bath tubs, sinks, fireplaces, and furniture; etc.

In addition, the automated operations of the MIGM system to implement an automated generation process to produce a floor plan and/or other mapping information for a building may further include interacting with one or more MIGM system operator users who assist with the generating of the mapping information (e.g., by displaying one or more GUIs that show information related to the images and/or that show associated mapping information being generated; by receiving and using input submitted by the user(s) via the GUI(s) as part of the mapping information generation, such as to correct or revise initial automatically determined information; etc.). As one non-exclusive example, one or more MIGM system operator users may, in at least some embodiments, manipulate displayed information in the GUI about two or more rooms in order to identify and/or confirm interconnections between the rooms via passages into and/or out of the rooms, such as doors and other openings in walls of the rooms (e.g., inter-room wall openings such as doors, stairs and other non-door wall openings between rooms; other wall openings that are not between two rooms, such as exterior windows and exterior doors; etc.)—in addition, in at least such embodiments, such user manipulations via the GUI may further modify and otherwise control how rooms are interconnected, such as to specify a width of walls between rooms, to control alignment of room shapes relative to each other, etc., and/or may otherwise specify information about rooms or about a floor plan being generated. In some embodiments, such displayed information in the GUI may include displayed panorama images of one or more of the rooms in one or more distinct sections or 'panes' of the GUI, with additional displayed information overlaid on some or all of those displayed panorama images to show information about one or more other rooms (e.g., an outline of some or all borders of a second room that is overlaid on a panorama image of a first room in a location within the image at which that second room would be situated if connected to the first room via specified connected inter-room openings of the two rooms). In addition, in some embodiments, such displayed information may include a displayed floor plan pane of the GUI that shows room shapes of two or more rooms in locations relative to each other that reflect the rooms being connected via specified inter-room openings of the rooms (e.g., a 2D overhead view outline of the walls and wall openings for the room, with the connected inter-room openings being located adjacent to or on top of each other, and optionally to have walls of the two rooms that are within a defined threshold amount of being parallel being adjusted to be parallel). In such embodiments with multiple panes each showing different information (e.g., a first pane showing a first panorama image of a first room with a first inter-room opening; a second pane showing a second panorama image of a second room with a second inter-room opening to potentially connect to the first room via a connection between the first and second inter-room openings, such as to show that the first and second inter-room openings are two sides of the same wall opening between the first and second rooms; a third pane showing a floor plan view with room shapes of at least the first and second rooms, and possibly other connected rooms; and optionally one or more additional panes showing additional panorama images of additional rooms to potentially connect to one or more of the first and second rooms), the displayed information between the panes may be coordinated in the GUI, such as to simultaneously update corresponding information in other panes as a user manipulates information in one of the panes (e.g., to change relative locations of the first and second rooms as the user adjusts location of at least one of the rooms in one of the panes). Additional details are included below related to such GUIs and associated user interactions techniques for use in generating floor plans.

Additional details are included below regarding further automated operations of computing device(s) implementing an ABIA system as part of performing additional automated analyses of information about the buildings and/or information received from system operator user(s) of the ABIA system and/or other system(s) that the ABIA system interacts with or controls, as well as in interacting with the system operator user(s). In some embodiments, one or more types of additional processing may be further performed, such as to determine additional mapping-related information for a generated floor plan or to otherwise associate additional information with a generated floor plan. As one example, one or more types of additional information about a building may be received and associated with the floor plan (e.g., with particular locations in the floor plan), such as additional images, textual and/or audio annotations or other descriptions of particular rooms or other locations, other audio information, such as recordings of ambient noise; overall dimension information, etc. As another example, in at least some embodiments, additional processing of images is performed to determine estimated distance information of one or more types, such as to measure sizes in images of objects of known size, and use such information to estimate room width, length and/or height dimensions—such estimated size information for one or more rooms may be associated with the floor plan, stored and optionally displayed, and if the size information is generated for all rooms within a sufficient degree of accuracy, a more detailed floor plan of the building may further be generated, such as with sufficient detail to allow blueprints or other architectural plans to be generated. In addition, if estimated size information includes height information from floors to ceilings, a 3D (three-dimensional) model (e.g., with full height information represented) and/or 2.5D (two-and-a-half dimensional) model (e.g., with partial representations of height shown that are not necessarily drawn to scale) of some or all of the 2D (two-dimensional) floor plan may be created (optionally with information from in-room images projected on the walls of the models), associated with the floor plan, stored and optionally displayed. Other types of additional information may be generated or retrieved and used in some embodiments, such as to determine a geographical alignment for a building (e.g., with respect to true north or magnetic north) and/or geographical location for a building (e.g., with respect to latitude and longitude, or GPS coordinates; for a street address; etc.), and to optionally include corresponding information on its generated floor plan and/or other generated mapping-related information, and/or to optionally further align the floor plan or other generated mapping-related information with other associated external information (e.g., satellite or other external images of the building, including street-level images to provide a 'street view' of the building and/or panorama images acquired at one or more locations in a yard or other area around a building; information for an area in which the building is located, such as nearby street maps and/or points of interest; etc.). Other information about the building may also be retrieved from, for example, one or more external sources (e.g., online databases, 'crowd-sourced' information provided by one or more end users, etc.), and associated with and linked to the floor plan and/or to particular locations within the floor plan—such additional information may further include, for example, exterior dimensions and/or shape of the building, additional images and/or annotation information acquired corresponding to particular locations within the building (optionally for locations different from acquisition locations of the acquired panorama or other images), etc. Such generated floor plans and optionally additional associated information may further be used in various manners, as discussed elsewhere herein.

FIG. 1 includes an example block diagram of various computing devices and systems that may participate in the described techniques in some embodiments, such as with respect to the example building 198 and the example Automated Building Information Acquisition (ABIA) system 150 executing on a mobile image acquisition and analysis computing device 185 in this example embodiment. In particular, one or more 360° panorama images 165 (e.g., in equirectangular format) are generated by an Interior Capture and Analysis ("ICA") system of the ABIA system, such as with respect to one or more buildings or other structures (e.g., with respect to multiple acquisition locations 210 in an example house 198), and a MIGM (Mapping Information Generation Manager) system 140 of the ABIA system further generates and provides at least partial building floor plans 145 and/or other mapping-related information (not shown) based on use of the panorama images 165 and optionally additional associated information, as well as by optionally using supporting information supplied by system operator users via computing devices 105 over intervening computer network(s) 170. Additional details related to the automated operation of the ICA and MIGM systems are included elsewhere herein, including with respect to FIGS. 2A-2N and with respect to FIGS. 5 and 6A-6B, respectively.

In the illustrated embodiment, the ICA system 160 and MIGM system 140 are operating as part of the ABIA system 150 that analyzes and assesses acquired images (e.g., images 165 acquired by the ICA system) as part of performing an automated incremental generation of a building floor plan (e.g., partial building floor plans 145 generated by the MIGM system) and determination of guidance acquisition instructions 155 and related information (e.g., additional acquisition locations) related to further acquisition of additional images and/or other types of data, such as to reduce or eliminate uncertainty associated existing partial building floor plan(s) generated using previously acquired image(s), and/or to otherwise gather missing information for use in completing a building floor plan, optionally using supporting information supplied by system operator users via computing devices 105 over intervening computer network(s) 170—additional details related to the automated operation of the ABIA system are included elsewhere herein, including with respect to FIGS. 2E-2N and 4. In addition, at least some such guidance acquisition instructions may, for example, be displayed to one or more users (not shown) of mobile computing device 185 that acquires at least some of the images 165 (e.g., a mobile image acquisition and analysis computing device 185 that includes one or more imaging systems 135 to acquire images 165) and/or that receives at least some of the images 165 from one or more optional associated camera devices 184. In other embodiments, some or all of the ABIA system may instead execute on one or more separate computing systems 180 that interact over one or more computer networks with at least the mobile device 185.

While the ICA system 160 and MIGM system 140 are illustrated in this example embodiment as executing on the same mobile image acquisition and analysis computing device 185 as the ABIA system (e.g., with all systems being operated by a single entity or otherwise being executed in coordination with each other, such as with some or all functionality of all the systems integrated together), in other embodiments the ICA system 160 and/or MIGM system 140 and/or ABIA system 150 may operate on one or more other systems separate from the device 185 (e.g., on one or more server computing systems 180), whether instead of or in addition to the copies of those systems executing on the device 185 (e.g., to have a copy of the MIGM system 140 executing on the device 185 to incrementally generate partial building floor plans as building images are acquired by the ICA system 160 and/or by that copy of the MIGM system, while another copy of the MIGM system executes on one or more server computing systems to generate a final complete building floor plan after all images are acquired), and in yet other embodiments the ABIA and/or MIGM systems may instead operate without an ICA system and instead obtain panorama images (or other images) from one or more external sources.

Various components of the mobile computing device 185 are also illustrated in FIG. 1, including one or more hardware processors 132 (e.g., CPUs, GPUs, etc.) that execute the systems 140 and/or 150 and/or 160 using executable instructions of those system(s) stored and/or loaded on one or more memory/storage 152 components of the device 185, and optionally one or more imaging systems 135 of one or more types to acquire visual data of one or more panorama images 165 and/or other images (not shown, such as rectilinear perspective images) and/or 165—some or all such images may in some embodiments be supplied by one or more separate associated camera devices 184 (e.g., via a wired/cabled connection, via Bluetooth or other inter-device wireless communications, etc.), whether in addition to or instead of images captured by the mobile device 185. The illustrated embodiment of mobile device 185 further includes one or more sensor modules 148 that include a gyroscope 148*a*, accelerometer 148*b* and compass 148*c* in this example (e.g., as part of one or more IMU units, not shown separately, on the mobile device), one or more control systems 147 managing I/O (input/output) and/or communications and/or networking for the device 185 (e.g., to receive instructions from and present information to the user), a display system 142 (e.g., with a touch-sensitive screen) and other device I/O and communication components 143 (e.g., network interfaces or other connections, keyboards, mice or other pointing devices, microphones, speakers, GPS receivers, etc.), optionally one or more depth-sensing sensors or other distance-measuring components 136 of one or more types, optionally a GPS (or Global Positioning System) sensor or other position determination sensor (not shown in this example), etc. Other computing devices/systems 105, 175 and 180 and/or camera devices 184 may include various hardware components and stored information in a manner analogous to mobile device 185, which are not shown in this example for the sake of brevity, and as discussed in greater detail below with respect to FIG. 3.

In the example of FIG. 1, the ICA system may perform automated operations involved in generating multiple 360° panorama images at multiple associated acquisition locations (e.g., in multiple rooms or other locations within a building or other structure and optionally around some or all of the exterior of the building or other structure), such as using visual data acquired via the mobile device(s) 185 and/or associated camera devices 184, and for use in generating and providing a representation of an interior of the building or other structure. For example, in at least some such embodiments, such techniques may include using one or more mobile devices (e.g., a camera having one or more fisheye lenses and mounted on a rotatable tripod or otherwise having an automated rotation mechanism, a camera having sufficient fisheye lenses to capture 360 degrees horizontally without rotation, a smart phone held and moved by a user, a camera held by or mounted on a user or the user's clothing, etc.) to capture data from a sequence of multiple acquisition locations within multiple rooms of a house (or other building), and to optionally further capture data involved in movement of the acquisition device (e.g., movement at an acquisition location, such as rotation; movement between some or all of the acquisition locations, such as for use in linking the multiple acquisition locations together; etc.), in at least some cases without having distances between the acquisition locations being measured or having other measured depth information to objects in an environment around the acquisition locations (e.g., without using any depth-sensing sensors). After an acquisition location's information is captured, the techniques may include producing a 360° panorama image from that acquisition location with 360 degrees of horizontal information around a vertical axis (e.g., a 360° panorama image that shows the surrounding room in an equirectangular format), and then providing the panorama images for subsequent use by the MIGM and/or ABIA systems. Additional details related to embodiments of a system providing at least some such functionality of an ICA system are included in U.S. Non-Provisional patent application Ser. No. 16/693,286, filed Nov. 23, 2019 and entitled "Connecting And Using Building Data Acquired From Mobile Devices" (which includes disclosure of an example BICA system that is generally directed to obtaining and using panorama images from within one or more buildings or other structures); in U.S. Non-Provisional patent application Ser. No. 16/236,187, filed Dec. 28, 2018 and entitled "Automated Control Of Image Acquisition Via Use Of Acquisition Device Sensors" (which includes disclosure of an example ICA system that is generally directed to obtaining and using panorama images from within one or more buildings or other structures); and in U.S. Non-Provisional patent application Ser. No. 16/190, 162, filed Nov. 14, 2018 and entitled "Automated Mapping Information Generation From Inter-Connected Images"; each of which is incorporated herein by reference in its entirety.

One or more end users (not shown) of one or more building information access client computing devices 175 may further interact over computer networks 170 with the ABIA system 150 (and optionally the MIGM system 140 and/or ICA system 160), such as to obtain, display and interact with a generated floor plan (and/or other generated mapping information) and/or associated images, as discussed in greater detail elsewhere herein, including with respect to FIG. 7. In addition, while not illustrated in FIG. 1, a floor plan (or portion of it) may be linked to or otherwise associated with one or more additional types of information, such as one or more associated and linked images or other associated and linked information, including for a two-dimensional ("2D") floor plan of a building to be linked to or otherwise associated with a separate 2.5D model floor plan rendering of the building and/or a 3D model floor plan rendering of the building, etc., and including for a floor plan of a multi-story or otherwise multi-level building to have multiple associated sub-floor plans for different stories or levels that are interlinked (e.g., via connecting stairway passages) or are part of a common 2.5D and/or 3D model. Accordingly, non-exclusive examples of an end user's interactions with a displayed or otherwise generated 2D floor plan of a building may include one or more of the following: to change between a floor plan view and a view of a particular image at an acquisition location within or near the floor plan; to change between a 2D floor plan view and a 2.5D or 3D model view that optionally includes images texture-mapped to walls of the displayed model; to change the horizontal and/or vertical viewing direction from which a corresponding subset view of (or portal into) a panorama image is displayed, such as to determine a portion of a panorama image in a 3D coordinate system to which a current user viewing direction is directed, and to render a corresponding planar image that illustrates that portion of the panorama image without the curvature or other distortions present in the original panorama image; etc. Additional details regarding a BHP (Building Information Integrated Presentation) system and/or an ILTM (Image Locations Transition Manager) system, which are example embodiments of systems to provide or otherwise support at least some functionality of a building information access system and routine as discussed herein, are included in U.S. Non-Provisional patent application Ser. No. 16/681,787, filed Nov. 12, 2019 and entitled "Presenting Integrated Building Information Using Three-Dimensional Building Models," and in U.S. Non-Provisional patent application Ser. No. 15/950,881, filed Apr. 11, 2018 and entitled "Presenting Image Transition Sequences Between Acquisition Locations," each of which is incorporated herein by reference in its entirety. In addition, while not illustrated in FIG. 1, in some embodiments the client computing devices 175 (or other devices, not shown) may receive and use generated floor plans and/or other generated mapping-related information in additional manners, such as to control or assist automated navigation activities by those devices (e.g., by autonomous vehicles or other devices), whether instead of or in addition to display of the generated information.

In the depicted computing environment of FIG. 1, the network 170 may be one or more publicly accessible linked networks, possibly operated by various distinct parties, such as the Internet. In other implementations, the network 170 may have other forms, such as to instead be a private network (such as a corporate or university network) that is wholly or partially inaccessible to non-privileged users. In still other implementations, the network 170 may include both private and public networks, with one or more of the private networks having access to and/or from one or more of the public networks. Furthermore, the network 170 may include various types of wired and/or wireless networks and connections in various situations.

FIG. 1 further depicts an exemplary building environment in which 360° panorama images and/or other images are acquired, such as by the ICA system and for use by the MIGM system (e.g., under control of the ABIA system) to generate and provide one or more corresponding building floor plans (e.g., multiple incremental partial building floor plans) and by the ABIA system to further perform an automated determination of guidance acquisition instructions and related information (e.g., additional acquisition locations) for further acquisition of additional images and/or other types of data. In particular, FIG. 1 illustrates one story of a multi-story house (or other building) 198 with an interior that was captured at least in part via multiple panorama images, such as by a mobile image acquisition device 185 with image acquisition capabilities and/or one or more associated camera devices 184 as they are moved through the building interior to a sequence of multiple acquisition locations 210 (e.g., starting at acquisition location 210A, moving to acquisition location 210B along travel path 115, etc., and ending at acquisition location 210-O or 210P outside of the building). An embodiment of the ICA system may automatically perform or assist in the capturing of the data representing the building interior (as well as to further analyze the captured data to generate 360° panorama images to provide a visual representation of the building interior), an embodiment of the MIGM system may analyze the visual data of the acquired images to generate on more building floor plans for the house 198 (e.g., multiple incremental building floor plans), and an embodiment of the ABIA system may determine and provide guidance acquisition instructions regarding some or all of the acquired images and/or the image acquisition process (e.g., via the ICA system, directly via the mobile devices 185 and/or 184, etc.). While such a mobile image acquisition device may include various hardware components, such as a camera, one or more sensors (e.g., a gyroscope, an accelerometer, a compass, etc., such as part of one or more IMUs, or inertial measurement units, of the mobile device; an altimeter; light detector; etc.), a GPS receiver, one or more hardware processors, memory, a display, a microphone, etc., the mobile device may not in at least some embodiments have access to or use equipment to measure the depth of objects in the building relative to a location of the mobile device, such that relationships between different panorama images and their acquisition locations in such embodiments may be determined in part or in whole based on features in different images but without using any data from any such depth sensors, while in other embodiments such depth data may be used. In addition, while directional indicator 109 is provided in FIG. 1 for reference of the reader, the mobile device and/or ICA system may not use such absolute directional information and/or absolute locations in at least some embodiments, such as to instead determine relative directions and distances between acquisition locations 210 without regard to actual geographical positions or directions in such embodiments, while in other embodiments such absolute directional information and/or absolute locations may be obtained and used.

In operation, the mobile device 185 and/or camera device(s) 184 arrive at a first acquisition location 210A within a first room of the building interior (in this example, in a living room accessible via an external door 190-1), and captures or acquires a view of a portion of the building interior that is visible from that acquisition location 210A (e.g., some or all of the first room, and optionally small portions of one or more other adjacent or nearby rooms, such as through doorway wall openings, non-doorway wall openings, hallways, stairways or other connecting passages from the first room). The view capture may be performed in various manners as discussed herein, and may include a number of objects or other features (e.g., structural details) that may be visible in images captured from the acquisition location—in the example of FIG. 1, such objects or other features within the building include the doorways 190 (including 190-1 through 190-6, such as with swinging and/or sliding doors), windows 196 (including 196-1 through 196-8), corners or edges 195 (including corner 195-1 in the northwest corner of the building 198, corner 195-2 in the northeast corner of the first room, corner 195-3 in the southwest corner of the first room, corner 195-4 in the southeast corner of the first room, corner 195-5 at the northern edge of the inter-room passage between the first room and a hallway, etc.), furniture 191-193 (e.g., a couch 191; chair 192; table 193; etc.), pictures or paintings or televisions or other hanging objects 194 (such as 194-1 and 194-2) hung on walls, light fixtures (not shown in FIG. 1), various built-in appliances or fixtures or other structural elements (not shown in FIG. 1), etc. The user may also optionally provide a textual or auditory identifier to be associated with an acquisition location and/or a surrounding room, such as "living room" for one of acquisition locations 210A or 210B or for the room including acquisition locations 210A and/or 210B, while in other embodiments the ICA and/or MIGM system may automatically generate such identifiers (e.g., by automatically analyzing images and/or video and/or other recorded information for a building to perform a corresponding automated determination, such as by using machine learning; based at least in part on input from ICA and/or MIGM system operator users; etc.) or the identifiers may not be used.

After the first acquisition location 210A has been captured, the mobile device 185 and/or camera device(s) 184 may move or be moved to a next acquisition location (such as acquisition location 210B), optionally recording images and/or video and/or other data from the hardware components (e.g., from one or more IMUs, from the camera, etc.) during movement between the acquisition locations. At the next acquisition location, the mobile 185 and/or camera device(s) 184 may similarly capture a 360° panorama image and/or other type of image from that acquisition location. This process may repeat for some or all rooms of the building and in some cases external to the building, as illustrated for additional acquisition locations 210C-210P in this example, with the images from acquisition locations 210A to 210-O being captured in a single image acquisition session in this example (e.g., in a substantially continuous manner, such as within a total of 5 minutes or 15 minutes), and with the image from acquisition location 210P optionally being acquired at a different time (e.g., from a street adjacent to the building or front yard of the building). In this example, multiple of the acquisition locations 210K-210P are external to but associated with the building 198, including acquisition locations 210L and 210M on one or more additional structures on the same property (e.g., an ADU, or accessory dwelling unit; a garage; a shed; etc.), acquisition location 210K on an external deck or patio, and acquisition locations 210N-210P at multiple yard locations. The acquired images for each acquisition location may be further analyzed, including in some embodiments to render or otherwise place each panorama image in an equirectangular format, whether at the time of image acquisition or later, as well as further analyzed by the MIGM and/or ABIA systems in the manners described herein.

Various details are provided with respect to FIG. 1, but it will be appreciated that the provided details are non-exclusive examples included for illustrative purposes, and other embodiments may be performed in other manners without some or all such details.

Figure 2A:
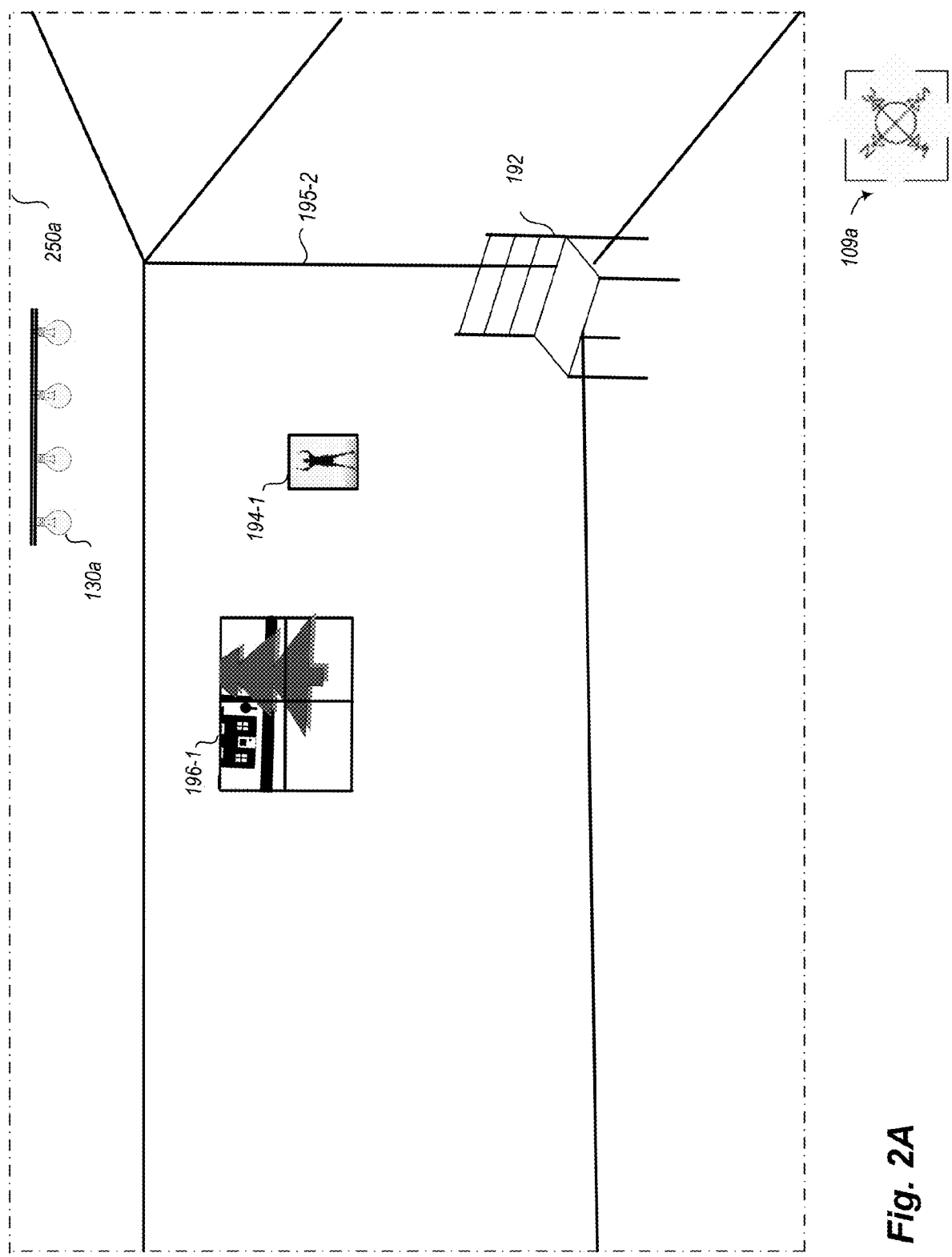
FIGS. 2A-2N illustrate examples of automated operations involved in acquisition, analysis, and use of images for a building, such as for resulting generation of a floor plan for the building in accordance with automatically determined acquisition instructions.
Figure 2B:
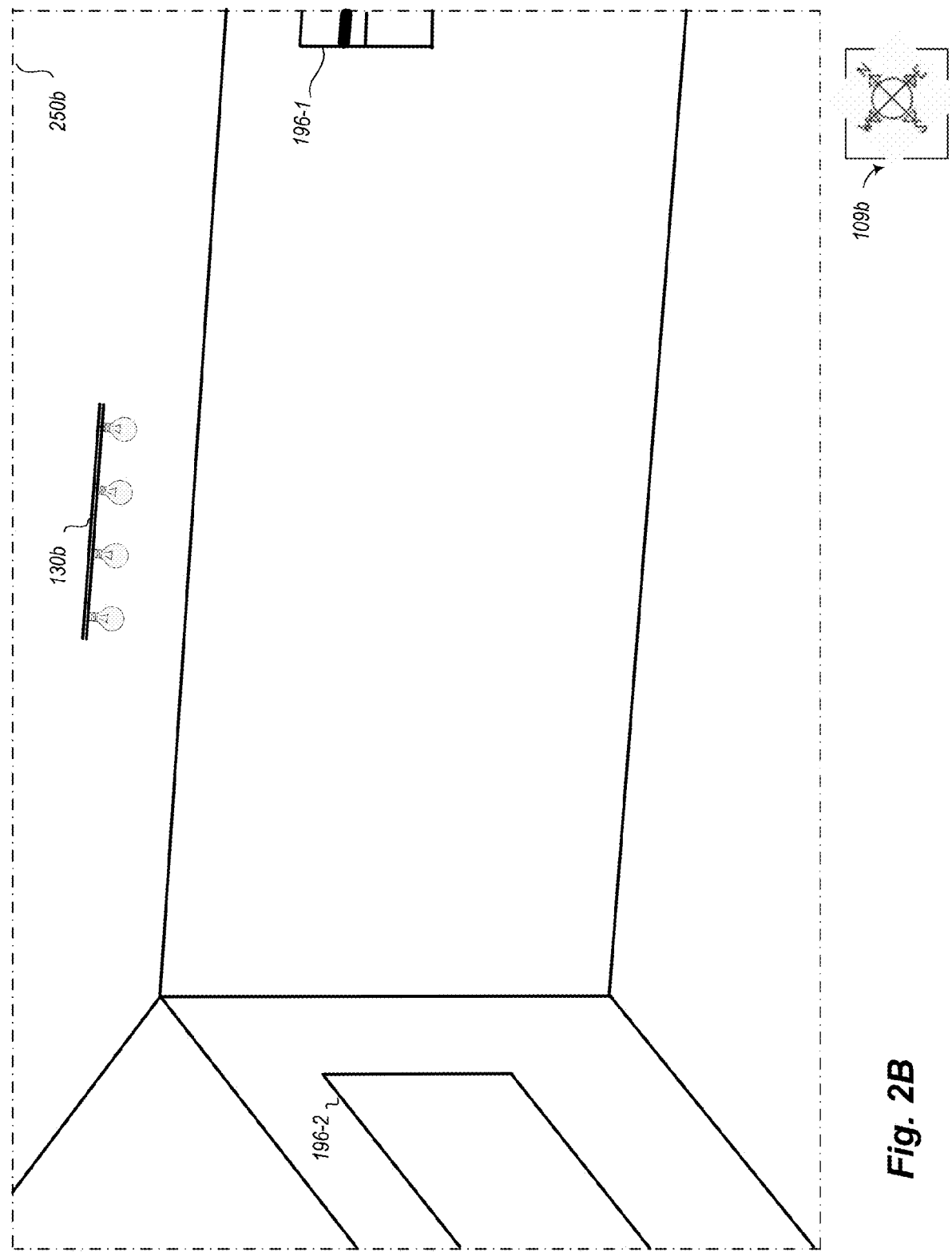
Figure 2C:
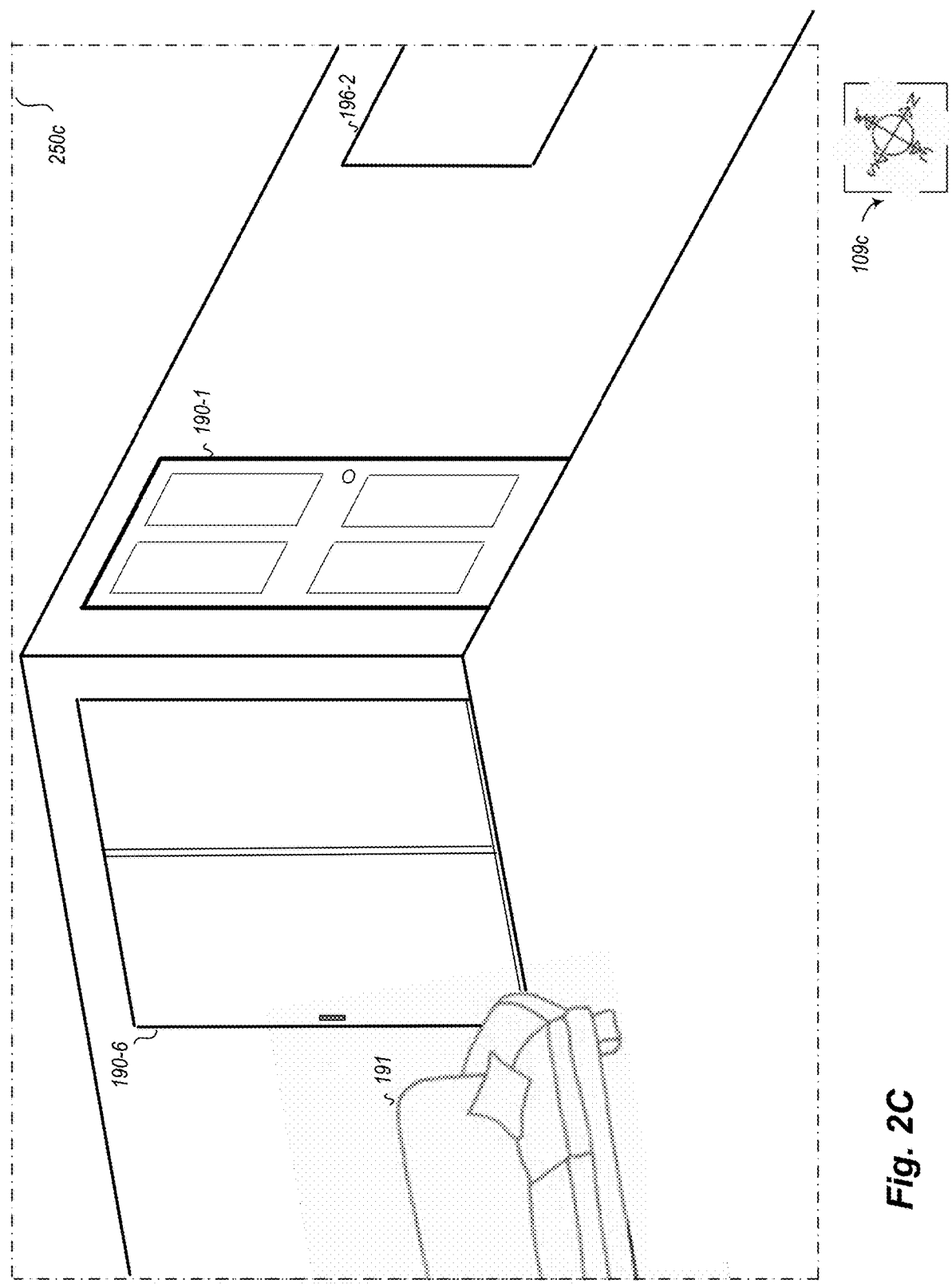
Figure 2D:
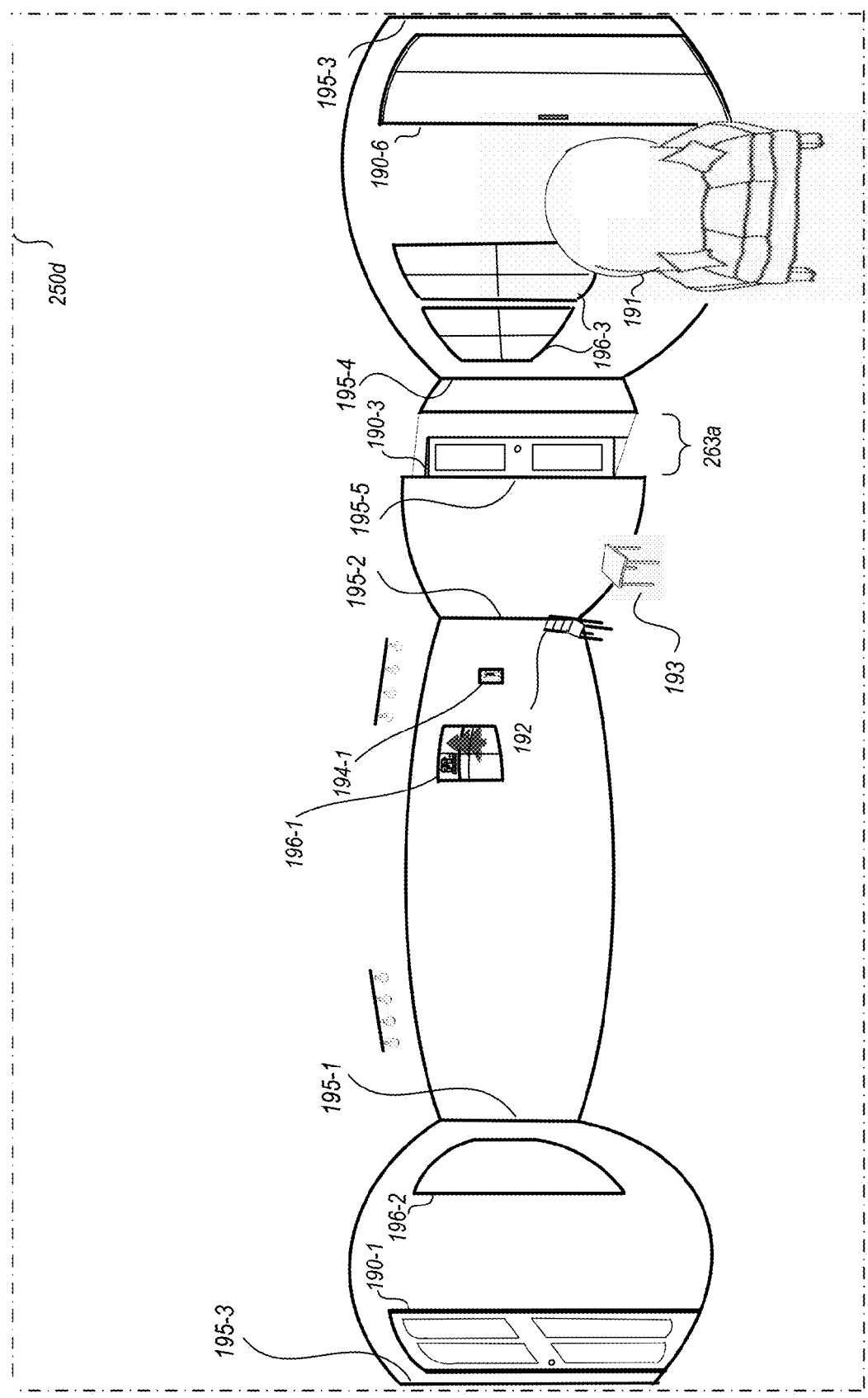
Figure 2E:
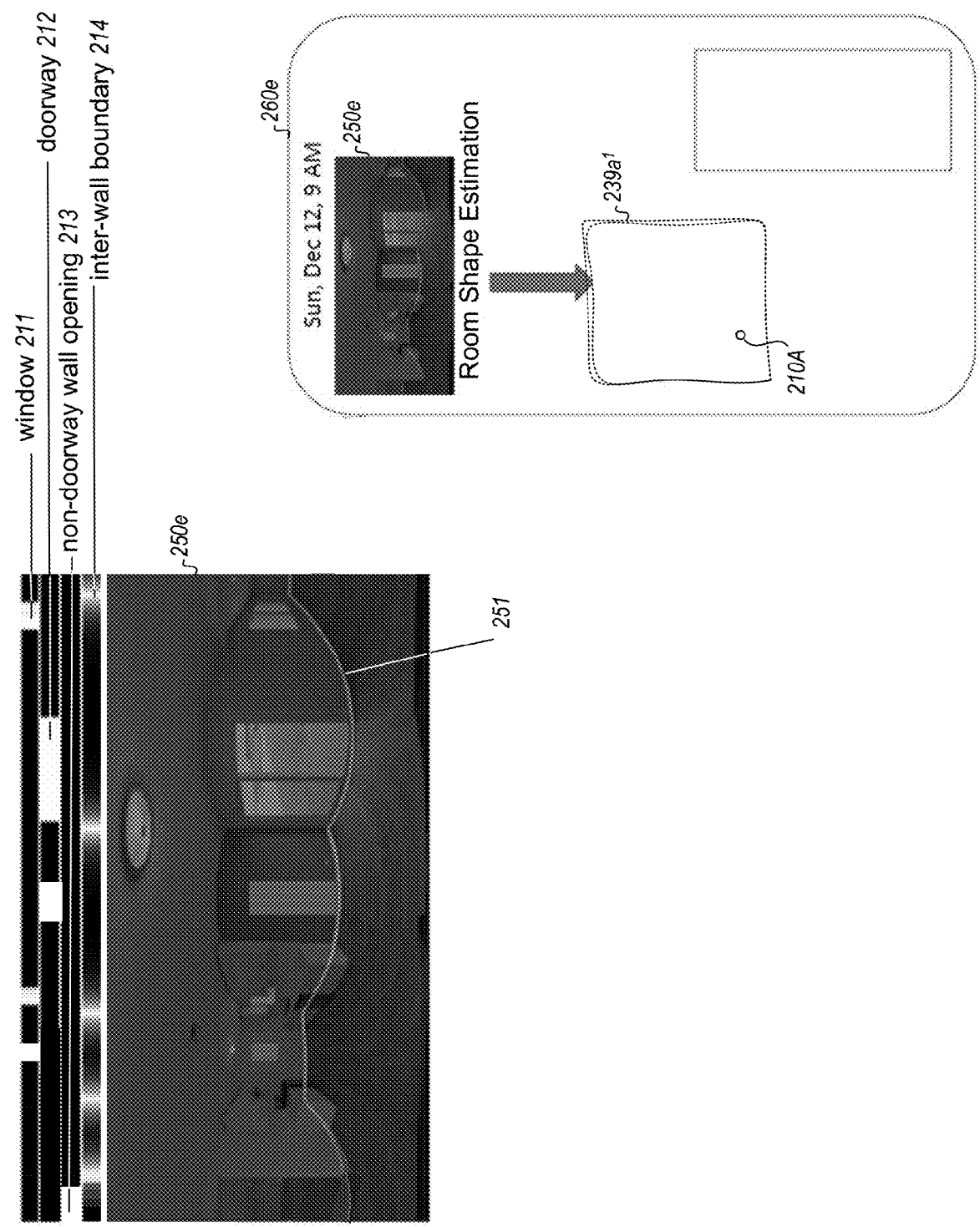
Figure 2F:
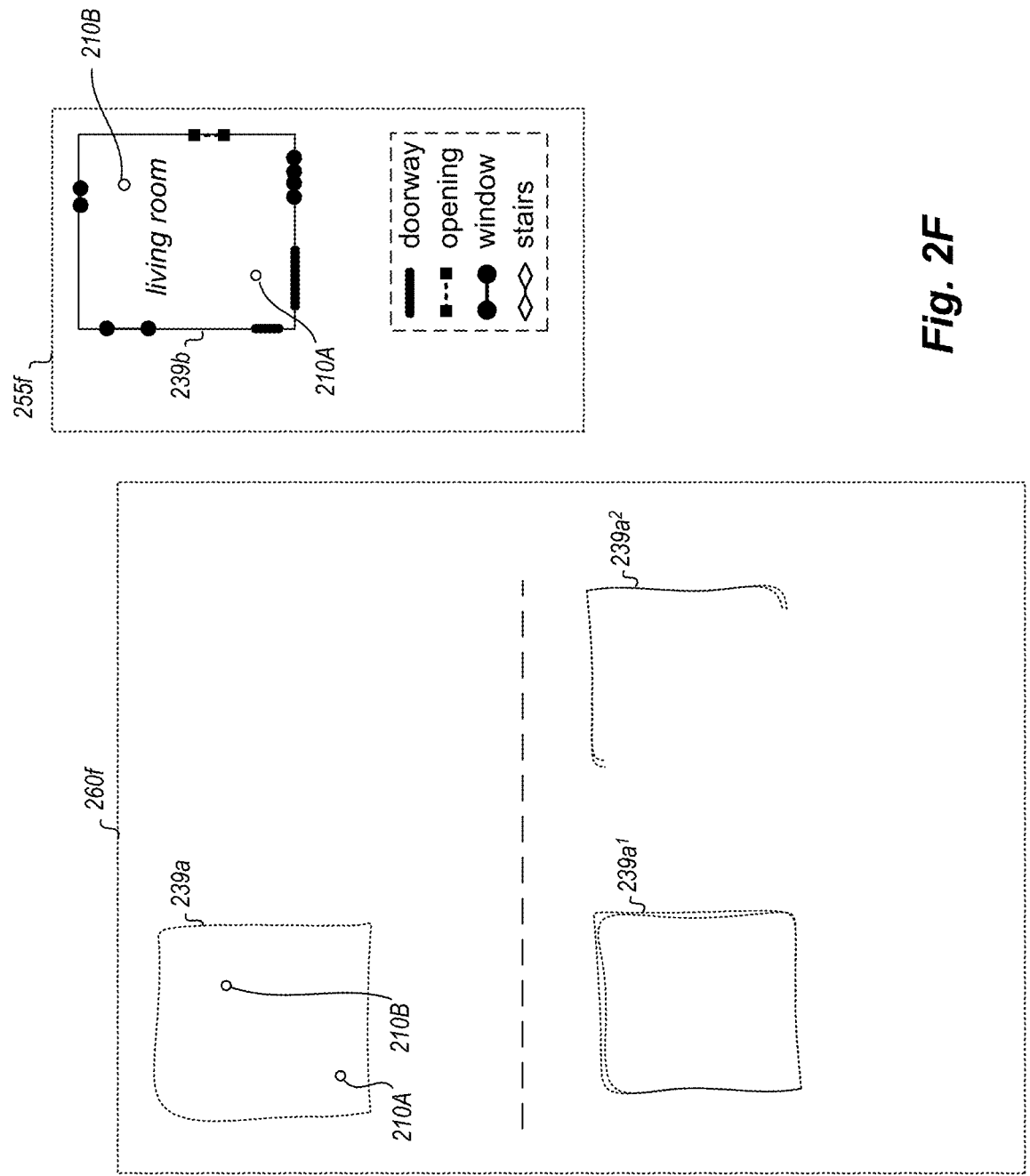
Figure 2G:
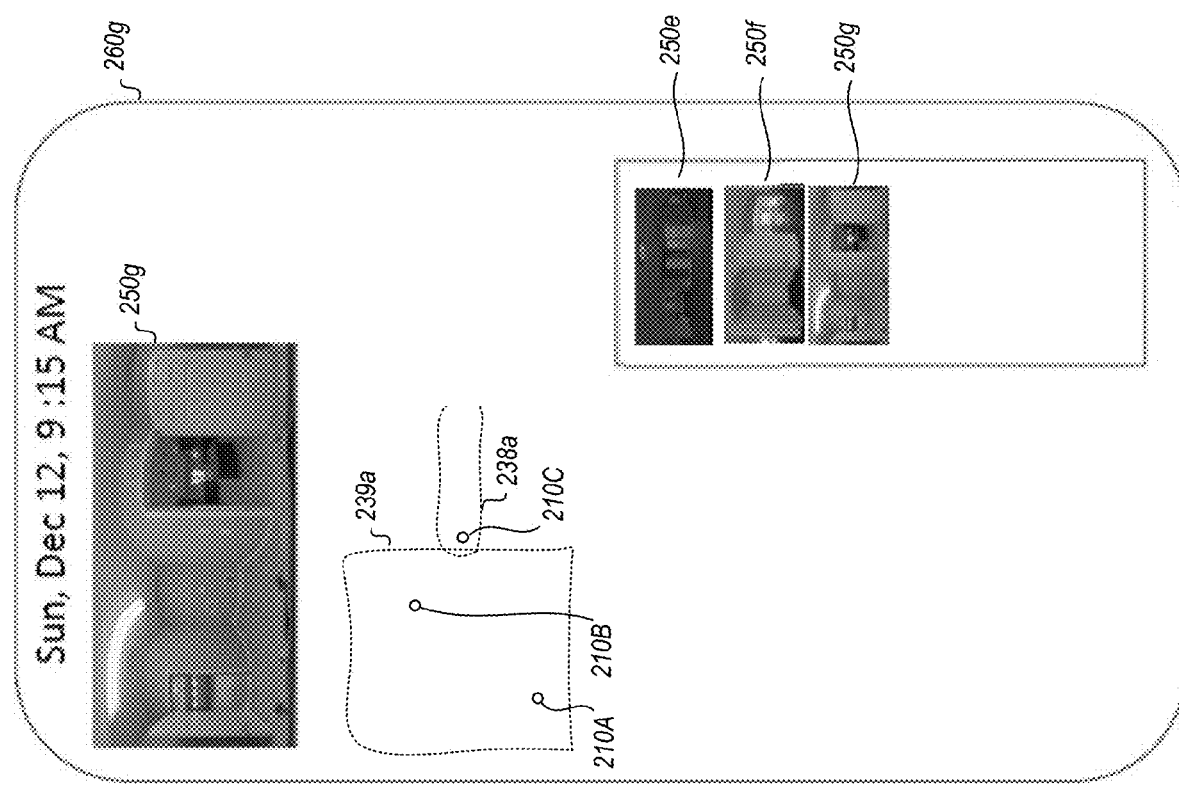
Figure 2H:
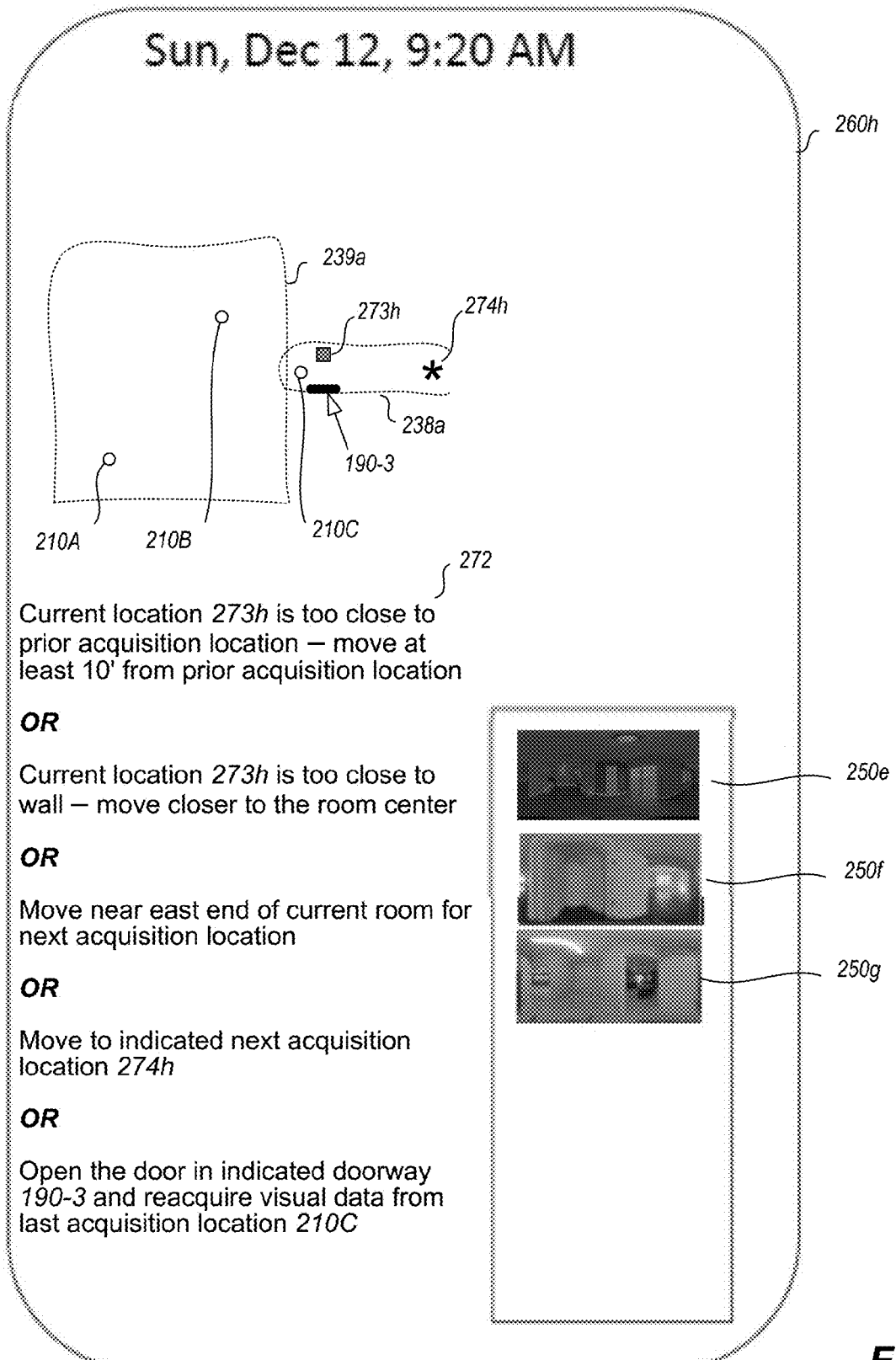
Figure 2I:
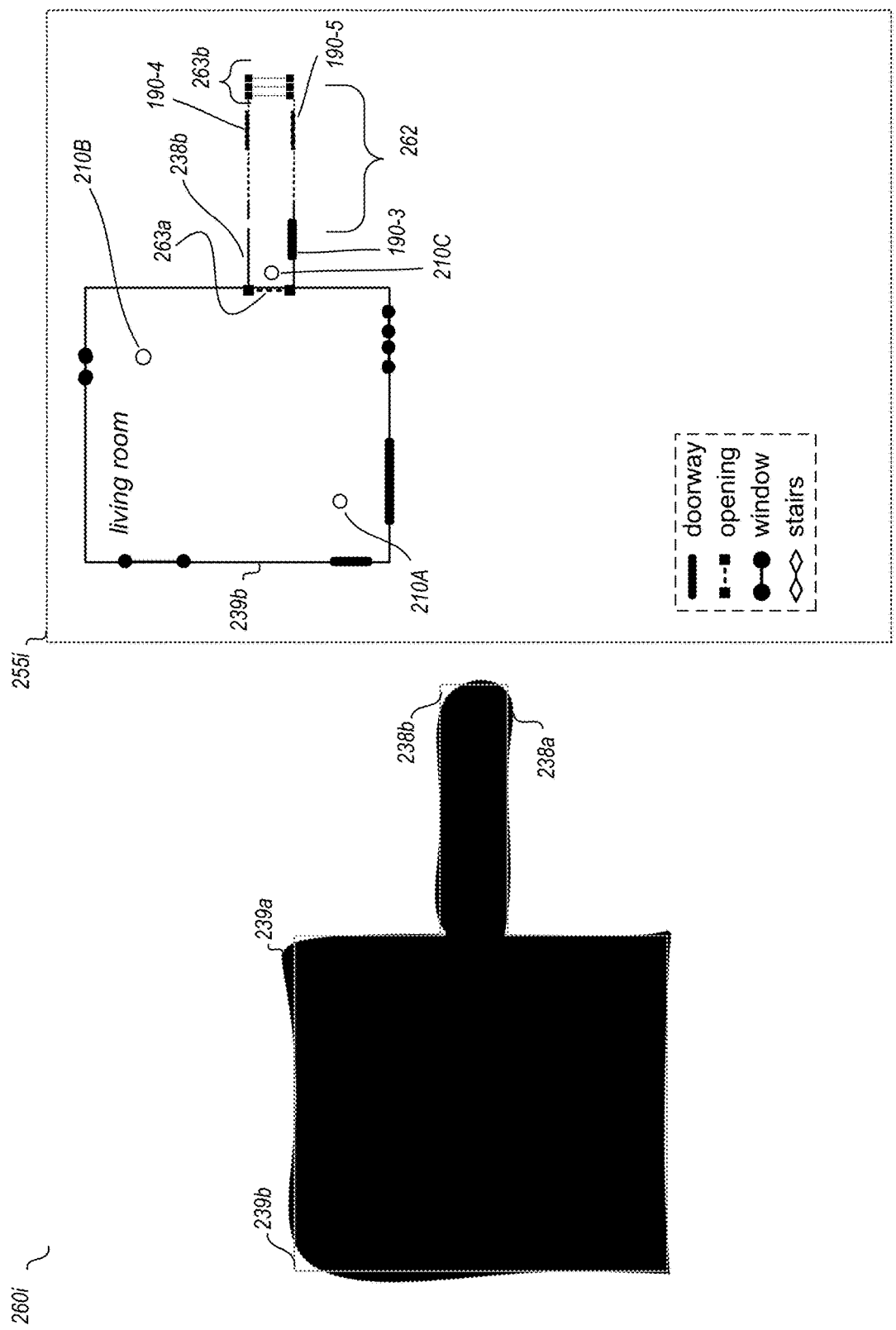
Figure 2J:
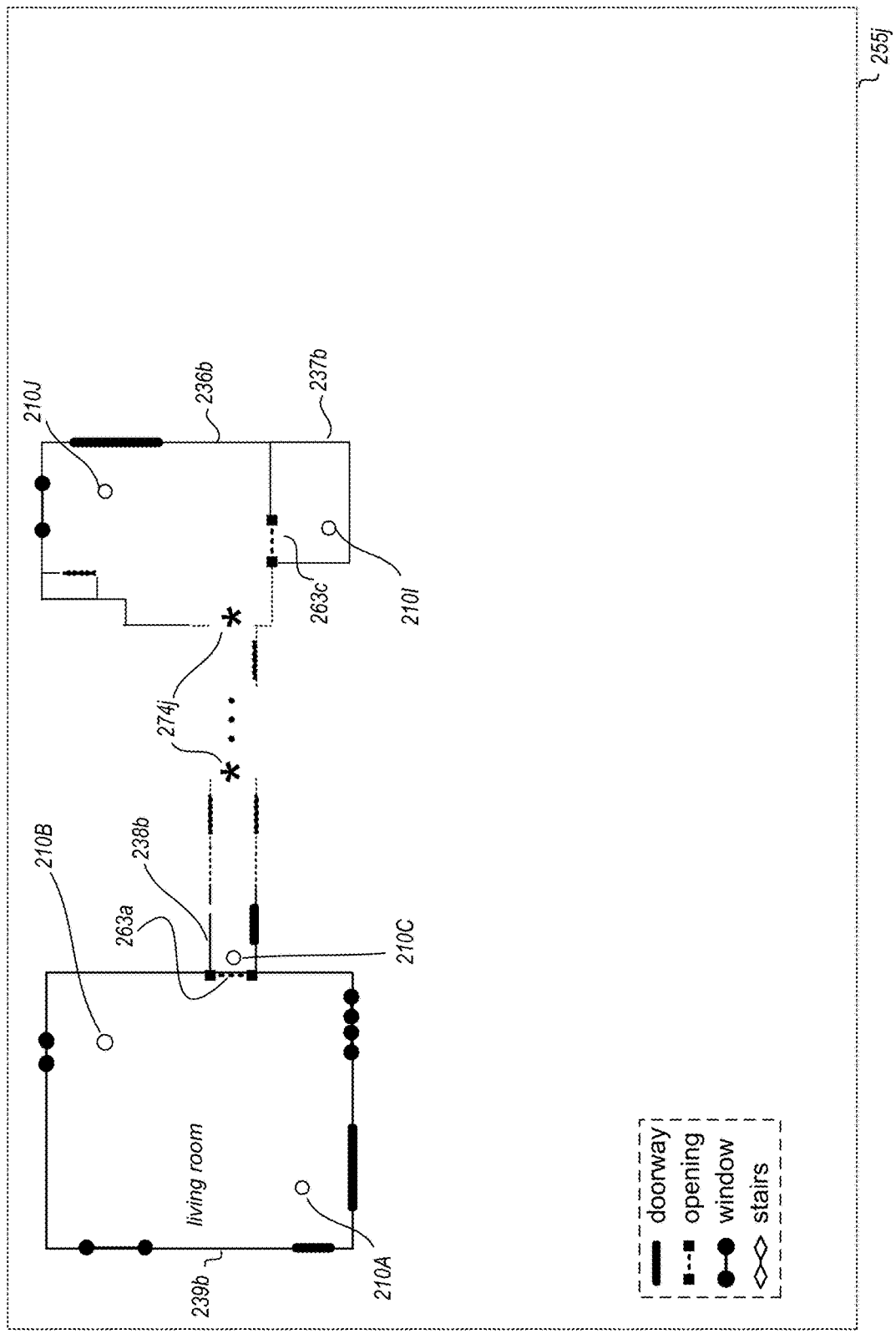
Figure 2K:
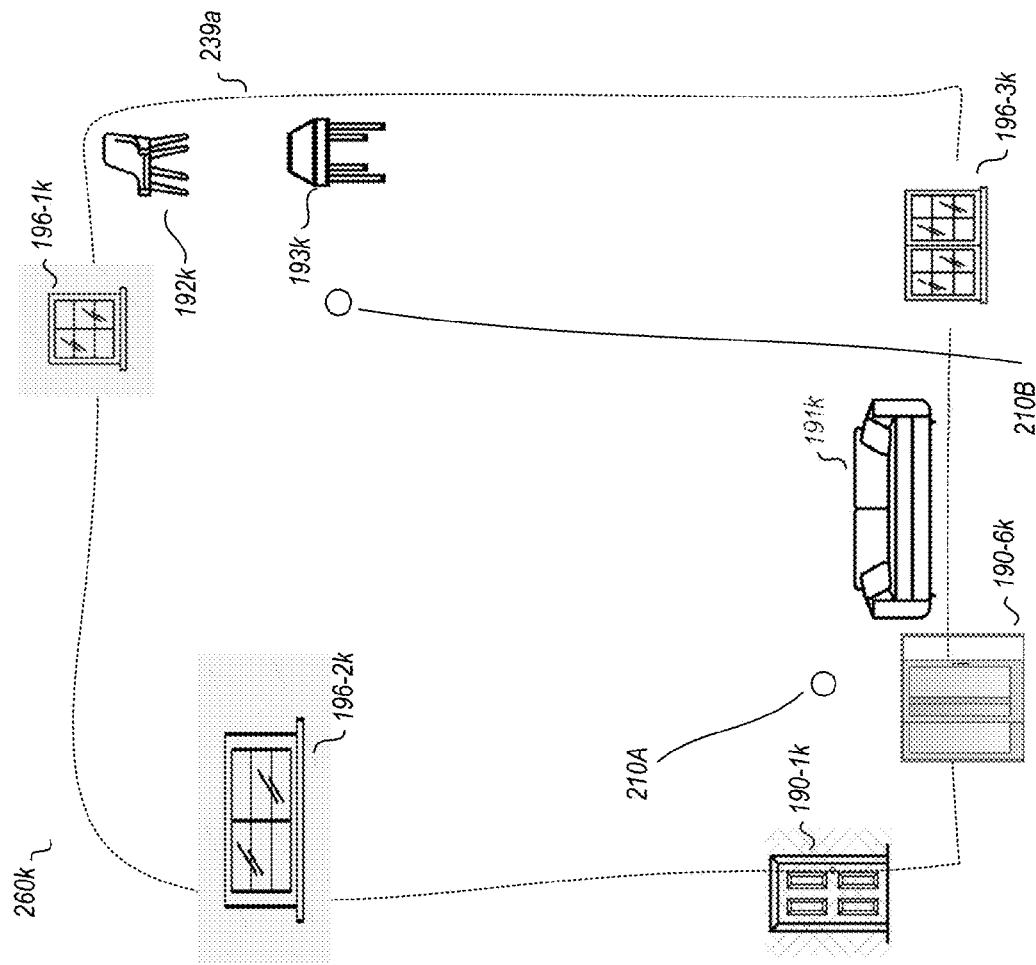
Figure 2L:
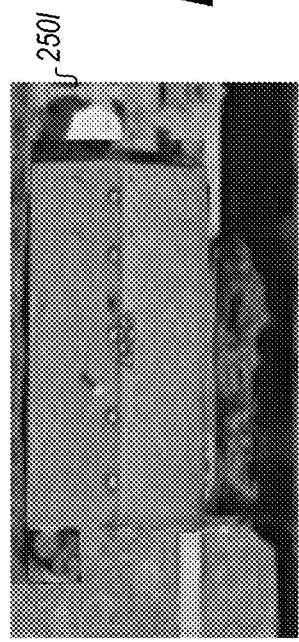
Figure 2L:
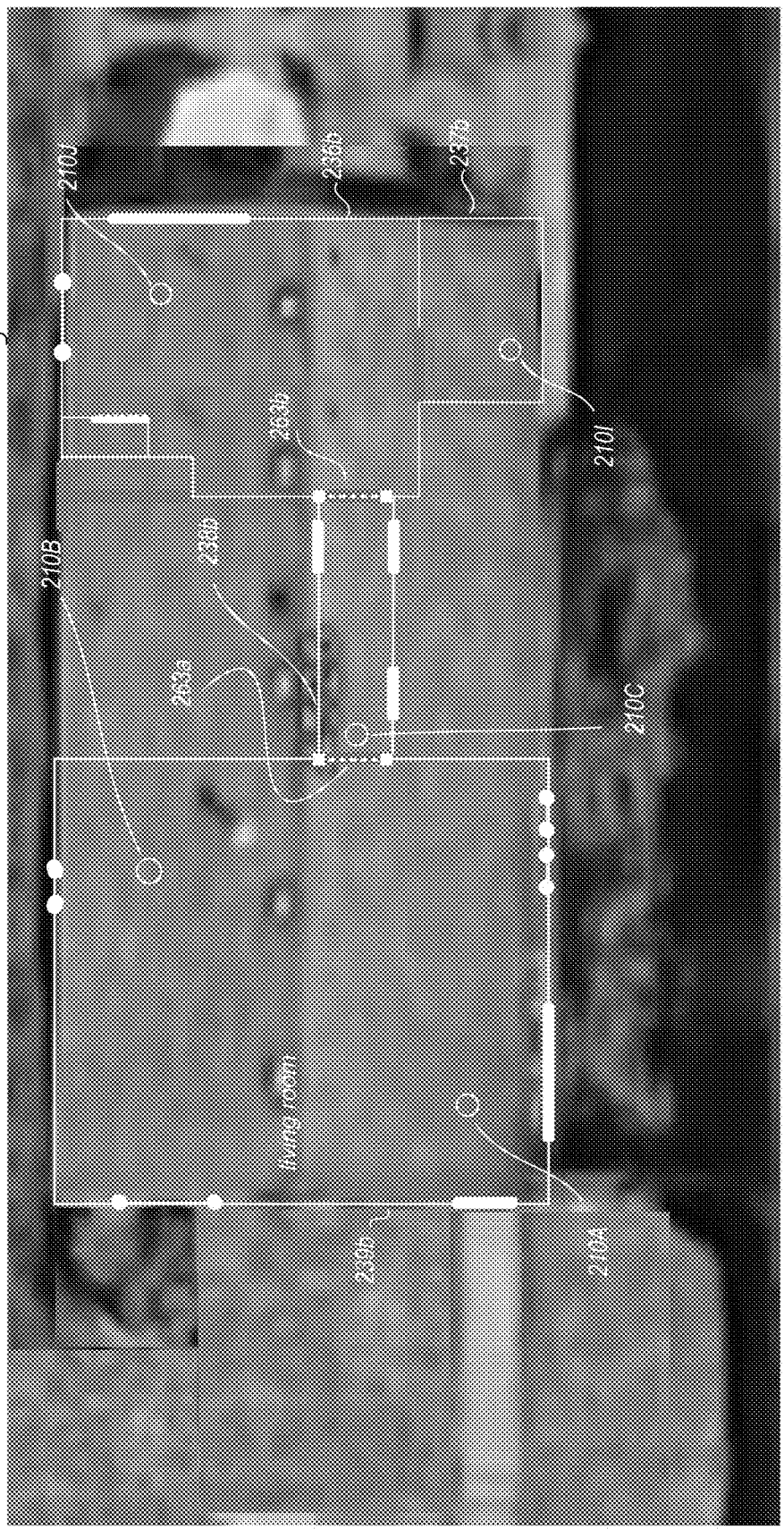
Figure 2M:
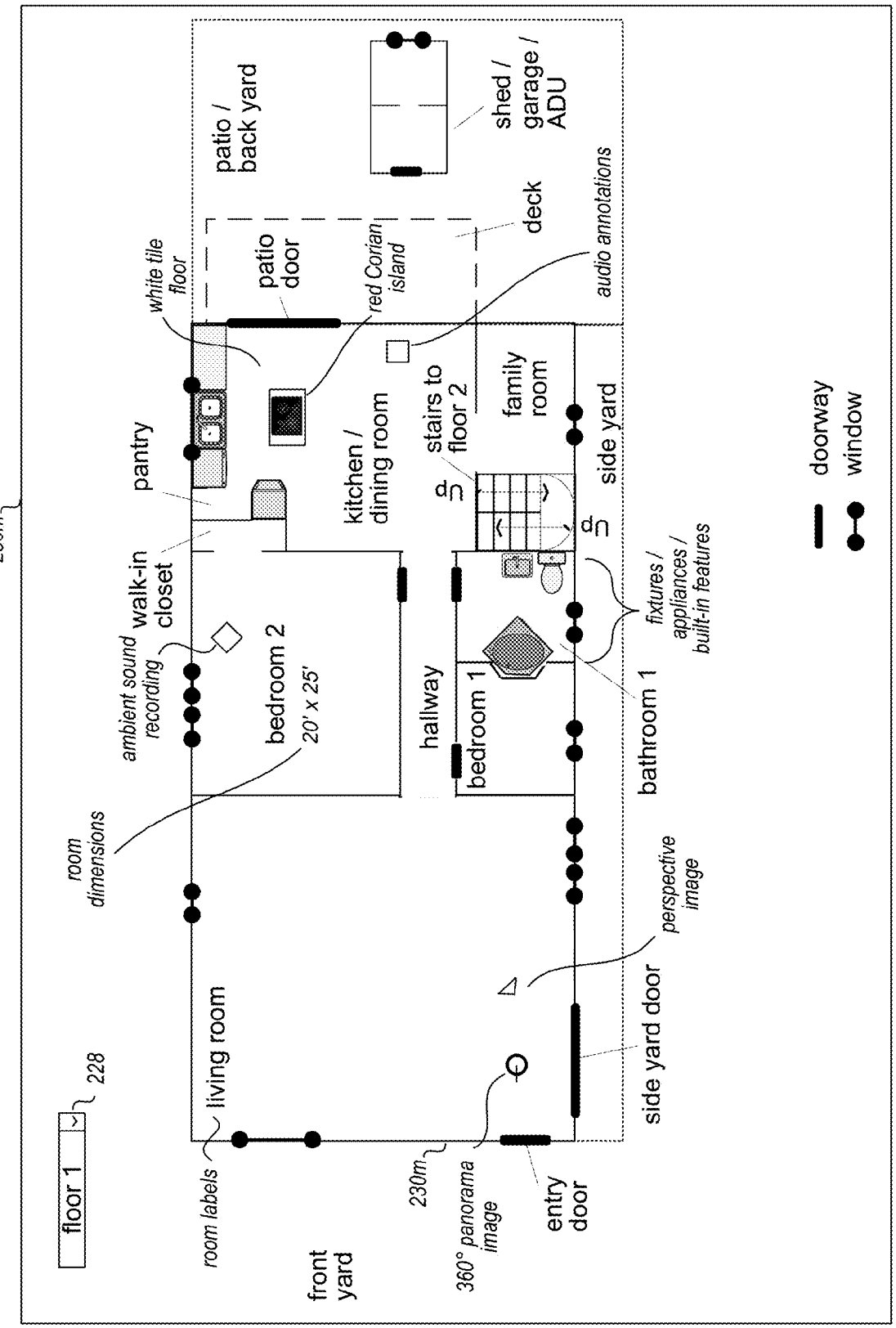
Figure 2N:
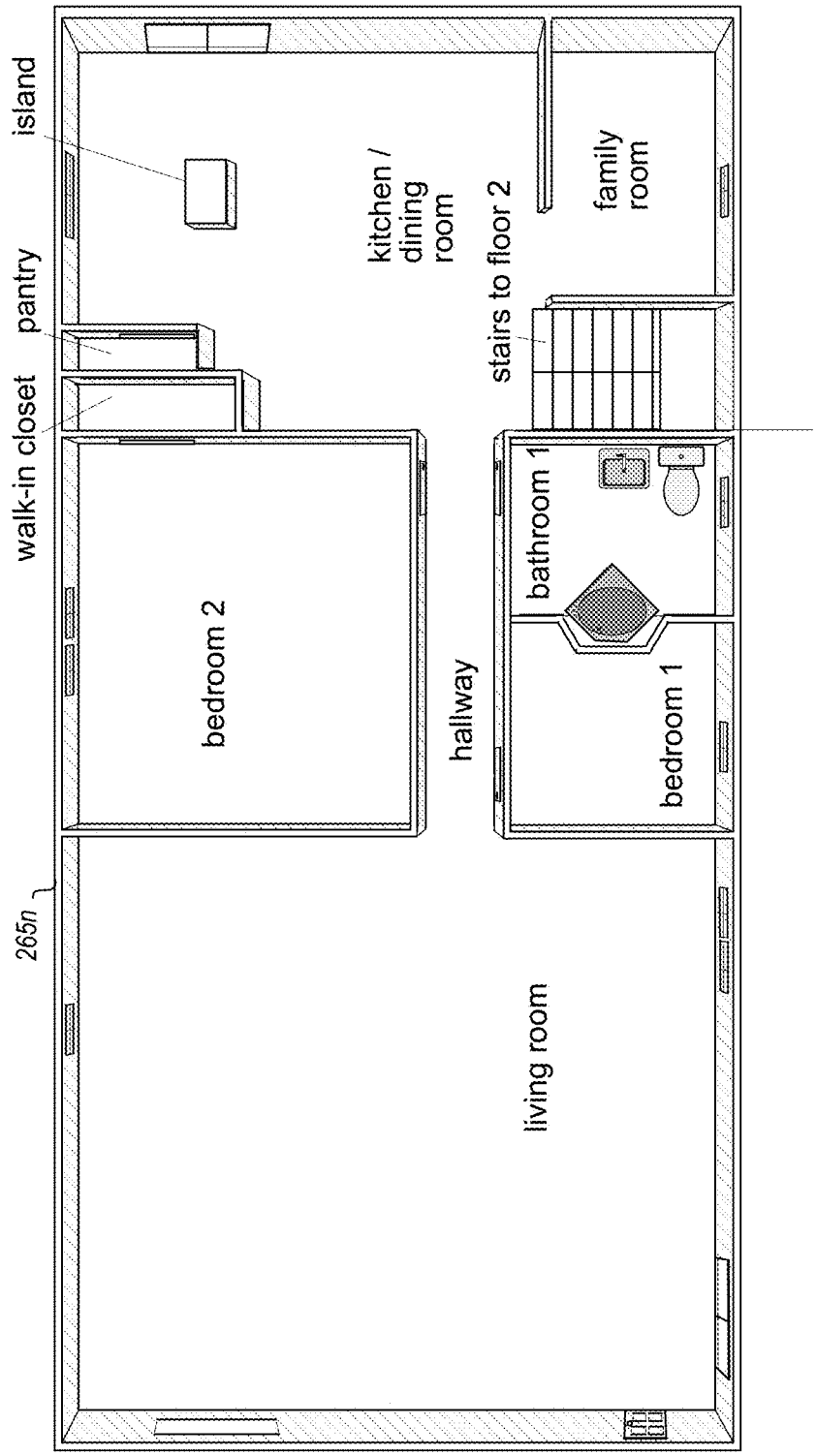

FIGS. 2A-2N illustrate examples of generating and presenting a floor plan for a building using images of the building interior and additional room layout information for rooms of the building, based at least in part on partial floor plans and associated guidance acquisition instructions that are determined and provided by or under control of an embodiment of the ABIA system, and such as for the house 198 and images acquired at acquisition locations 210 discussed in FIG. 1.

In particular, FIG. 2A illustrates an example image 250a, such as a perspective image taken in a northeasterly direction from acquisition location 210B in the living room of house 198 of FIG. 1 (or a northeasterly facing subset view of a 360-degree panorama image taken from that acquisition location and formatted in a rectilinear manner)—the directional indicator 109a is further displayed in this example to illustrate the northeasterly direction in which the image is taken. In the illustrated example, the displayed image includes built-in elements (e.g., light fixture 130a), furniture (e.g., chair 192), a window 196-1, and a picture 194-1 hanging on the north wall of the living room. No inter-room passages into or out of the living room (e.g., doors or other wall openings) are visible in this image, but multiple room borders are visible in the image 250a, including horizontal borders between a visible portion of the north wall of the living room and the living room's ceiling and floor, horizontal borders between a visible portion of the east wall of the living room and the living room's ceiling and floor, and the vertical border 195-2 between the north and east walls.

FIG. 2B continues the example of FIG. 2A, and illustrates an additional perspective image 250b taken in a northwesterly direction from acquisition location 210B in the living room of house 198 of FIG. 1 (or a northwesterly facing subset view of a 360-degree panorama image taken from that acquisition location and formatted in a rectilinear manner)—the directional indicator 109b is further displayed to illustrate the northwesterly direction in which the image is taken. In this example image, a small portion of window 196-1 continues to be visible, along with a portion of window 196-2 and an additional lighting fixture 130b. In addition, horizontal and vertical room borders are visible in image 250b in a manner similar to that of FIG. 2A.

FIG. 2C continues the examples of FIGS. 2A-2B, and illustrates a third perspective image 250c taken in a southwesterly direction in the living room of house 198 of FIG. 1, such as from acquisition location 210B or 210A (or a southwesterly facing subset view of a 360-degree panorama image taken from one of those acquisition locations and formatted in a rectilinear manner)—the directional indicator 109c is further displayed to illustrate the southwesterly direction in which the image is taken. In this example image, a portion of window 196-2 continues to be visible, as is a couch 191 and visual horizontal and vertical room borders in a manner similar to that of FIGS. 2A and 2B. This example image further illustrates two wall opening passages for the living room, which in this example include a doorway 190-1 with a swinging door in the westward-facing wall (which is identified in FIG. 1 as a doorway to the exterior of the house) and a doorway 190-6 with a sliding door in the southward-facing wall (e.g., to a side yard of the house). It will be appreciated that a variety of other perspective images may be taken from acquisition location 210B and/or other acquisition locations and displayed in a similar manner.

FIG. 2D continues the examples of FIGS. 2A-2C, and illustrates a 360° panorama image 250d (e.g., taken from acquisition location 210B), which displays the entire living room in an equirectangular format—since the panorama image does not have a direction in the same manner as the perspective images of FIGS. 2A-2C, the directional indicator 109 is not displayed in FIG. 2D, although a pose for the panorama image may include one or more associated directions (e.g., a starting and/or ending direction for the panorama image, such as if acquired via rotation). A portion of the visual data of panorama image 250d corresponds to the first perspective image 250a (shown in approximately the center portion of the image 250d), while the left portion of the image 250d and the far-right portion of the image 250d contain visual data corresponding to those of the perspective images 250b and 250c. This example panorama image 250d includes windows 196-1, 196-2 and 196-3, furniture 191-193, doorways 190-1 and 190-6, and a non-doorway wall opening 263a to the hallway room (with the opening showing part of a door 190-3 visible in the adjacent hallway). Image 250d further illustrates a variety of room borders in a manner similar to that of the perspective images, but with the horizontal borders being displayed in an increasingly curved manner the farther they are from a horizontal midline of the image—the visible borders include vertical inter-wall borders 195-1 through 195-4, vertical border 195-5 at the left side of the hallway opening, vertical borders at the right side of the hallway opening, and horizontal borders between the walls and the floor and between the walls and the ceiling.

FIG. 2E continues the examples of FIGS. 2A-2D, and illustrates information 260e that may be provided by an embodiment of the ABIA system, such as to one or more users who are involved in acquiring images of the building (e.g., images 250a-250d of FIGS. 2A-2D). In particular, in the example of FIG. 2E, the information 260e illustrates an example GUI that contains information corresponding to a first image 250e acquired by a user in a building (e.g., corresponding to image 250d of FIG. 2D), including visual data of the image (e.g., a thumbnail copy of the image), and a rough initial 2D room shape estimation $239a^1$ of the room containing the acquisition location of the image that is generated from the visual data of the image 250e— information in the rough initial room shape estimation may serve as one type of feedback regarding the image, such as to reflect parts of the rough initial room shape estimation that are uncertain or unable to be determined (e.g., the top and right sides of the room shape is this example, as reflected by multiple lines showing different possible positions of those portions of the room), or that appear to be significantly incorrect. In addition, a larger version of the image 250e is shown in the upper left portion of FIG. 2E for reference purposes, with the image 250e being a 360° panorama image using an equirectangular format in this example, and with additional information from an automated analysis of the visual data of the image under control of the ABIA system being shown, which in this example includes an automatically determined wall-to-floor boundary 251. The boundary is overlaid on the image in this example using two green lines representing degrees of uncertainty regarding the boundary, such that areas in which the boundary is less certain are shown with a visible difference between the two green lines to reflect different possible positions of a corresponding wall portion (e.g., near the left side of the image 250e), with greater differences between two or more green lines crossing a vertical line representing greater amounts of uncertainty of the position of the actual wall along that vertical line, while in other areas in which the boundary is more certain the two green lines overlap in part or in whole (e.g., to appear to be a single line). In addition, the automatically determined information from the visual data of image 250e further indicates automatically determined positions of windows 211, doorway wall openings 212, non-doorway wall openings 213, and inter-wall boundaries 214, with the information shown in horizontal bands using a spectrum of black-and-white shades from fully black (representing a 0% degree of likelihood of the existence of a corresponding type of structural wall element) to fully white (representing a 100% degree of likelihood of the existence of a corresponding type of structural wall element), and with degrees of gray between fully black and fully white representing intermediate degrees of likelihood. The boundary 251 and additional information 211-214 may, for example, be determined by one or more machine learning models that are trained to recognize such boundaries and/or structural wall elements. It will be appreciated that some or all of the information 211-214 and 215 may or may not be displayed to a user, such as with the information in the example GUI 260e including a thumbnail version of the image 250e and the boundary 251 but not the structural wall elements 211-214, and that other types of room information made be determined and/or displayed in other manners in other embodiments.

FIG. 2F continues the examples of FIGS. 2A-2E, and illustrates further information 260f regarding the initial room shape for the first room, as well as additional information 255f that is illustrated for the benefit of the reader but may not be initially displayed to the user as part of the example GUI. In this example, indicator 210A of information 260f represents a first acquisition location at which the first image 250e of the first room (e.g., the living room of the house 198 of FIG. 1) was captured, and indicator 210B represents a second acquisition location at which a second image (not shown) was captured in the first room. In this example, a second rough initial room shape estimation $239a^2$ is shown that is generated from the visual data of the second image—as is shown, the top and right portions of the second rough initial room shape estimation $239a^2$ have more certainty than those of the first rough initial room shape estimation $239a^1$ (e.g., due to acquisition location 210b being closer to those parts of the room), while the bottom and left portions of the second rough initial room shape estimation $239a^2$ have less certainty than those of the first rough initial room shape estimation $239a^1$, such that the second rough initial room shape estimation $239a^2$ is only a partial room shape in this example with the bottom and left portions of rough initial room shape estimation $239a^2$ not being included (e.g., due to being too uncertain, such as have an associated degree of uncertainty that exceeds a corresponding inclusion threshold; due to not being part of the visual data of the second image, such as if it is an image with less than 360° of horizontal visual coverage that does not include visual data for those parts of the room; due to data for those parts of the room otherwise being unavailable, such as being blocked in the view from acquisition location 210B by one or more intervening objects; etc.).

In this example, information from the two rough initial room shape estimations $239a^1$ and $239a^2$ are combined to generate a final initial room shape estimation 239a for the first room in which some or all of the wall uncertainty information from either of the two rough initial room shape estimations $239a^1$ and $239a^2$ is reduced or eliminated. As one non-exclusive example, given relative positions of two or more images occupying the same room (such as the images acquired at acquisition locations 210A and 210B) and their respective initial rough room shapes, those initial rough room shapes may be merged into one combined room shape as follows. Assume that each image and room shape initially exists in its own separate coordinate system, with each image at the origin (0,0), and with all room shapes to be converted into the same coordinate system to facilitate combining the individual room shapes into a combined room shape. First, each shape is reprojected into the same coordinate system, using the known relative poses of the images—for example, if a first image A (e.g., a panorama image) has a determined relative pose to second image B (e.g., a panorama image, a perspective image, etc.), then image A is taken to be at the origin (0, 0) of this new coordinate system, and image B is specified to be at the location identified by its relative pose/position to image A. For a third image C, if this third image has a relative pose/position to image B, then image C's pose/position in the combined coordinate system is obtained by combining image B's pose/position relative to image A with image C's pose/position relative to image B, such that image C's pose/position is specified to be at the location identified by its relative pose to image B. Once all of the images and room shapes occupy the same coordinate system, merging of the shapes is performed. In this non-exclusive example, the room shapes are initially room shape polygons or other shapes that are converted to binary segmentation masks in the top-down floor-plane projection (e.g., represented as a raster array), and these segmentation masks can be summed using binary addition into a single full segmentation mask for the room. To recover a layout polygon, a contour extraction algorithm may be applied to the segmentation mask to produce a dense contour, which may optionally be simplified using a polygon simplification algorithm to obtain a final room shape polygon. Further details of a similar process are illustrated in FIG. 2I with respect to similarly combining the room shapes of two rooms.

The additional information 255f shown in FIG. 2F represents a partial building floor plan that includes a further refined room shape 239b for the living room (e.g., that may be determined for the room during subsequent processing by the MIGM system, such as is further discussed with respect to FIGS. 2G-2I), along with additional information that indicates the positions of determined structural wall elements such as windows, doorways, and non-doorway wall openings (e.g., based on a combination of information 211-214 determined from the visual data of the first image acquired at acquisition location 210A and corresponding additional information, not shown, determined from the visual data of the second image acquired at acquisition location 210B), along with visual indications of the acquisition locations 210A and 210B—other types of structural elements may similarly be identified and indicated, such as stairways, but are not shown in this example for this room shape.

FIG. 2G continues the examples of FIGS. 2A-2F, and illustrates updated information 260g that may be displayed in the example GUI, which in this example corresponds to a next image 250g that is acquired for the building, which in this example is a third image that is captured at acquisition location 210C in a second room of the house 198 (e.g., the hallway to the east of the living room)—the image 250g is a 360° panorama image in this example, as shown in the upper portion of the information 260g, and with thumbnail versions of each of the three images acquired at acquisition locations 210A-210C shown in the lower right portion of the information 260g as part of an image queue or list. In this example, the updated GUI includes updated room shape information that includes the initial room shape 239a of FIG. 2F for the first room and an initial estimated room shape 238a for the hallway—it will be appreciated that the right (or east) end of the room shape for the hallway is not initially represented, such as due to having insufficient visual data from acquisition location 210C at the west end of the hallway. In addition, the initial additional room shape estimate 238a is shown at a position relative to that of the prior room shape estimate 239a in this example (e.g., with relative positions being determined at least in part on visual overlap of the image 250g with that of images 250e and/or 250f), with the combination of the positioned room shapes 239a and 238a reflecting a rough partial floor plan for the building, although such room shape estimate information and/or relative positioning may be illustrated in other manners. FIG. 2I illustrates further details of a process for combining the room shapes 239a and 238a as part of generating refined room shapes for the first two rooms for inclusion in a revised partial floor plan.

FIG. 2H continues the examples of FIGS. 2A-2G, and illustrates updated information 260h that may be displayed in the example GUI, which in this example illustrates various types of guidance acquisition instructions 272 that may be automatically determined by the ABIA system based at least in part on the visual data of the images 250e-250g and resulting initial room shapes 239a and 238a. In particular, the guidance acquisition instructions 272 may, for example, indicate that a current position of the mobile image acquisition and analysis computing device (not shown) at location 273h is inappropriate to use in acquiring a next image, such as due to being too close to the prior acquisition location 210C (with the corresponding guidance acquisition instructions indicating to move away from that prior acquisition location, such as by at least a specified distance) and/or due to being too close to a wall (with the corresponding guidance acquisition instructions indicating to move toward or to the room center)—in this example, a visual indication of the current position 273h is overlaid on the partial building floor plan that includes the initial room shapes 239a and 238a, and other types of related information (e.g., a directional arrow) could similarly be added to the partial building floor plan related to the types of movement to perform. As an alternative example, the guidance acquisition instructions 272 may include determining a particular next acquisition location 274h at which to acquire a next image and optionally other data, with corresponding guidance acquisition instructions indicating to move to that next acquisition location—in this example, a visual indication of the next acquisition location 274h is overlaid on the partial building floor plan, and a corresponding directional arrow and/or other related information could similarly be added. As yet another example, the guidance acquisition instructions may include an approximate determined direction and/or location and provide corresponding information, such as to move near the east end of the current room. As another example, the guidance acquisition instructions may include further types of directions, such as to open an indicated door 190-3 (and/or to open an indicated window, move an indicated object, move around an indicated object, etc.) and to reacquire visual data afterwards (e.g., from the last acquisition location 210C with that door open, from another acquisition location after moving around an indicated object, etc.).

The determination of such guidance acquisition instructions may be performed in various manners in various embodiments, including to reduce uncertainty in the currently available information (e.g., uncertainty related to the structure of the east end of the current hallway room) and/or to obtain missing data of other types (e.g., visual data through the doorway 190-3 of the room on the other side of the doorway, visual data for rooms to the north or south or east of the hallway, etc.), as discussed in greater detail elsewhere herein. It will be appreciated that a variety of other types of guidance acquisition instructions may be determined and displayed in other manners in other embodiments. For example, while the various types of guidance acquisition instructions are illustrated in this example as being shown in textual form and/or overlaid on the partial building floor plan, in other embodiments the guidance acquisition instructions may be displayed in other manners, including to be overlaid on top of one or more of the image thumbnails 250e-250g, whether in addition to or instead of being overlaid on the partial building floor plan. In addition, as one non-exclusive example of determining one or more next acquisition locations, an automated recommendation system may be used to identify such next acquisition locations (e.g., the most promising next one or more locations), such as by using one or more routing algorithms that take the current partial building floor plan as input, optionally along with other available information about the building (e.g., an overhead image view, an architectural floor plan, information available from public and/or proprietary sources about building attributes, etc.), and return an optimal route for capturing the building with a fewest number of images/acquisition locations and/or to satisfy one or more other defined criteria.

FIG. 2I continues the examples of FIGS. 2A-2H, and illustrates updated information 260i related to determining refined room shapes for the living room and hallway, as well as generating corresponding refined partial floor plan 255i. In this example, the initial room shapes 239a and 238a are shown at their relative positions, with a binary segmentation mask (shown in black) applied to a combination of those room shapes. As discussed in greater detail elsewhere herein, a polygon shape (that is represented by a combination of the lines 239b and 238b in this example) may be generated to correspond to the outline or contour of the segmentation mask, and subsequently separated into the individual refined room shapes 239b and 238b for the living room and hallway, respectively. The updated partial floor plan shown in 255i reflects those refined room shapes 239b and 238b, along with visual indications added corresponding to various structural wall elements. In this example, additional visual data has not yet been acquired to resolve the uncertainties associated with the middle and east turn parts of the hallway, as shown in information 262 using dashed lines of decreasing weight corresponding to decreasing degrees of certainty for the wall positions, the additional doorways 190-4 and 190-5, and the non-doorway wall opening 263*b*. While the partial building floor plan shown in information 260*g* of FIGS. 2G and 260*h* of FIG. 2H uses the rough initial room shapes 239*a* and 238*a*, it will be appreciated that the partial building floor plan information shown in the GUI may instead include the refined room shapes 239*b* and/or 238*b*, such as to instead show the partial floor plan of 255*i* once those refined room shapes are determined (e.g., once they are determined in a real-time or near real-time manner with respect to the acquisition of the corresponding images and acquisition locations 210A-210C, such as within milliseconds, seconds, minutes, etc., and in some cases performed by automated operations of the same mobile image acquisition and analysis device that is used to acquire the images to execute a corresponding embodiment of the ABIA system).

By displaying a rough partial floor plan (such as in information 260*g* of FIGS. 2G and 260*h* of FIG. 2H) and/or a refined partial floor plan (such as information 255*i* of FIG. 2I) to a user involved in the image acquisition process, the user is provided with a variety of types of feedback, such as to enable the user to understand which parts of the current building have been covered by the image acquisition session(s) process so far and where to go to capture additional images and/or other data, with the automatically determined guidance acquisition instructions providing further details to direct or facilitate the further image acquisition. For example, even without the guidance acquisition instructions 272 shown in FIG. 2G, other information overlaid on the partial building floor plan in FIG. 2G may indicate to the user that the current position 273*h* is too close to the area covered by acquisition location 210C and/or too close to the wall, and/or to proceed to a next determined acquisition location shown at location 274*h*, and/or to proceed in an indicated direction (e.g., if a corresponding movement directional indicator was shown), and/or that visual data of a room to the south of the hallway is missing due to the door in doorway 190-3 being closed. In addition, displayed information about determined uncertainty in wall positions (e.g., at the eastern end of the hallway) and/or other elements (e.g., structural wall elements, such as the doorways 190-4 and 190-5; non-doorway wall opening 263*b*; etc.) may indicate to the user that additional visual data is needed (e.g., to acquire additional visual data near those locations), and thus in such situations themselves act as guidance acquisition instructions related to one or more next acquisition locations at which to acquire additional visual data.

FIG. 2J continues the examples of FIGS. 2A-2I, and illustrates other information 255*j* that may be displayed in the example GUI to provide additional types of guidance acquisition instructions. In particular, in the example of FIG. 2J, a further partial floor plan is illustrated that includes not only the interconnected room shapes 239*b* and 238*b* that are generated using the images acquired at acquisition locations 210A-210C, but also additional interconnected room shapes 237*b* and 236*b* that have been generated using additional images acquired at additional acquisition locations 210I and 210J. In this example, the southwest portions of room shape 236*b* have illustrated uncertainties associated with the wall positions at those locations (e.g., due to the distance from acquisition location 210J and not being visible from acquisition location 210I through the non-doorway wall opening 263*c*). In addition, while the non-doorway wall opening at the eastern end of the hallway 238*b* and the non-doorway wall opening at the southwest side of room shape 236*b* are the same wall opening, sufficient visual data is not yet available to determine that the wall openings are the same and to position the first group/subset of interconnected room shapes 239*b* and 238*b* relative to the second group/subset of interconnected room shapes 236*b* and 237*b*. Accordingly, additional guidance acquisition instructions have been determined about one or more additional acquisition locations 274*j* at which to acquire additional visual data (which in this case will allow the two groups of room shapes to be interconnected and positioned relative to each other), with visual indications of the one or more additional acquisition locations 274*j* overlaid on the partial building floor plan shown in information 255*j*. While not illustrated in this example, it will be appreciated that corresponding textual instructions may be included, whether in addition to or instead of the visual indications of the one or more additional acquisition locations 274*j*. In addition, while such multiple groups of separate interconnected room shapes may occur due to a lack of sufficient acquisition locations (e.g., a user receiving directly from acquisition location 210C to acquisition location 210J), such separate groups may also occur in other manners in other embodiments and situations, such as if other types of positioning data are lost or missing (e.g., GPS data, IMU data, etc.).

FIG. 2K continues the examples of FIGS. 2A-2J, and illustrates other information 260*k* that may be displayed in the example GUI, which in this example includes additional types of information overlaid on a partial building floor plan to assist the user involved in the image acquisition process, such as to indicate types of objects that have been automatically recognized in a room (in this example, using the room shape 239*a* for the living room) at their automatically determined positions—it will be appreciated that such information may assist the user in determining their location within the one or more rooms whose room shapes are included in the partial building floor plan, as well as indicate uncertainty information associated with some of the automated determination to direct the user to additional locations at which to acquire visual data in a manner similar to that discussed above. In this example, visual indications have been added for various types of structural wall elements and objects in the room, such as representative icons indicating doorways such as 190-1*k* and 190-6*k*, windows such as 196-1*k* and 196-2*k* and 196-3*k*, and furniture such as chair 192*k*, table 193*k* and couch 191*k*—it will be appreciated that similar types of information may be displayed in other manners in other embodiments, such as to replace some or all of the representative icons with actual depictions of the objects in the room (e.g., thumbnail images of the actual objects cropped from the images acquired at one or both of the image acquisition locations 210A and 210B). As one non-exclusive example, common objects (e.g., furniture) may be detected through use of computer vision and/or machine learning algorithms to analyze acquired images, with icons or other representations of those objects placed in appropriate locations on a partial floor plan by using computer vision algorithms to detect their location relative to that of the corresponding acquisition location(s) of the image(s) in which the objects are detected.

FIG. 2L continues the examples of FIGS. 2A-2K, and illustrates additional information 260*l* that may be displayed in the example GUI to provide additional types of guidance acquisition instructions. In particular, in the example of FIG. 2L, the partial floor plan of FIG. 2J is illustrated after it is updated to position the two groups of interconnected room shapes relative to each other (e.g., using additional visual data acquired at an acquisition location 274*j*), and in this example is further overlaid on an overhead image 250*l* (e.g., a satellite image) of the exterior of the building (e.g., house 198), with the combination of the overhead image and the overlaid partial floor plan shown as 2501'—it will be appreciated that while information 2501' may be displayed to a user in the GUI, separate image 2501 may not be displayed, but is illustrated in FIG. 2L for the benefit of the reader. Such a combination of information 2501' may further assist a user in identifying portions of the building at which to acquire additional visual data, such as for the rooms to the north and south of the hallway shown with room shape 238*b*, and thus may serve as further determined guidance acquisition instructions provided to the user related to additional acquisition locations at which to acquire additional images. In addition, such a visual overlay may further illustrate uncertainty information about room shape positions relative to the information of the building in the image, such as to reflect that positions of walls that do not closely match the exterior outline of the building may have greater uncertainty for which additional visual data may be useful. While not illustrated in FIG. 2L, such a partial floor plan could be overlaid on other types of information related to the building, whether instead of or in addition to an overhead image, such as a partial or full side image of the building (e.g., to illustrate multiple stories, if applicable, optionally along with some or all of the roof), an architectural floor plan of the building, a floor plan template (e.g., one or more of a defined number of possible floor plan templates to which the building may correspond, such as multiple apartment and/or condominium floor plans used in an apartment or condominium building, multiple house floor plans used in a housing development, etc.), etc. When multiple stories of a building result in different groups of interconnected room shapes corresponding to the different stories, the ABIA system may further determine guidance acquisition instructions to cause the different story room shape groups to be connected relative to each other (e.g., via connecting passages), such as in a manner similar to that discussed with respect to FIG. 2J and elsewhere herein.

Additional non-exclusive examples of determining and providing feedback during an image acquisition session are included in U.S. Non-Provisional patent application Ser. No. 17/842,419, filed Jun. 16, 2022 and entitled "Automated Tools For Assessing Building Mapping Information Generation"; and U.S. Non-Provisional patent application Ser. No. 17/185,793, filed Feb. 25, 2021 and entitled "Automated Usability Assessment Of Buildings Using Visual Data Of Captured In-Room photos"; each of which is incorporated herein by reference in its entirety.

FIGS. 2M-2N continue the examples of FIGS. 2A-2L, and illustrate further mapping information that may be generated from the types of analyses discussed herein. In particular, after all of the room shape interconnection and other layout information has been determined for the house, whether automatically by the MIGM system and/or ABIA system, and/or by using information supplied by one or more system operator users, the final results may be used to generate a 2D floor plan of the house, optionally after final optimizations have been performed and visual aspects of the final floor plan have been added—such final optimizations may include, for example, one or more of ensuring consistent visual aspects (e.g., line widths, colors, text styles, etc.), placing textual room labels at preferred locations on the final floor plan, adding missing spaces such as small closets or other additional areas not included on the defined room shape layouts (e.g., areas that did not have any images taken from within them, resulting in empty spaces within an exterior of the building that are not identified in the defined room shape layouts), merging multiple overlapping and/or adjacent walls, correcting any geometric anomalies, etc. In at least some embodiments, the described techniques may include performing at least some such updates in an automated manner, and optionally providing corresponding GUI tools for one or more users to make final manual adjustments (e.g., GUI tools similar to those of a drawing or painting program) to a floor plan for the house that is generated. In the example of FIG. 2M, an example final 2D floor plan 230*m* is illustrated that may be constructed based on the described techniques, which in this example includes walls and indications of doorways and windows, and such as may be presented to a system operator user and/or end user in a GUI 260*m*, and with various types of information being added to the combination of interconnected room shapes—it will be appreciated that a 3D or 2.5D model floor plan showing wall height information may be similarly generated in some embodiments, whether in addition to or instead of such a 2D floor plan, such as 3D floor plan 265*n* of FIG. 2N. In this example of FIG. 2M, room labels have been added to some or all rooms (e.g., "living room" for the living room), room dimensions have been added for some or all rooms, visual indications of fixtures or appliances or other built-in features have been added for some or all rooms, visual indications of positions of additional types of associated and linked information have been added (e.g., of panorama images and/or perspective images that an end user may select for further display, of audio annotations and/or sound recordings that an end user may select for further presentation, etc.), visual indications of doorways and windows may be shown, etc.—in addition, in at least some embodiments and situations, some or all such types of information may be provided by one or more system operator users (e.g., to receive textual room labels from those users). In addition, in this example a user-selectable control 228 is added to the GUI to indicate a current floor that is displayed for the floor plan, and to allow the user to select a different floor to be displayed—in some embodiments, a change in floors or other levels may also be made directly from the floor plan (such as via selection of a connecting passage, such as the stairs to floor 2 in the illustrated floor plan), and in some embodiments information for multiple floors (e.g., all floors) will be displayed simultaneously (whether as separate sub-floor plans for separate floors, or instead by integrating the room connection information for all rooms and floors into a single floor plan that is shown together at once). It will be appreciated that a variety of other types of information may be added in some embodiments, that some of the illustrated types of information may not be provided in some embodiments, and that visual indications of and user selections of linked and associated information may be displayed and selected in other manners in other embodiments.

FIG. 2N illustrates additional information 265*n* that may be generated from the automated analysis techniques disclosed herein and displayed (e.g., in a GUI similar to that of FIG. 2M), which in this example is a 2.5D or 3D model floor plan of one story of the house. Such a model 265*n* may be additional mapping-related information that is generated based on the floor plan 230*m*, with additional information about height shown in order to illustrate visual locations in walls of features such as windows and doors, or instead by combining final estimated room shapes that are 3D shapes. While not illustrated in FIG. 2N, additional information may be added to the displayed walls in some embodiments, such as from acquired images (e.g., to render and illustrate actual paint, wallpaper or other surfaces from the house on the rendered model 265*n*), and/or may otherwise be used to add specified colors, textures or other visual information to walls and/or other surfaces, and/or other types of additional information shown in FIG. 2M (e.g., information about exterior areas and/or accessory structures) may be shown using such a rendered model. In addition, for buildings with multiple stories or other levels, a 2.5D or 3D model of interconnected floor plans of all the stories or other levels may be similarly generated and displayed.

Various details have been provided with respect to FIGS. 2A-2N, but it will be appreciated that the provided details are non-exclusive examples included for illustrative purposes, and other embodiments may be performed in other manners without some or all such details.

In addition, a variety of additional automated functionality (and in at least some embodiments, associated GUI functionality for use by one or more system operator users) may be provided by and/or used in at least some embodiments. As one example, in some embodiments functionality may be provided to combine multiple panorama images that are taken in a single room into a single panorama image, such as by localizing information for one of the panorama images into the space of the other panorama image—for example, both panorama images may be displayed to a user who selects one or more common points in both images (e.g., a common plane with infinite points in both images), with the MIGM system determining the corresponding locations of the visual information of the two panorama images based on the indicated common point(s). After such a combination panorama image is created, it may be further used in a similar manner to that of other panorama images, as discussed in greater detail elsewhere herein. In addition, in some embodiments one or more additional supplemental panorama images are used in combination with a single primary panorama image for each room, such as to generate a supplemental panorama image at the location of each of one or more inter-room connections in order to assist in determining the connection between those rooms (e.g., alignment and other layout of the room shapes of the rooms), such as by using information in the supplemental panorama image to match to corresponding features in the panorama images for each of the connecting rooms. Moreover, in some embodiments additional functionality may be provided (e.g., by the MIGM system) to perform a global optimization of a generated floor plan, such as to identify final alignments of walls and other room shape information. In addition, in some embodiments additional functionality may be provided (e.g., by the MIGM system) to refine transformations of room shapes, such as by providing an optimization that uses alignment of line segments and a top-down view or by using direct image overlaps (e.g., via rendering). Moreover, in some embodiments additional functionality may be provided (e.g., by the MIGM system) to perform or assist with a selection of a first room shape to begin generation of a floor plan, such as based on an automated analysis of information about that room (e.g., relative to that of other rooms of the building), and/or based on information supplied by a system operator user (e.g., after information about some or all room shapes is displayed or otherwise provided to the user)—as one example, a room may be selected to be used as a starting room based on one or more factors, such as having the most inter-room wall openings, the least inter-room wall openings, a wall opening corresponding to an exterior door (e.g., the entry to the building), the order of panorama image capture (e.g., to use the room corresponding to the first panorama image capture or the last panorama image captured), etc.

Furthermore, in some embodiments additional functionality may be provided (e.g., by the MIGM system) to align or otherwise connect multiple floors or other levels of the building, such as via connecting stairways or other connecting passages. Such additional functionality may include, for example, aligning the multiple floors of a house into a single coordinate system so that they can all be rendered as a 3D model (e.g., in a rendering system), and/or aligning the multiple floors of a house in 2D so that they can be overlaid in a top-down orthographic projection (e.g., in a CAD system or in architectural blueprints). As one non-exclusive example, one way to implement connections between rooms on two separate floors is to use panorama images that show the stairway connecting the two floors, such as a panorama image at one or both of the bottom and top of the stairs (e.g., for a straight stairway that directly connects the floors, without any intermediate stair landing) and/or one or more panorama images at an intermediate stair landing, and to interconnect the wall openings of the rooms at the top and bottom of the stairs in a manner similar to other wall opening connections (such as by including a horizontal distance between the two wall openings corresponding to a measured or estimated length of the stairs, and optionally including vertical information between the two wall openings if available), and with the sub-floor plans for two such floors being rotated in a consistent manner and at corresponding positions in 3D space. Estimates of the height difference and horizontal distance between two such wall openings at the ends of a stairway may be determined, for example, if a height of a stairway step is known (e.g., the height of a riser and the tread above it) and/or if a panorama image is available in which both the stairway foot and head ends are visible (e.g., from the top or bottom of a straight stairway; from each stairway landing of a non-straight stairway, such as by treating each such landing as an 'intermediate' floor that is connected with the other floors in a manner analogous to that of connecting two floors for a straight stairway; etc.) that enables determination of horizontal line(s) in the panorama image corresponding to the stairway foot and/or head. In some embodiments and situations, a height and/or depth of a step could be measured during panorama image capture, whether manually or automatically using an object of known size on one of the steps. In addition, the quantity of steps may be automatically determined using image processing in some embodiments, with that information combined with step depth information to determine a horizontal length of the stairway (optionally accounting for the nosing/overhang of the stair tread over the riser) and/or with step height information to determine a vertical height of the stairway. In this manner, such embodiments may perform the connection of rooms on two floors using relatively sparse geometric features with clear semantic meanings (e.g., the lines in one or more panorama images representing the foot and head of a stairway) in a minimal number of captured panorama images, rather than using dense data with numerous panorama images (e.g., to provide dense visual connection information) and/or other dense measurements taken along a stairway.

In addition, in at least some embodiments additional information may be used as part of generating a floor plan for a building that is obtained outside of the building, such as one or more panorama images acquired outside of the building (e.g., in which some or all of the building is visible), one or more panorama images acquired of outbuildings or other structures on the same property, satellite and/or drone images from overhead, images from a street adjacent to the building, information from property records or other sources about dimensions of the exterior of the building, etc. As one example, one or more exterior panorama images may be used to identify a shape and/or size of one or more exterior walls of the building and/or a roof shape and/or size for the building, the quantity and/or locations of one or more windows in an exterior wall, identification of one or more floors of the building that are visible from that exterior, etc., such as from an automated analysis of the panorama images and/or based on manual annotations of the panorama images by one or more MIGM system operator users, and with such information subsequently used to eliminate/select and/or to rank possible room connections according to how they fit with the information acquired from the exterior panorama image(s). As another example, one or more exterior panorama images may be treated as being part of one or more exterior rooms that surround or are otherwise associated with the building, with the exterior rooms being modeled (e.g., with room shapes) and connected to and used with other interior rooms of the building in a floor plan and/or in other manners. It will be appreciated that a variety of other types of functionality may similarly be provided in at least some embodiments.

Figure 3:
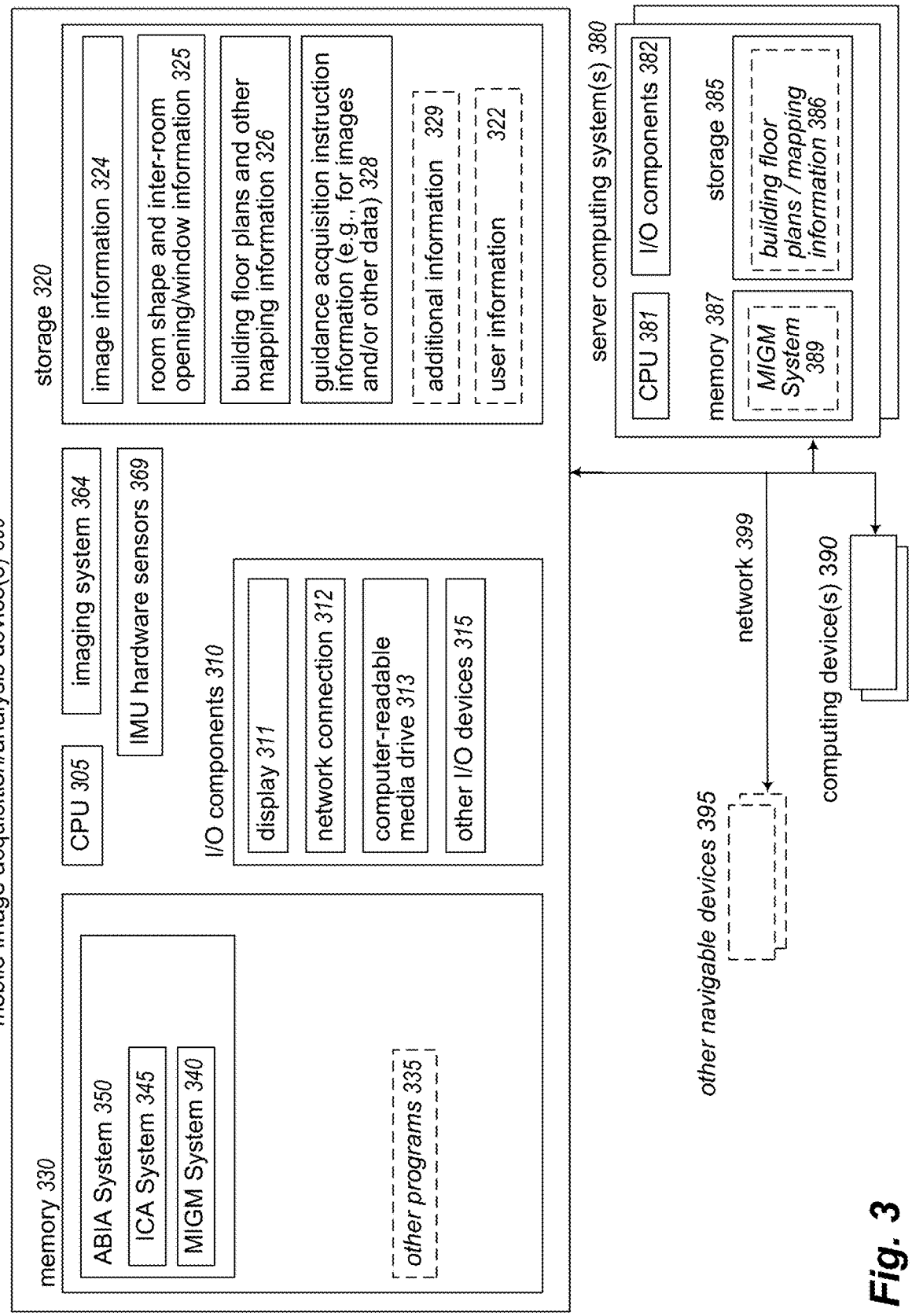
FIG. 3 is a block diagram illustrating computing systems suitable for executing embodiments of one or more systems that perform at least some of the techniques described in the present disclosure.

FIG. 3 is a block diagram illustrating an embodiment of one or more mobile image acquisition and analysis computing devices 300 each executing an implementation of an ABIA system 350 (containing an ICA system 345 and an MIGM system 340), one or more server computing systems 380, other computing devices 390, and optionally one or more navigable devices 395—the computing devices and systems 300, 380 and 390 (and ABIA and/or MIGM and/or ICA systems) may be implemented using a plurality of hardware components that form electronic circuits suitable for and configured to, when in combined operation, perform at least some of the techniques described herein. One or more additional separate camera devices may similarly be used, such as to acquire building images in addition to or instead of the mobile device 300, but are not illustrated in this example. In the illustrated embodiment, each mobile computing device 300 includes one or more hardware central processing units ("CPUs") or other hardware processors 305, various input/output ("I/O") components 310, storage 320, and memory 330, with the illustrated I/O components including a display 311, a network connection 312, a computer-readable media drive 313, and other I/O devices 315 (e.g., keyboards, mice or other pointing devices, microphones, speakers, GPS receivers, etc.). Each of the mobile computing devices 300 in this example embodiment further include one or more imaging systems 364 and IMU hardware sensors 369 and optionally other components (e.g., a lighting system, a depth-sensing system, location sensors, etc.), such as for use in acquisition of images and associated movement data of the device 300 (e.g., by the ICA system 345). Each server computing system 380 and computing device 390 may have similar components, although only some such components (e.g., one or more hardware processors 381, memory 387, storage 385 and I/O components 382 of server computing system 380; etc.) are illustrated for the sake of brevity.

The mobile computing device(s) 300 and executing ABIA system 350, and server computing system(s) 380 and optional executing MIGM system 389, and other devices such as computing devices 390 (e.g., used by system operator users of the ABIA and/or MIGM and/or ICA systems to interact with those respective systems; used by end users to view floor plans, and optionally associated images and/or other related information; etc.) and/or optional other navigable devices 395 (e.g., for use by semi-autonomous or fully autonomous vehicles or other devices) may in this illustrated embodiment communicate with each other and with other computing systems and devices (not shown) via one or more networks 399 (e.g., the Internet, one or more cellular telephone networks, etc.). In other embodiments, some of the described functionality may be combined in less computing systems/devices and/or separated into additional computing systems/devices.

In the illustrated embodiment, an embodiment of the ABIA system 350 executes in memory 330 of a mobile computing device 300 in order to perform at least some of the described techniques, such as by using the processor(s) 305 to execute software instructions of the system 350 in a manner that configures the processor(s) 305 and mobile computing device 300 to perform automated operations that implement those described techniques. The illustrated embodiment of the ABIA system may include one or more components, such as the ICA system 345 and/or the MIGM system 340 and/or one or more other components (not shown), to each perform portions of the functionality of the ABIA system, and the memory may further optionally execute one or more other programs 335. The ABIA system 350 may further, during its operation, store and/or retrieve various types of data on storage 320 (e.g., in one or more databases or other data structures), such as one or more of the following: acquired image information 324 (e.g., for 360° panorama images, such as acquired by the ICA system), for analysis by the MIGM system to produce room layout information and/or otherwise assist in generating floor plans and/or for analysis by the ABIA system to determine guidance acquisition instructions related to further acquisition of additional images and/or other types of data, as well as to optionally provide to users of computing systems/devices 380 and/or 390 for display; generated or received information 325 about room shapes and layouts for rooms of one or more buildings (e.g., room shapes and locations of doors and windows and other wall openings in walls of the rooms), such as generated by the MIGM system; generated partial and/or complete floor plans and other associated mapping information 326 for one or more buildings (e.g., generated and saved 2.5D and/or 3D models, building and room dimensions for use with associated floor plans, additional images and/or annotation information, etc.), such as generated by the MIGM system; information 328 about guidance acquisition instructions provided to users and/or devices participating in the image acquisition process. such as generated by the ABIA system; optionally various types of user information 322 (e.g., about users participating in the image acquisition process, such as historical results, user attributes, user preferences and or supplied instructions regarding performing the generation process, associated priority information for use in the generation process, etc.); and/or various types of additional optional information 329 (e.g., various information related to presentation or other use of one or more building interiors or other environments captured by an ICA system and/or modeled by the MIGM system).

An embodiment of the ICA system 345 also executes in memory 330 of the mobile image acquisition computing device(s) 300 in the illustrated embodiment as part of the ABIA system in order to perform some of the described techniques, such as by using the processor(s) 305 to execute software instructions of the system 345 in a manner that configures the processor(s) 305 and computing device 300 to perform automated operations that implement those described techniques. The illustrated embodiment of the ICA system may include one or more components, not shown, to each perform portions of the functionality of the ICA system, and the system 345 may further, during its operation, store and/or retrieve various types of data on storage 320 (e.g., in one or more databases or other data structures), such as information 324 about acquired images and optionally associated acquisition metadata, and optionally other types of information that are not shown in this example (e.g., about ICA system operator users, additional images and/or annotation information, dimension/size information for one or more images, etc.).

In addition, an embodiment of the MIGM system 340 also executes in memory 330 of the mobile image acquisition computing device(s) 300 in the illustrated embodiment as part of the ABIA system in order to perform some of the described techniques, such as by using the processor(s) 305 to execute software instructions of the system 340 in a manner that configures the processor(s) 305 and computing device 300 to perform automated operations that implement those described techniques. The illustrated embodiment of the MIGM system may include one or more components, not shown, to each perform portions of the functionality of the MIGM system, and the MIGM system 340 may further, during its operation, store and/or retrieve various types of data on storage 320 (e.g., in one or more databases or other data structures), such as information 325 and 326 about generated floor plans and/or other generated building mapping information, and optionally other types of information that are not shown in this example (e.g., about MIGM system operator users, etc.). An embodiment of the MIGM system 389 may similarly execute in memory 387 of one or more server computing systems 380, whether instead of or in addition to MIGM system 340 on device 300, such as to similarly generate building floor plans and/or other mapping information 386 (e.g., similar to or the same as information 325 and 326), such as to generate a final completed building floor plan using images acquired by the ICA system 345 and/or information generated by the MIGM system 340 (e.g., one or more incremental partial building floor plans).

Some or all of the user computing devices 390 (e.g., mobile devices), optional other navigable devices 395 and other computing systems (not shown) may similarly include some or all of the same types of components illustrated for mobile computing device(s) 300. It will also be appreciated that computing systems and devices 300 and 380 and 390 and the other systems and devices included within FIG. 3 are merely illustrative and are not intended to limit the scope of the present invention. The systems and/or devices may instead each include multiple interacting computing systems or devices, and may be connected to other devices that are not specifically illustrated, including via Bluetooth communication or other direct communication, through one or more networks such as the Internet, via the Web, or via one or more private networks (e.g., mobile communication networks, etc.). More generally, a device or other computing system may comprise any combination of hardware that may interact and perform the described types of functionality, optionally when programmed or otherwise configured with particular software instructions and/or data structures, including without limitation desktop or other computers (e.g., tablets, slates, etc.), database servers, network storage devices and other network devices, smart phones and other cell phones, consumer electronics, wearable devices, digital music player devices, handheld gaming devices, PDAs, wireless phones, Internet appliances, and various other consumer products that include appropriate communication capabilities. In addition, the functionality provided by the illustrated ABIA system 350 and/or ICA system 345 and/or MIGM system 340 or 389 may in some embodiments be distributed in various components, some of the described functionality of the ABIA system and/or ICA system and/or MIGM system(s) may not be provided, and/or other additional functionality may be provided.

It will also be appreciated that, while various items are illustrated as being stored in memory or on storage while being used, these items or portions of them may be transferred between memory and other storage devices for purposes of memory management and data integrity. Alternatively, in other embodiments some or all of the software components and/or systems may execute in memory on another device and communicate with the illustrated computing systems via inter-computer communication. Thus, in some embodiments, some or all of the described techniques may be performed by hardware means that include one or more processors and/or memory and/or storage when configured by one or more software programs (e.g., by the ABIA system 350 executing on mobile computing device 300, by the ICA system 345, by the MIGM system(s) 340 and/or 389, etc.) and/or data structures, such as by execution of software instructions of the one or more software programs and/or by storage of such software instructions and/or data structures, and such as to perform algorithms as described in the flow charts and other disclosure herein. Furthermore, in some embodiments, some or all of the systems and/or components may be implemented or provided in other manners, such as consisting of one or more means that are implemented partially or fully in firmware and/or hardware (e.g., rather than as a means implemented in whole or in part by software instructions that configure a particular CPU or other processor), including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the components, systems and data structures may also be stored (e.g., as software instructions or structured data) on a non-transitory computer-readable storage medium, such as a hard disk or flash drive or other non-volatile storage device, volatile or non-volatile memory (e.g., RAM or flash RAM), a network storage device, or a portable media article (e.g., a DVD disk, a CD disk, an optical disk, a flash memory device, etc.) to be read by an appropriate drive or via an appropriate connection. The systems, components and data structures may also in some embodiments be transmitted via generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of the present disclosure may be practiced with other computer system configurations.

Figure 4:
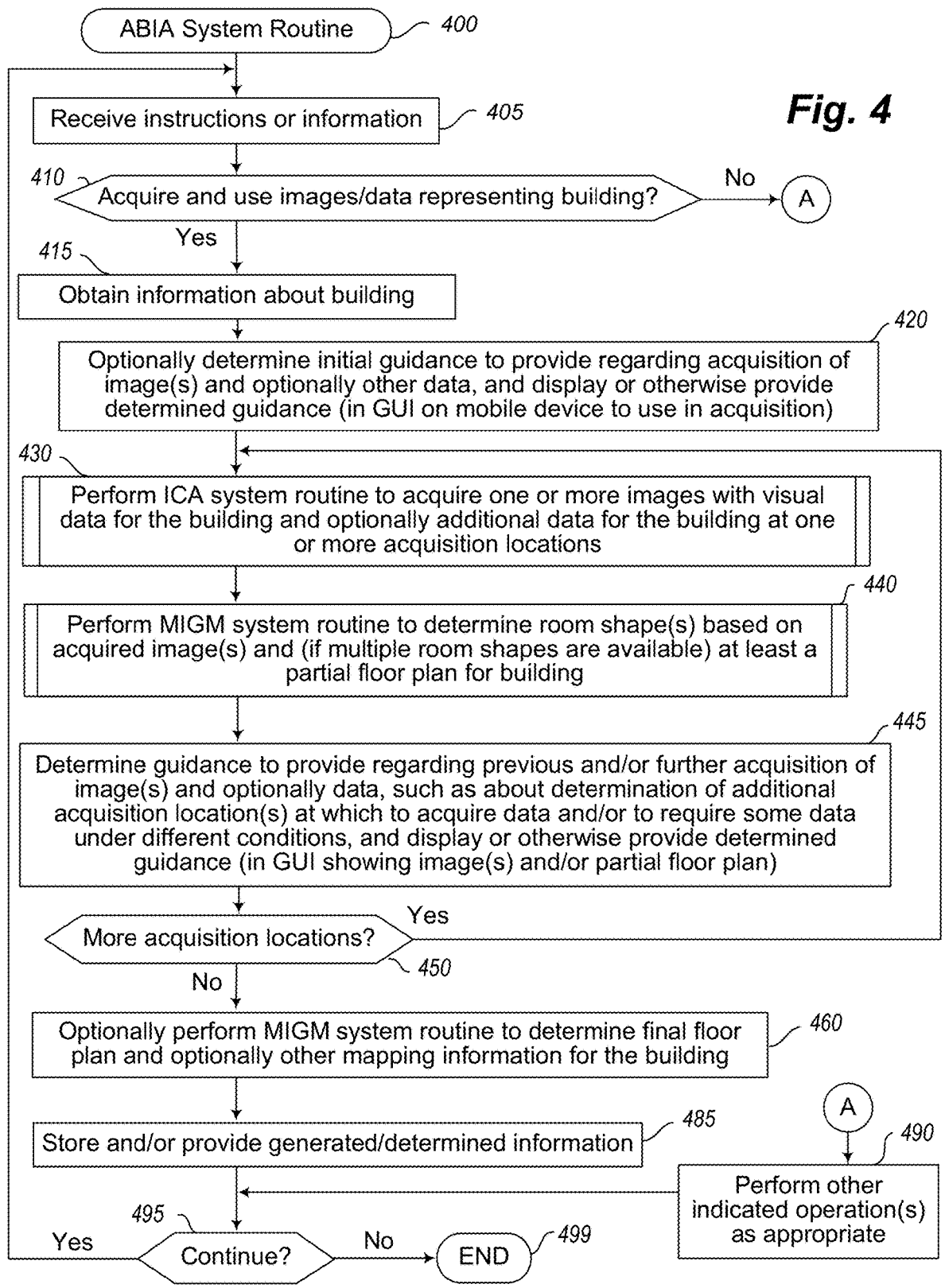
FIG. 4 illustrates an example embodiment of a flow diagram for an Automated Building Information Acquisition (ABIA) system routine in accordance with an embodiment of the present disclosure.

FIG. 4 illustrates an example embodiment of a flow diagram for an Automated Building Information Acquisition (ABIA) system routine 400. The routine may be performed by, for example, execution of the ABIA system 150 of FIG. 1, the ABIA system 350 of FIG. 3, and/or an ABIA system as described with respect to FIGS. 2A-2N and elsewhere herein, such as to analyze and assess building images and related generated building floor plan information to determine and provide guidance acquisition instructions related to further acquisition of additional images and/or other types of data. In the example of FIG. 4, images of a building (e.g., 360° panorama images) are acquired and assessed as part of an automated generation process of a floor plan for the building with that floor plan then provided for one or more subsequent uses, but in other embodiments, other types of information may be acquired and assessed (whether in addition to and/or instead of the images) and/or other types of mapping-related information may generated (whether in addition to and/or instead of the floor plan) and used in other manners, including for other types of structures and defined areas, as discussed elsewhere herein.

The illustrated embodiment of the routine begins at block 405, where information or instructions are received. The routine continues to block 410 to determine whether the information or instructions of block 405 indicate to acquire images and optionally other data representing a building and to perform associated assessments and determination of guidance acquisition instructions during the acquisition process, and if so continues to perform blocks 415-485, and otherwise continues to block 490. In block 415, the routine obtains information related to the building, such as information received in block 405 or retrieved from storage or other sources (e.g., data about the building, such as number and/or types of rooms, square footage, etc.; one or more external images; etc.), and optionally other information related to the data acquisition process for the building (e.g., about one or more users participating in the acquisition process, about resources available for the generation process, etc.). In block 420, the routine then optionally determines and provides initial guidance related to the image acquisition process (e.g., best practices as to how and where to acquire images and/or other data)—in at least some embodiments, the initial guidance is provided to the one or more users involved in the acquisition process via a displayed GUI, such as on a mobile image acquisition computing device or on another mobile device associated with a camera device that will acquire the images. After block 420, the routine continues to block 430, where it initiates performance of an ICA system routine to acquire one or more images at the building (e.g., within an interior of the building, such as in one or more first rooms of the building) and optionally associated additional data (e.g., audio, acquisition metadata, etc.), optionally supplying information about one or more additional acquisition locations at which to acquire one or more images or other guidance acquisition instructions (e.g., as determined in block 445 before returning to block 430), and returns the acquired image(s) and any other acquired data and optionally any image-related assessments performed by the ICA system—one example of a routine for the ICA system is illustrated further with respect to FIG. 5. After block 430, the routine continues to block 440, where it performs an MIGM system routine to generate at least a partial floor plan for the building that is based at least in part on visual data of the one or more acquired images, and returns the partial floor plan (if generated) and optionally any floor plan-related assessments performed by the MIGM system (e.g., uncertainties associated with determined room shapes).

After block 440, the routine continues to block 445, where it determines guidance acquisition instructions to provide based on the assessments performed in block 440 and optionally in block 430, such as related to one or more additional acquisition locations at which to acquire one or more additional images and/or other data, or that no additional acquisition of images and/or other data is needed (e.g., if images and/or other data for a last acquisition location have been acquired that enable the most recent generated building floor plan to cover all of the building and optionally surroundings, and to optionally be used as a final complete building floor plan), and provides the determined guidance acquisition instructions (if any) to one or more users associated with the acquisition process (e.g., via a displayed GUI), such as to optionally display a partial building floor plan with initial estimated room shapes from block 440 and/or some or all of the acquired image(s) from block 430 along with the guidance acquisition instructions (e.g., with the guidance acquisition instructions overlaid in part or in whole on the displayed partial building floor plan and/or displayed images). After block 445, the routine continues to block 450, where it determines whether there are more acquisition locations at which to acquire images for the building (e.g., based at least in part on the determined guidance acquisition instructions), and if so returns to block 430 to acquire one or more additional images.

If it is instead determined in block 450 that there are not additional acquisition locations at which to acquire additional images and/or other data for the building, the routine continues to block 460, where it optionally performs the MIGM system routine to determine a final floor plan and optionally other mapping information for the building (e.g., if a final floor plan was not determined in block 440 during a last iteration of the blocks 415-445), as well as to optionally display the final floor plan to the one or more users associated with the acquisition process (e.g., via a displayed GUI). After block 460, the routine continues to block 485, where it stores the information that is determined, generated and assessed with respect to blocks 415-460, and optionally provides some or all of the information (e.g., the generated final floor plan and/or other mapping information for the building) to one or more recipients for further use.

If it was instead determined in block 410 that the instructions or other information received in block 405 were not to acquire and assess data representing a building, the routine continues instead to block 490, where it performs one or more other indicated operations as appropriate. Non-exclusive examples of such other indicated operations include one or more of the following: to configure parameters to be used in various operations of the system (e.g., based at least in part on information specified by a user of the system, such as an operator user of the ABIA system, a user of a mobile device who acquires images for one or more building interiors and/or specifies preferences and/or settings to use for those acquisition and assessment processes, etc.), to respond to requests for generated and stored information (e.g., for previously generated floor plans and/or other building mapping information, for previously determined guidance acquisition instructions, etc.), to obtain and store other information about users of the system, to perform any housekeeping tasks, etc.

Following blocks 485 or 490, the routine proceeds to block 495 to determine whether to continue, such as until an explicit indication to terminate is received, or instead only if an explicit indication to continue is received. If it is determined to continue, the routine returns to block 405 to await additional instructions or information, and if not proceeds to block 499 and ends.

While the routine 400 may in some embodiments operate in a synchronous manner (e.g., waiting at blocks 430 and/or 440 to receive responses from the ICA and/or MIGM systems, respectively), in other embodiments the routine 400 may operate in an asynchronous manner, such as by performing other processing activities (e.g., responding to other instructions or information received at block 405) while waiting at blocks 430 and/or 440 or otherwise while performing other processing. In addition, while not illustrated with respect to the automated operations shown in the example embodiment of FIG. 4, in some embodiments human users may further assist in facilitating some of the operations of the ABIA system, such as for operator users and/or end users of the ABIA system to provide input of one or more types that is further used in subsequent automated operations, as discussed elsewhere herein.

Figure 5:
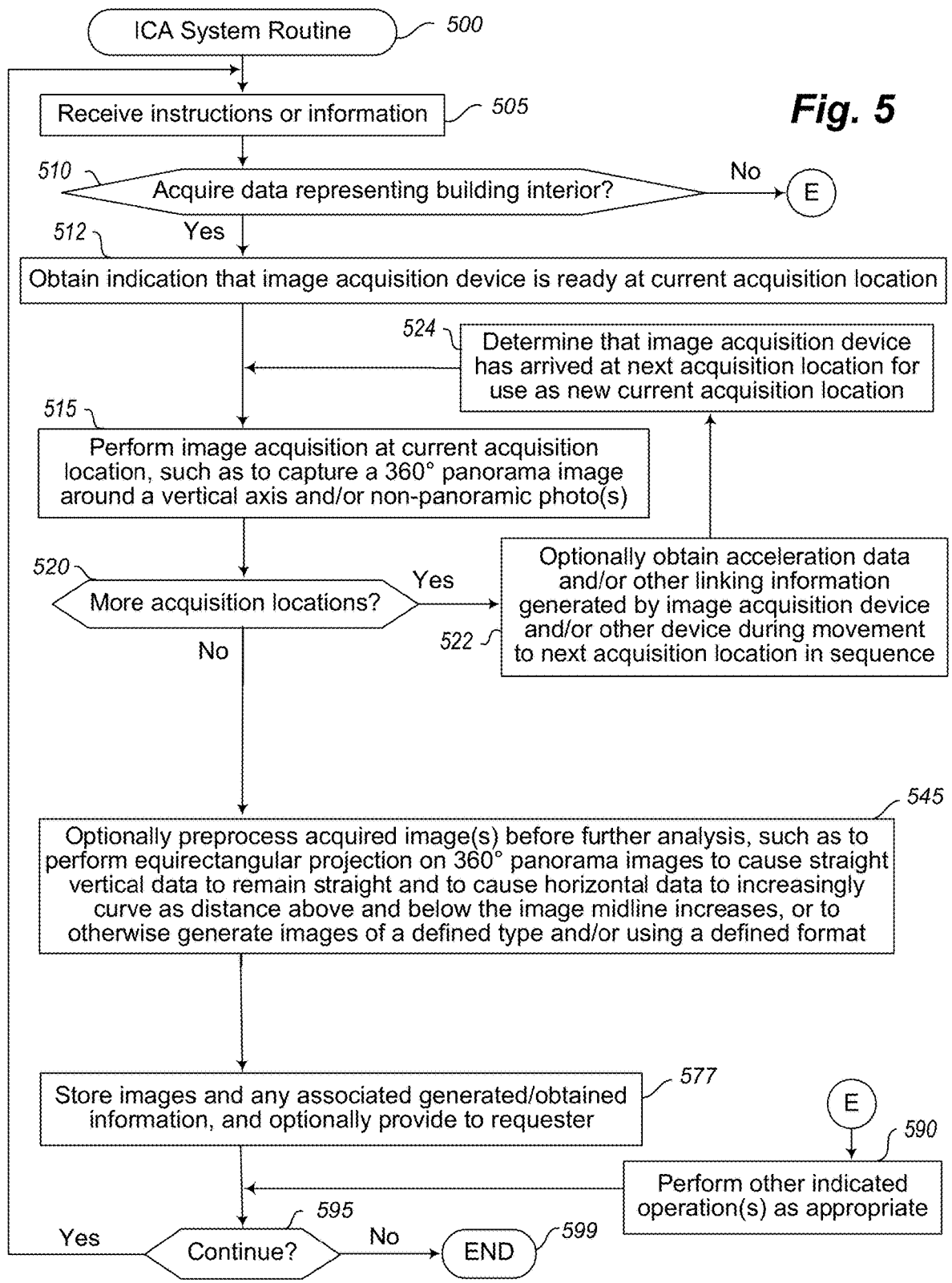
FIG. 5 illustrates an example embodiment of a flow diagram for an Image Capture and Analysis (ICA) system routine in accordance with an embodiment of the present disclosure.

FIG. 5 illustrates an example flow diagram of an embodiment of an ICA (Image Capture & Analysis) system routine 500. The routine may be performed by, for example, the ICA system 160 of FIG. 1, the ICA system 345 of FIG. 3, and/or an ICA system as described with respect to FIGS. 2A-2N and elsewhere herein, such as to acquire 360° panorama images and/or other images at acquisition locations within buildings or other structures, such as for use in subsequent generation of related floor plans and/or other mapping information. While portions of the example routine 500 are discussed with respect to acquiring particular types of images at particular acquisition locations, it will be appreciated that this or a similar routine may be used to acquire video (with video frame images) or other data (e.g., audio), whether instead of or in addition to such panorama images or other still images. In addition, while the illustrated embodiment acquires and uses information from the interior of a target building, it will be appreciated that other embodiments may perform similar techniques for other types of data, including for non-building structures and/or for information external to one or more target buildings of interest. Furthermore, some or all of the routine may be executed on a mobile device used by a user to acquire image information, and/or by a system remote from such a mobile device. In at least some embodiments, the routine 500 may be invoked from block 430 of routine 400 of FIG. 4, with corresponding information from routine 500 provided to routine 400 as part of implementation of that block 430, and with processing control returned to routine 400 after blocks 577 and/or 599 in such situations—in other embodiments, the routine 400 may proceed with additional operations in an asynchronous manner without waiting for such processing control to be returned (e.g., to proceed with other processing activities while waiting for the corresponding information from the routine 500 to be provided to routine 400).

The illustrated embodiment of the routine begins at block 505, where instructions or information are received. At block 510, the routine determines whether the received instructions or information indicate to acquire visual data and/or other data representing a building interior (optionally in accordance with supplied information about one or more additional acquisition locations and/or other guidance acquisition instructions), and if not continues to block 590. Otherwise, the routine proceeds to block 512 to receive an indication to begin the image acquisition process at a first acquisition location (e.g., from a user of a mobile image acquisition device that will perform the acquisition process). After block 512, the routine proceeds to block 515 in order to perform acquisition location image acquisition activities for acquiring a 360° panorama image for the acquisition location in the interior of the target building of interest, such as via one or more fisheye lenses and/or non-fisheye rectilinear lenses on the mobile device and to provide horizontal coverage of at least 360° around a vertical axis, although in other embodiments other types of images and/or other types of data may be acquired. As one non-exclusive example, the mobile image acquisition device may be a rotating (scanning) panorama camera equipped with a fisheye lens (e.g., with 180° degrees of horizontal coverage) and/or other lens (e.g., with less than 180° degrees of horizontal coverage, such as a regular lens or wide-angle lens or ultrawide lens). The routine may also optionally obtain annotation and/or other information from the user regarding the acquisition location and/or the surrounding environment, such as for later use in presentation of information regarding that acquisition location and/or surrounding environment.

After block 515 is completed, the routine continues to block 520 to determine if there are more acquisition locations at which to acquire images, such as based on corresponding information provided by the user of the mobile device and/or received in block 505—in some embodiments, the ICA routine will acquire only a single image and then proceed to block 577 to provide that image and corresponding information (e.g., to return the image and corresponding information to the ABIA system and/or MIGM system for further use before receiving additional instructions or information to acquire one or more next images at one or more next acquisition locations). If there are more acquisition locations at which to acquire additional images at the current time, when the user is ready to continue the process, the routine continues to block 522 to optionally initiate the capture of linking information (e.g., acceleration data) during movement of the mobile device along a travel path away from the current acquisition location and towards a next acquisition location within the building interior. The captured linking information may include additional sensor data (e.g., from one or more IMU, or inertial measurement units, on the mobile device or otherwise carried by the user) and/or additional visual information (e.g., images, video, etc.) recorded during such movement. Initiating the capture of such linking information may be performed in response to an explicit indication from a user of the mobile device or based on one or more automated analyses of information recorded from the mobile device. In addition, the routine may further optionally monitor the motion of the mobile device in some embodiments during movement to the next acquisition location, and provide one or more guidance cues to the user regarding the motion of the mobile device, quality of the sensor data and/or visual information being captured, associated lighting/environmental conditions, advisability of capturing a next acquisition location, and any other suitable aspects of capturing the linking information. Similarly, the routine may optionally obtain annotation and/or other information from the user regarding the travel path, such as for later use in presentation of information regarding that travel path or a resulting inter-panorama image connection link. In block 524, the routine determines that the mobile device has arrived at the next acquisition location (e.g., based on an indication from the user, based on the forward movement of the user stopping for at least a predefined amount of time, etc.), for use as the new current acquisition location, and returns to block 515 in order to perform the acquisition location image acquisition activities for the new current acquisition location.

Figure 6A:
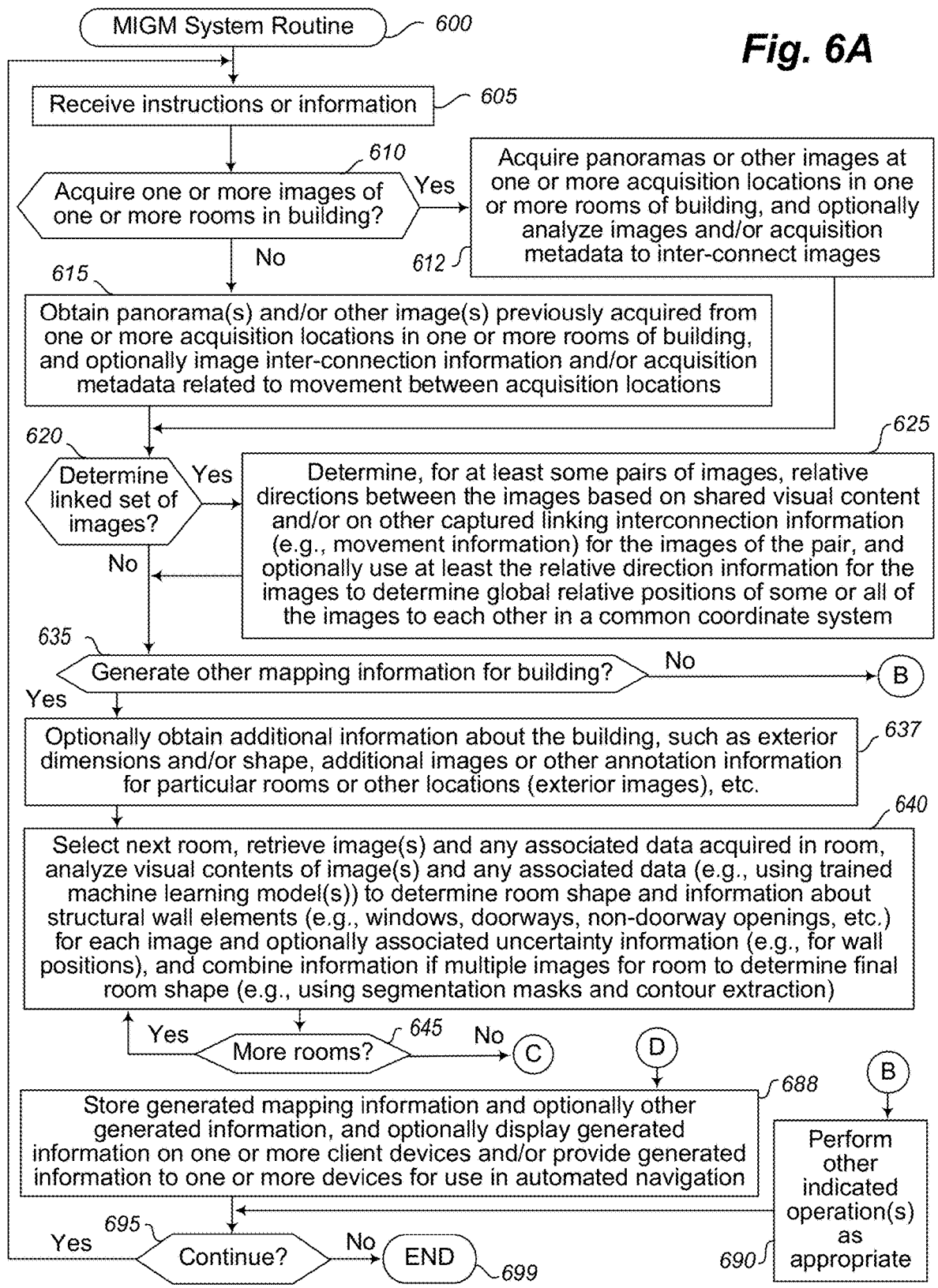
FIGS. 6A-6B illustrate an example embodiment of a flow diagram for a Mapping Information Generation Manager (MIGM) system routine in accordance with an embodiment of the present disclosure.
Figure 6B:
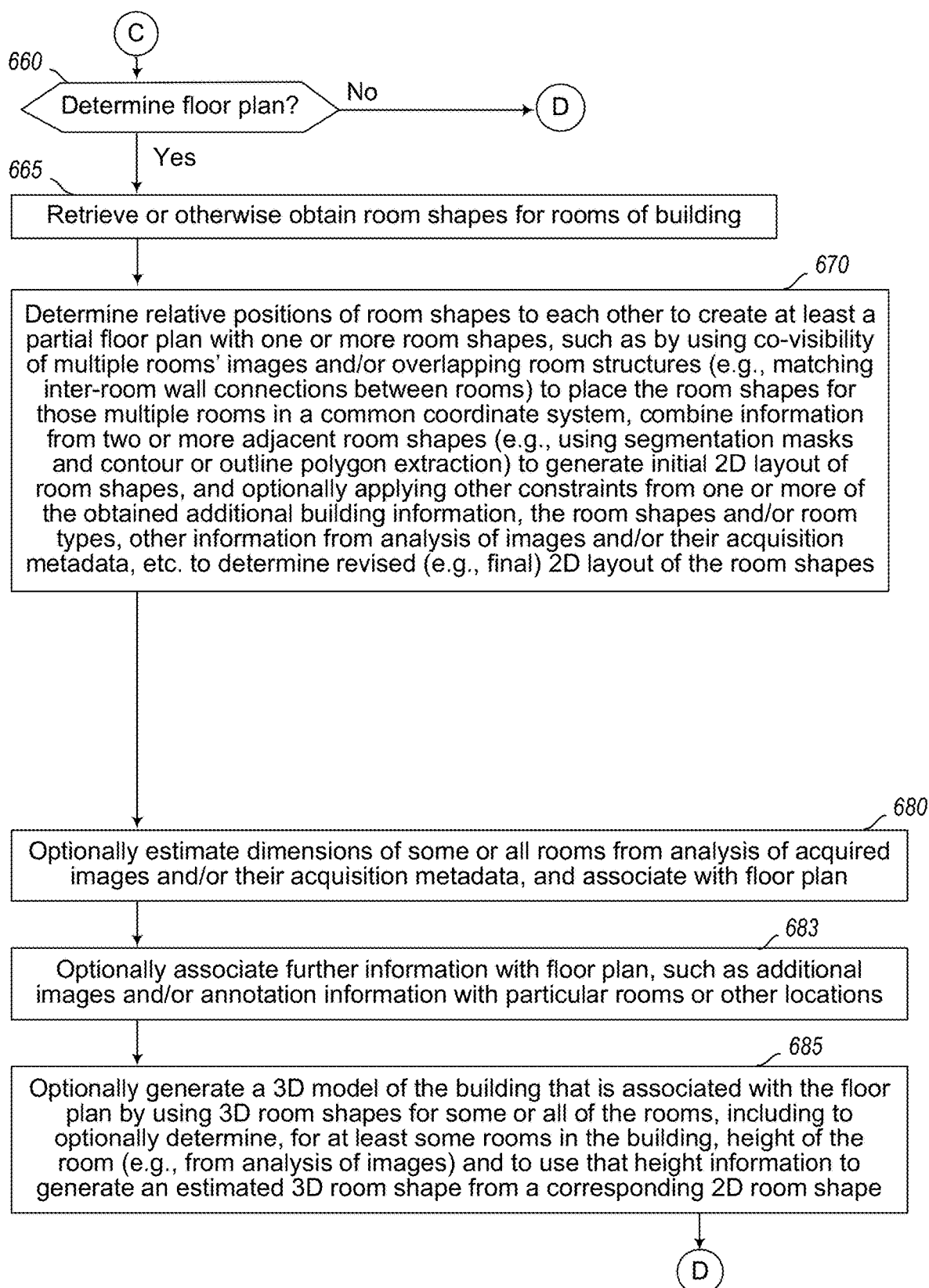

If it is instead determined in block 520 that there are not any more acquisition locations at which to acquire image information for the current building or other structure at the current time, the routine proceeds to block 545 to optionally preprocess the acquired 360° panorama images before their subsequent use for generating related mapping information, such as to produce images of a particular type and/or in a particular format (e.g., to perform an equirectangular projection for each such image, with straight vertical data such as the sides of a typical rectangular door frame or a typical border between 2 adjacent walls remaining straight, and with straight horizontal data such as the top of a typical rectangular door frame or a border between a wall and a floor remaining straight at a horizontal midline of the image but being increasingly curved in the equirectangular projection image in a convex manner relative to the horizontal midline as the distance increases in the image from the horizontal midline). In block 577, the images and any associated generated or obtained information is stored for later use, and optionally provided to one or more recipients (e.g., to block 430 of routine 400 if invoked from that block). FIGS. 6A-6B illustrate one example of a routine for generating a floor plan representation of a building interior from the generated panorama information.

If it is instead determined in block 510 that the instructions or other information received in block 505 are not to acquire images and other data representing a building interior, the routine continues instead to block 590 to perform any other indicated operations as appropriate, such as to configure parameters to be used in various operations of the system (e.g., based at least in part on information specified by a user of the system, such as a user of a mobile device who captures one or more building interiors, an operator user of the ICA system, etc.), to respond to requests for generated and stored information (e.g., to identify one or more groups of inter-connected linked panorama images each representing a building or part of a building that match one or more specified search criteria, one or more panorama images that match one or more specified search criteria, etc.), to generate and store inter-panorama image connections between panorama images for a building or other structure (e.g., for each panorama image, to determine directions within that panorama image toward one or more other acquisition locations of one or more other panorama images, such as to enable later display of an arrow or other visual representation with a panorama image for each such determined direction from the panorama image to enable an end-user to select one of the displayed visual representations to switch to a display of the other panorama image at the other acquisition location to which the selected visual representation corresponds), to obtain and store other information about users of the system, to perform any housekeeping tasks, etc.

Following blocks 577 or 590, the routine proceeds to block 595 to determine whether to continue, such as until an explicit indication to terminate is received, or instead only if an explicit indication to continue is received. If it is determined to continue, the routine returns to block 505 to await additional instructions or information, and if not proceeds to step 599 and ends.

FIGS. 6A-6B illustrate an example embodiment of a flow diagram for a MIGM (Mapping Information Generation Manager) system routine 600. The routine may be performed by, for example, execution of the MIGM system 140 of FIG. 1, the MIGM system 340 of FIG. 3, and/or a MIGM system as described with respect to FIGS. 2A-2N and elsewhere herein, such as to determine a room shape for a room (or other defined area) by analyzing information from one or more images acquired in the room (e.g., one or more 360° panorama images), to generate a partial or complete floor plan for a building or other defined area based at least in part on one or more images of the area and optionally additional data captured by a mobile computing device, and/or to generate other mapping information for a building or other defined area based at least in part on one or more images of the area and optionally additional data captured by a mobile computing device. In the example of FIGS. 6A-6B, the determined room shape for a room may be a 2D room shape to represent the locations of the walls of the room or a 3D fully closed combination of planar surfaces to represent the locations of walls and ceiling and floor of the room, and the generated mapping information for a building (e.g., a house) may include a 2D floor plan and/or 3D computer model floor plan, but in other embodiments, other types of room shapes and/or mapping information may be generated and used in other manners, including for other types of structures and defined areas, as discussed elsewhere herein. In at least some embodiments, the routine 600 may be invoked from block 440 of routine 400 of FIG. 4, with corresponding information from routine 600 provided to routine 400 as part of implementation of that block 440, and with processing control returned to routine 400 after blocks 688 and/or 699 in such situations—in other embodiments, the routine 400 may proceed with additional operations in an asynchronous manner without waiting for such processing control to be returned (e.g., to proceed to block 445 once the corresponding information from routine 600 is provided to routine 400, to proceed with other processing activities while waiting for the corresponding information from the routine 600 to be provided to routine 400, etc.).

The illustrated embodiment of the routine begins at block 605, where information or instructions are received. The routine continues to block 610 to determine whether image information is already available to be analyzed for one or more rooms (e.g., for some or all of an indicated building, such as based on one or more such images received in block 605 as previously generated by the ICA routine), or if such image information instead is to be currently acquired. If it is determined in block 610 to currently acquire some or all of the image information, the routine continues to block 612 to acquire such information, optionally waiting for one or more users or devices to move throughout one or more rooms of a building and acquire panoramas or other images at one or more acquisition locations in one or more of the rooms (e.g., at multiple acquisition locations in each room of the building), optionally along with metadata information regarding the acquisition and/or interconnection information related to movement between acquisition locations, as discussed in greater detail elsewhere herein—implementation of block 612 may, for example, include invoking an ICA system routine to perform such activities, with FIG. 5 providing one example embodiment of an ICA system routine for performing such image acquisition. If it is instead determined in block 610 not to currently acquire the images, the routine continues instead to block 615 to obtain one or more existing panoramas or other images from one or more acquisition locations in one or more rooms (e.g., multiple images acquired at multiple acquisition locations that include at least one image and acquisition location in each room of a building), optionally along with metadata information regarding the acquisition and/or interconnection information related to movement between the acquisition locations, such as may in some situations have been supplied in block 605 along with the corresponding instructions.

After blocks 612 or 615, the routine continues to block 620, where it determines whether to generate mapping information that includes a linked set of target panorama images (or other images) for a building or other group of rooms (referred to at times as a 'virtual tour', such as to enable an end user to move from any one of the images of the linked set to one or more other images to which that starting current image is linked, including in some embodiments via selection of a user-selectable control for each such other linked image that is displayed along with a current image, optionally by overlaying visual representations of such user-selectable controls and corresponding inter-image directions on the visual data of the current image, and to similarly move from that next image to one or more additional images to which that next image is linked, etc.), and if so continues to block 625. The routine in block 625 selects pairs of at least some of the images (e.g., based on the images of a pair having overlapping visual content), and determines, for each pair, relative directions between the images of the pair based on shared visual content and/or on other captured linking interconnection information (e.g., movement information) related to the images of the pair (whether movement directly from the acquisition location for one image of a pair to the acquisition location of another image of the pair, or instead movement between those starting and ending acquisition locations via one or more other intermediary acquisition locations of other images). The routine in block 625 may further optionally use at least the relative direction information for the pairs of images to determine global relative positions of some or all of the images to each other in a common coordinate system, and/or generate the inter-image links and corresponding user-selectable controls as noted above. Additional details are included elsewhere herein regarding creating such a linked set of images.

After block 625, or if it is instead determined in block 620 that the instructions or other information received in block 605 are not to determine a linked set of images, the routine continues to block 635 to determine whether the instructions received in block 605 indicate to generate other mapping information for an indicated building (e.g., a floor plan), and if so the routine continues to perform blocks 637-685 to do so, and otherwise continues to block 690.

In block 637, the routine optionally obtains additional information about the building, such as from activities performed during acquisition and optionally analysis of the images, and/or from one or more external sources (e.g., online databases, information provided by one or more end users, etc.)—such additional information may include, for example, exterior dimensions and/or shape of the building, additional images and/or annotation information acquired corresponding to particular locations external to the building (e.g., surrounding the building and/or for other structures on the same property, from one or more overhead locations, etc.), additional images and/or annotation information acquired corresponding to particular locations within the building (optionally for locations different from acquisition locations of the acquired panorama or other images), etc.

After block 637, the routine continues to block 645 to select the next room (beginning with the first) for which one or more images (e.g., 360° panorama images) acquired in the room are available, and to analyze the visual data of the image(s) for the room to determine a room shape (e.g., by determining at least wall locations), optionally along with determining uncertainty information about walls and/or other parts of the room shape, and optionally including identifying other wall and floor and ceiling elements (e.g., wall structural elements/features, such as windows, doorways and stairways and other inter-room wall openings and connecting passages, wall borders between a wall and another wall and/or receiving and/or a floor, etc.) and their positions within the determined room shape of the room. In some embodiments, the room shape determination may include using boundaries of the walls with each other and at least one of the floor or ceiling to determine a 2D room shape (e.g., using one or trained machine learning models), while in other embodiments the room shape determination may be performed in other manners (e.g., by generating a 3D point cloud of some or all of the room walls and optionally the ceiling and/or floor, such as by analyzing at least visual data of the panorama image and optionally additional data captured by an image acquisition device or associated mobile computing device, optionally using one or more of SfM (Structure from Motion) or SLAM (Simultaneous Location And Mapping) or MVS (Multi-View Stereo) analysis). In addition, the activities of block 645 may further optionally determine and use initial pose information for each of those panorama images (e.g., as supplied with acquisition metadata for the panorama image), and/or obtain and use additional metadata for each panorama image (e.g., acquisition height information of the camera device or other image acquisition device used to acquire a panorama image relative to the floor and/or the ceiling). Additional details are included elsewhere herein regarding determining room shapes and identifying additional information for the rooms. After block 640, the routine continues to block 645, where it determines whether there are more rooms for which to determine room shapes based on images acquired in those rooms, and if so returns to block 640 to select the next such room for which to determine a room shape.

If it is instead determined in block 645 that there are not more rooms for which to generate room shapes, the routine continues to block 660 to determine whether to further generate at least a partial floor plan for the building (e.g., based at least in part on the determined room shape(s) from block 645, and optionally further information regarding how to position the determined room shapes relative to each other). If not, such as when determining only one or more room shapes without generating further mapping information for a building (e.g., to determine the room shape for a single room based on one or more images acquired in the room by the ICA system), the routine continues to block 688. Otherwise, the routine continues to block 665 to retrieve one or more room shapes (e.g., room shapes generated in block 645) or otherwise obtain one or more room shapes (e.g., based on human-supplied input) for rooms of the building, whether 2D or 3D room shapes, and then continues to block 670. In block 670, the routine uses the one or more room shapes to create an initial floor plan (e.g., an initial 2D floor plan using 2D room shapes and/or an initial 3D floor plan using 3D room shapes), such as a partial floor plan that includes one or more room shapes but less than all room shapes for the building, or a complete floor plan that includes all room shapes for the building. If there are multiple room shapes, the routine in block 670 further determines positioning of the room shapes relative to each other, such as by using visual overlap between images from multiple acquisition locations to determine relative positions of those acquisition locations and of the room shapes surrounding those acquisition locations, and/or by using other types of information (e.g., using connecting inter-room passages between rooms, optionally applying one or more constraints or optimizations, etc.). In at least some embodiments, the routine in block 670 further refines some or all of the room shapes by generating a binary segmentation mask that covers the relatively positioned room shape(s), extracting a polygon representing the outline or contour of the segmentation mask, and separating the polygon into the refined room shape(s). Such a floor plan may include, for example, relative position and shape information for the various rooms without providing any actual dimension information for the individual rooms or building as a whole, and may further include multiple linked or associated sub-maps (e.g., to reflect different stories, levels, sections, etc.) of the building. The routine further optionally associates positions of the doors, wall openings and other identified wall elements on the floor plan.

After block 670, the routine optionally performs one or more steps 680-683 to determine and associate additional information with the floor plan. In block 680, the routine optionally estimates the dimensions of some or all of the rooms, such as from analysis of images and/or their acquisition metadata or from overall dimension information obtained for the exterior of the building, and associates the estimated dimensions with the floor plan—it will be appreciated that if sufficiently detailed dimension information were available, architectural drawings, blueprints, etc. may be generated from the floor plan. After block 680, the routine continues to block 683 to optionally associate further information with the floor plan (e.g., with particular rooms or other locations within the building), such as additional existing images with specified positions and/or annotation information. In block 685, if the room shapes from block 645 are not 3D room shapes, the routine further estimates heights of walls in some or all rooms, such as from analysis of images and optionally sizes of known objects in the images, as well as height information about a camera when the images were acquired, and uses that height information to generate 3D room shapes for the rooms. The routine further optionally uses the 3D room shapes (whether from block 645 or block 685) to generate a 3D computer model floor plan of the building, with the 2D and 3D floor plans being associated with each other—in other embodiments, only a 3D computer model floor plan may be generated and used (including to provide a visual representation of a 2D floor plan if so desired by using a horizontal slice of the 3D computer model floor plan).

After block 685, or if it is instead determined in block 660 not to determine a floor plan, the routine continues to block 688 to store the determined room shape(s) and/or generated mapping information and/or other generated information, to optionally provide some or all of that information to one or more recipients (e.g., to block 440 of routine 400 if invoked from that block), and to optionally further use some or all of the determined and generated information, such as to provide the generated 2D floor plan and/or 3D computer model floor plan for display on one or more client devices and/or to one or more other devices for use in automating navigation of those devices and/or associated vehicles or other entities, to similarly provide and use information about determined room shapes and/or a linked set of panorama images and/or about additional information determined about contents of rooms and/or passages between rooms, etc.

If it is instead determined in block 635 that the information or instructions received in block 605 are not to generate mapping information for an indicated building, the routine continues instead to block 690 to perform one or more other indicated operations as appropriate. Such other operations may include, for example, receiving and responding to requests for previously generated floor plans and/or previously determined room shapes and/or other generated information (e.g., requests for such information for display on one or more client devices, requests for such information to provide it to one or more other devices for use in automated navigation, etc.), obtaining and storing information about buildings for use in later operations (e.g., information about dimensions, numbers or types of rooms, total square footage, adjacent or nearby other buildings, adjacent or nearby vegetation, exterior images, etc.), etc.

After blocks 688 or 690, the routine continues to block 695 to determine whether to continue, such as until an explicit indication to terminate is received, or instead only if an explicit indication to continue is received. If it is determined to continue, the routine returns to block 605 to wait for and receive additional instructions or information, and otherwise continues to block 699 and ends.

While not illustrated with respect to the automated operations shown in the example embodiment of FIGS. 6A-6B, in some embodiments human users may further assist in facilitating some of the operations of the MIGM system, such as for operator users and/or end users of the MIGM system to provide input of one or more types that is further used in subsequent automated operations. As non-exclusive examples, such human users may provide input of one or more types as follows: to provide input to assist with the linking of a set of images, such as to provide input in block 625 that is used as part of the automated operations for that block (e.g., to specify or adjust initial automatically determined directions between one or more pairs of images, to specify or adjust initial automatically determined final global positions of some or all of the images relative to each other, etc.); to provide input in block 637 that is used as part of subsequent automated operations, such as one or more of the illustrated types of information about the building; to provide input with respect to block 640 that is used as part of subsequent automated operations, such as to specify or adjust initial automatically determined element locations and/or estimated room shapes and/or to manually combine information from multiple estimated room shapes for a room (e.g., separate room shape estimates from different images acquired in the room) to create a final room shape for the room and/or to specify or adjust initial automatically determined information about a final room shape, etc.; to provide input with respect to block 670, that is used as part of subsequent operations, such as to specify or adjust initial automatically determined positions of room shapes within a floor plan being generated and/or to specify or adjust initial automatically determined room shapes themselves within such a floor plan; to provide input with respect to one or more of blocks 680 and 683 and 685 that is used as part of subsequent operations, such as to specify or adjust initial automatically determined information of one or more types discussed with respect to those blocks; and/or to specify or adjust initial automatically determined pose information (whether initial pose information or subsequent updated pose information) for one or more of the panorama images; etc. Additional details are included elsewhere herein regarding embodiments in which one or more human users provide input that is further used in additional automated operations of the ABIA system.

FIG. 7 illustrates an example embodiment of a flow diagram for a Building Information Access system routine 700. The routine may be performed by, for example, execution of a building information access client computing device 175 and its software system(s) (not shown) of FIG. 1, a client computing device 390 of FIG. 3, and/or a mapping information access viewer or presentation system as described elsewhere herein, such as to receive and display generated floor plans and/or other mapping information (e.g., determined room structural layouts/shapes, etc.) for a defined area that optionally includes visual indications of one or more determined image acquisition locations, to obtain and display information about images matching one or more indicated target images, to display additional information (e.g., images) associated with particular acquisition locations in the mapping information, to obtain and display guidance acquisition instructions provided by the ABIA system and/or other sources (e.g., with respect to other images acquired during that acquisition session and/or for an associated building, such as part of a displayed GUI), etc. In the example of FIG. 7, the presented mapping information is for a building (such as an interior of a house), but in other embodiments, other types of mapping information may be presented for other types of buildings or environments and used in other manners, as discussed elsewhere herein.

The illustrated embodiment of the routine begins at block 705, where instructions or information are received. At block 710, the routine determines whether the received instructions or information in block 705 are to display determined information for one or more target buildings, and if so continues to block 715 to determine whether the received instructions or information in block 705 are to select one or more target buildings using specified criteria, and if not continues to block 720 to obtain an indication of a target building to use from the user (e.g., based on a current user selection, such as from a displayed list or other user selection mechanism; based on information received in block 705; etc.). Otherwise, if it is determined in block 715 to select one or more target buildings from specified criteria, the routine continues instead to block 725, where it obtains indications of one or more search criteria to use, such as from current user selections or as indicated in the information or instructions received in block 705, and then searches stored information about buildings to determine one or more of the buildings that satisfy the search criteria. In the illustrated embodiment, the routine then further selects a best match target building from the one or more returned buildings (e.g., the returned other building with the highest similarity or other matching rating for the specified criteria, or using another selection technique indicated in the instructions or other information received in block 705), while in other embodiments the routine may instead present multiple candidate buildings that satisfy the search criteria (e.g., in a ranked order based on degree of match) and receives a user selection of the target building from the multiple candidates.

After blocks 720 or 725, the routine continues to block 735 to retrieve a floor plan for the target building and/or other generated mapping information for the building, and optionally indications of associated linked information for the building interior and/or a surrounding location external to the building, and selects an initial view of the retrieved information (e.g., a view of the floor plan, a particular room shape, etc.). In block 740, the routine then displays or otherwise presents the current view of the retrieved information, and waits in block 745 for a user selection. After a user selection in block 745, if it is determined in block 750 that the user selection corresponds to adjusting the current view for the current target building (e.g., to change one or more aspects of the current view), the routine continues to block 755 to update the current view in accordance with the user selection, and then returns to block 740 to update the displayed or otherwise presented information accordingly. The user selection and corresponding updating of the current view may include, for example, displaying or otherwise presenting a piece of associated linked information that the user selects (e.g., a particular image associated with a displayed visual indication of a determined acquisition location, such as to overlay the associated linked information over at least some of the previous display), and/or changing how the current view is displayed (e.g., zooming in or out; rotating information if appropriate; selecting a new portion of the floor plan to be displayed or otherwise presented, such as with some or all of the new portion not being previously visible, or instead with the new portion being a subset of the previously visible information; etc.). If it is instead determined in block 750 that the user selection is not to display further information for the current target building (e.g., to display information for another building, to end the current display operations, etc.), the routine continues instead to block 795, and returns to block 705 to perform operations for the user selection if the user selection involves such further operations.

If it is instead determined in block 710 that the instructions or other information received in block 705 are not to present information representing a building, the routine continues instead to block 760 to determine whether the instructions or other information received in block 705 correspond to identifying other images (if any) corresponding to one or more indicated target images, and if so continues to blocks 765-770 to perform such activities. In particular, the routine in block 765 receives the indications of the one or more target images for the matching (such as from information received in block 705 or based on one or more current interactions with a user) along with one or more matching criteria (e.g., an amount of visual overlap), and in block 770 identifies one or more other images (if any) that match the indicated target image(s), such as by interacting with the ICA and/or MIGM systems to obtain the other image(s). The routine then displays or otherwise provides information in block 770 about the identified other image(s), such as to provide information about them as part of search results, to display one or more of the identified other image(s), etc. If it is instead determined in block 760 that the instructions or other information received in block 705 are not to identify other images corresponding to one or more indicated target images, the routine continues instead to block 775 to determine whether the instructions or other information received in block 705 correspond to obtaining and providing guidance acquisition instructions during an image acquisition session with respect to one or more indicated target images (e.g., a most recently acquired image), and if so continues to block 780, and otherwise continues to block 790. In block 780, the routine obtains information about guidance acquisition instructions of one or more types, such as by interacting with the ABIA system, and displays or otherwise provides information in block 780 about the guidance acquisition instructions, such as by overlaying the guidance acquisition instructions on a partial floor plan and/or recently acquired image in manners discussed in greater detail elsewhere herein.

In block 790, the routine continues instead to perform other indicated operations as appropriate, such as to configure parameters to be used in various operations of the system (e.g., based at least in part on information specified by a user of the system, such as a user of a mobile device who acquires one or more building interiors, an operator user of the ABIA and/or MIGM systems, etc., including for use in personalizing information display for a particular user in accordance with his/her preferences), to obtain and store other information about users of the system, to respond to requests for generated and stored information, to perform any housekeeping tasks, etc.

Following blocks 770 or 780 or 790, or if it is determined in block 750 that the user selection does not correspond to the current building, the routine proceeds to block 795 to determine whether to continue, such as until an explicit indication to terminate is received, or instead only if an explicit indication to continue is received. If it is determined to continue (including if the user made a selection in block 745 related to a new building to present), the routine returns to block 705 to await additional instructions or information (or to continue directly on to block 735 if the user made a selection in block 745 related to a new building to present), and if not proceeds to step 799 and ends.

Aspects of the present disclosure are described herein with reference to flowchart illustrations and/or block diagrams of methods, apparatus (systems), and computer program products according to embodiments of the present disclosure. It will be appreciated that each block of the flowchart illustrations and/or block diagrams, and combinations of blocks in the flowchart illustrations and/or block diagrams, can be implemented by computer readable program instructions. It will be further appreciated that in some implementations the functionality provided by the routines discussed above may be provided in alternative ways, such as being split among more routines or consolidated into fewer routines. Similarly, in some implementations illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel, or synchronous or asynchronous) and/or in a particular order, in other implementations the operations may be performed in other orders and in other manners. Any data structures discussed above may also be structured in different manners, such as by having a single data structure split into multiple data structures and/or by having multiple data structures consolidated into a single data structure. Similarly, in some implementations illustrated data structures may store more or less information than is described, such as when other illustrated data structures instead lack or include such information respectively, or when the amount or types of information that is stored is altered.

From the foregoing it will be appreciated that, although specific embodiments have been described herein for purposes of illustration, various modifications may be made without deviating from the spirit and scope of the invention. Accordingly, the invention is not limited except as by corresponding claims and the elements recited by those claims. In addition, while certain aspects of the invention may be presented in certain claim forms at certain times, the inventors contemplate the various aspects of the invention in any available claim form. For example, while only some aspects of the invention may be recited as being embodied in a computer-readable medium at particular times, other aspects may likewise be so embodied.

What is claimed is:

1. A computer-implemented method comprising:
    recording, by a mobile computing device having one or more cameras and under control of a user, a plurality of first panorama images at a plurality of first acquisition locations in a plurality of first rooms of a building that are a subset of multiple rooms of the building, wherein each of the first panorama images is in a spherical format and includes 360 degrees of horizontal visual coverage around a vertical axis and has visual coverage of at least some walls of one of the first rooms that contains the respective first acquisition location for that first panorama image;
    analyzing, by the mobile computing device, visual data of the first panorama images to generate room shapes of the first rooms, including:
        generating, by the mobile computing device and for each of the first panorama images, visual data of that first panorama image to generate an initial room shape of the one room in which the respective first acquisition location for that first image is located and that includes representations of the at least some walls of that one room, including determining positions of at least one of a doorway or a non-doorway wall opening in the one room, and further including determining uncertainty information for positioning of at least one wall of the at least some walls of that one room;
        combining, by the mobile computing device, and for each of at least one room of the first rooms that contains at least two acquisition locations of the first acquisition locations, the generated initial room shapes for the first panorama images acquired at the at least two acquisition locations to produce the room shape of that at least one room, including to reduce the determined uncertainty information for at least one wall of the produced room shape based on the combining; and
        selecting, by the mobile computing device, and for each of at least one other room of the first rooms that contains only one acquisition location of the first acquisition locations, the generated initial room shape for the first panorama image acquired at that only one acquisition location to produce the room shape of that at least one other room;
    generating, by the mobile computing device, a partial floor plan for the building that includes the room shapes of the first rooms positioned relative to each other, including:
        determining, by the mobile computing device, relative positioning of the first rooms based at least in part on visual overlap of the first panorama images;
        positioning, by the mobile computing device, and using the determined relative positioning and the generated room shapes for the first rooms, the generated room shapes of the first rooms relative to each other;
        generating, by the mobile computing device, a binary segmentation mask of an area of the positioned generated room shapes of the first rooms, including determining separate binary segmentation masks for each of the first rooms, and combining the separate binary segmentation masks;
        determining, by the mobile computing device, a polygon shape for the generated binary segmentation mask that represents the first rooms positioned relative to each other; and
        adding, by the mobile computing device, information to the determined polygon shape to identify positions of walls and doorways and non-doorway wall openings of the first rooms, including adding information to the partial floor plan about uncertainty information about positioning of one or more walls;
    determining, by the mobile computing device and based at least in part on the generated partial floor plan, guidance related to additional acquisition locations for the building at which to acquire additional images, including using the uncertainty information about the positioning of the one or more walls to identify at least one of the additional acquisition locations that will provide further visual data to reduce uncertainty about the positioning of the one or more walls;
    presenting, by the mobile computing device and to the user in a graphical user interface (GUI) on the mobile computing device, a visual representation of the generated partial floor plan that includes visual indications of the uncertainty information about the positioning of the one or more walls, and visual indications overlaid on the generated partial floor plan related to the additional acquisition locations, and directions to the user related to the additional acquisition locations;

recording, by the mobile computing device and after the presenting, a plurality of additional second panorama images at a plurality of second acquisition locations in additional second rooms of the building, wherein the second acquisition locations include the additional acquisition locations;

analyzing, by the mobile computing device, additional visual data of the second panorama images to generate additional room shapes of the additional second rooms;

generating, by the mobile computing device, a completed floor plan for the building that includes the additional room shapes of the additional second rooms positioned relative to each other and to the room shapes in the generated partial floor plan of the first rooms, including generating and using segmentation masks for the additional room shapes; and presenting, by the mobile computing device and to the user in the GUI, an updated visual representation of the generated completed floor plan, to enable further navigation of the building.

2. The computer-implemented method of claim 1 further comprising using the first and second panorama images to generate additional mapping information for the building that includes at least one of a three-dimensional model of an interior of the building or a virtual tour having user-selectable inter-connections between at least some of the first and second panorama images that represent at least inter-image directions, presenting information to one or more additional users that includes the updated visual representation of the generated completed floor plan and at least some of the additional mapping information for the building, and further updating information presented to the one or more additional users in response to interactions of the one or more additional users with presented information.

3. A computer-implemented method comprising:

acquiring, by a computing device having one or more cameras and for a building with multiple rooms, two or more first images for two or more rooms of the multiple rooms, wherein the first images include an image at each of two or more first acquisition locations in the two or more rooms, and wherein each of the first images has visual coverage of at least some walls of one of the two or more rooms in which the respective first acquisition location for that first image is located;

analyzing, by the computing device, visual data of the first images to generate at least partial room shapes of the two or more rooms and to determine visual overlap between the first images, including, for each of the first images, generating at least a partial room shape of the one room in which the respective first acquisition location for that first image is located and that includes at least a two-dimensional (2D) representation of the at least some walls of that one room;

generating, by the computing device, a partial floor plan for the building with room shapes of the two or more rooms positioned relative to each other, including:

determining, by the computing device, relative positioning of the two or more rooms based at least in part on the visual overlap between the first images;

positioning, by the computing device, and using the determined relative positioning and generated at least partial room shapes from the first images, the at least partial room shapes of the two or more rooms relative to each other;

generating, by the computing device, a segmentation mask of an area of the positioned at least partial room shapes of the two or more rooms, including combining separate segmentation masks for each of the two or more rooms;

determining, by the computing device, a polygon shape for the generated segmentation mask that represents the two or more rooms positioned relative to each other; and separating, by the computing device, the determined polygon shape into the room shapes of the two or more rooms positioned relative to each other;

determining, by the computing device and based at least in part on the generated partial floor plan, guidance related to one or more additional acquisition locations for the building at which to acquire one or more additional images; and presenting, by the computing device, information that includes a visual representation of the generated partial floor plan and the determined guidance related to the one or more additional acquisition locations, to cause additional images to be acquired at the one or more additional acquisition locations for use in generating a complete floor plan for the building.

4. The computer-implemented method of claim 3 wherein the analyzing of the visual data of the first images further comprises, for each of the two or more rooms, determining uncertainty information for positioning of one or more walls of that room, and wherein the determining of the guidance related to one or more additional acquisition locations for the building at which to acquire additional images includes identifying at least one of the additional acquisition locations as being at a position to reduce the determined uncertainty information for at least one wall of at least a first room of the two or more rooms.

5. The computer-implemented method of claim 4 wherein the first room contains only one of the two or more first acquisition locations at which only one of the first images is acquired, wherein a second room of the two or more rooms contains multiple of the two or more first acquisition locations at which multiple of the first images are acquired, wherein generating of the at least partial room shapes of the two or more rooms further comprises:

combining, by the computing device and to produce the partial room shape of the second room, the generated at least partial room shapes for the multiple images acquired at the multiple first acquisition locations contained in the second room, including to reduce the determined uncertainty information for at least one wall of the produced partial room shape based on the combining; and selecting, by the computing device and to produce the partial room shape of the first room, the generated at least partial room shape for the only one first image acquired at the only one first acquisition location contained in the first room to use as the partial room shape of the first room, including retaining, in the produced partial room shape of the first room, the determined uncertainty information for the one or more walls of the first room, and wherein the presenting of the visual representation of the generated partial floor plan further includes presenting visual indications of uncertainty information about the positioning of walls for at least the first room, and presenting visual indications overlaid on the generated partial floor plan related to the one or more additional acquisition locations.

6. The computer-implemented method of claim 3 wherein the analyzing of the visual data of the first images further comprises, for each of the two or more rooms, determining positions of at least one of a doorway or a non-doorway wall opening in that room, wherein the generating of the partial floor plan for the building includes adding information to the determined polygon shape to identify, for each of the two or more rooms, positions in that room of walls of that room and of the at least one of the doorway or the non-doorway wall opening for that room, and wherein the presenting of the information that includes the visual representation of the generated partial floor plan further includes presenting the added information to identify the positions in each of the two or more rooms of the walls of that room and of the at least one of the doorway or the non-doorway wall opening for that room.

7. The computer-implemented method of claim 3 wherein the two or more rooms include first rooms that are a subset of the multiple rooms, and wherein the method further comprises, after the presenting of the information that includes the visual representation of the generated partial floor plan:
acquiring, by the computing device, a plurality of additional second images at a plurality of second acquisition locations in additional second rooms of the building, wherein the second acquisition locations include the additional acquisition locations;
analyzing, by the computing device, additional visual data of the additional second images to generate additional room shapes of the additional second rooms;
generating, by the computing device, a second partial floor plan for the building that includes the additional room shapes of the additional second rooms positioned relative to each other;
determining, by the computing device, that the visual data of the first images and the additional visual data of the additional second images lack visual overlap information between the first rooms and the additional second rooms, to inhibit positioning the partial floor plan relative to the second partial floor plan;
determining, by the computing device, additional guidance related to one or more further acquisition locations for the building at which to acquire further images to provide the visual overlap information between the first rooms and the additional second rooms;
presenting, by the computing device, updated information that includes visual representations of the generated partial floor plan and of the generated second partial floor plan, and that further includes the determined additional guidance related to the one or more further acquisition locations;
acquiring, by the computing device, a plurality of additional third images at a plurality of additional third acquisition locations, wherein the third acquisition locations include the further acquisition locations;
analyzing, by the computing device, further visual data of the additional third images, including to determine the visual overlap information between the first rooms and the additional second rooms;
generating, by the computing device, a completed floor plan for the building that includes the generated partial floor plan and the generated second partial floor plan positioned relative to each other; and
presenting, by the computing device, a visual representation of the generated completed floor plan, to enable further navigation of the building.

8. A system comprising:
one or more hardware processors of one or more computing devices; and
one or more memories with stored instructions that, when executed by at least one of the one or more hardware processors, cause at least one of the one or more computing devices to perform automated operations including at least:
obtaining, for a building with multiple rooms, two or more first images acquired at two or more first acquisition locations in two or more rooms of the multiple rooms, wherein each of the first images has visual coverage of at least some walls of one of the two or more rooms containing the respective first acquisition location for that first image;
analyzing visual data of the first images to generate initial room shapes of the two or more rooms, including, for each of the first images, generating a shape of the one room in which the respective first acquisition location for that first image is located and that includes a representation of the at least some walls of that one room;
generating, a partial floor plan for the building with defined room shapes of the two or more rooms positioned relative to each other, including:
determining relative positioning of the two or more rooms based at least in part on the visual data of the first images, and positioning the generated initial room shapes of the two or more rooms relative to each other based on the determined relative positioning; and
generating a segmentation mask of an area of the positioned generated initial room shapes of the two or more rooms, determining a polygon shape for the generated segmentation mask that represents the two or more rooms positioned relative to each other, and separating the determined polygon shape into the defined room shapes of the two or more rooms;
determining, based at least in part on information associated with the generated partial floor plan, guidance related to one or more additional acquisition locations for the building at which to acquire one or more additional images; and
providing information that includes the generated partial floor plan and the determined guidance related to the one or more additional acquisition locations, to enable additional images to be acquired at the one or more additional acquisition locations for use in generating a complete floor plan for the building.

9. The system of claim 8 wherein the at least one computing device is a mobile computing device with one or more cameras, wherein the obtaining of the first images includes acquiring the first images by the mobile computing device under control of a user, and wherein the providing of the information includes displaying, in a graphical user interface and to the user, a visual representation of the generated partial floor plan and the determined guidance.

10. The system of claim 8 wherein the generating of the segmentation mask of the area of the positioned generated initial room shapes of the two or more rooms incudes determining separate binary segmentation masks for each of the two or more rooms and combining the separate binary segmentation masks to generate an overall binary segmentation mask of the area of the positioned generated initial room shapes of the two or more rooms.

11. The system of claim 8 wherein the analyzing of the visual data of the first images further includes determining visual overlap between the first images, and wherein the determining of the relative positioning of the two or more rooms based at least in part on the visual data of the first images includes using the determined visual overlap to identify the relative positioning.

12. The system of claim 8 wherein the analyzing of the visual data of the first images includes, for each of the two or more rooms, determining uncertainty information for positioning of one or more walls of that room, and wherein the determining of the guidance related to one or more additional acquisition locations includes selecting at least one of the additional acquisition locations to reduce the determined uncertainty information for at least one wall of at least a first room of the two or more rooms.

13. The system of claim 12 wherein the generated shapes for each of the first images is at least a partial room shape for the one room in which the respective first acquisition location for that first image is located, wherein the first room contains only one of the two or more first acquisition locations at which only one of the first images is acquired, wherein a second room of the two or more rooms contains multiple of the two or more first acquisition locations at which multiple of the first images are acquired,
wherein generating of the initial room shapes of the two or more rooms further includes:
combining, to produce the initial room shape of the second room, the at least partial room shapes for the multiple images acquired at the multiple first acquisition locations contained in the second room, including to reduce the determined uncertainty information for at least one wall of the produced initial room shape based on the combining; and
selecting, to produce the initial room shape of the first room, the at least partial room shape for the only one first image acquired at the only one first acquisition location contained in the first room to use as the initial room shape of the first room, including retaining, in the produced initial room shape of the first room, the determined uncertainty information for the one or more walls of the first room,
and wherein the providing of the information that includes the visual representation of the generated partial floor plan further includes presenting a visual representation of the generated partial floor plan with visual indications of uncertainty information about the positioning of walls for at least the first room, and presenting visual indications overlaid on the generated partial floor plan related to the one or more additional acquisition locations.

14. The system of claim 8 wherein the analyzing of the visual data of the first images further includes, for each of the two or more rooms, determining positions of at least one of a doorway or a non-doorway wall opening in that room, wherein the generating of the partial floor plan for the building involves including information in the defined room shapes of the two or more rooms to identify, for each of the two or more rooms, positions in that room of walls of that room and of the at least one of the doorway or the non-doorway wall opening for that room, and wherein the providing of the information further includes presenting a visual representation of the generated partial floor plan with visual indications of the added information to identify the positions in each of the two or more rooms of the walls of that room and of the at least one of the doorway or the non-doorway wall opening for that room.

15. The system of claim 8 wherein the two or more rooms include first rooms that are a subset of the multiple rooms, and wherein the automated operations further include, after the providing of the information that includes the visual representation of the generated partial floor plan:
acquiring a plurality of additional second images at a plurality of second acquisition locations in additional second rooms of the building, wherein the second acquisition locations include the additional acquisition locations;
analyzing additional visual data of the additional second images to generate additional room shapes of the additional second rooms;
generating a second partial floor plan for the building that includes the additional room shapes of the additional second rooms positioned relative to each other;
determining that the visual data of the first images and the additional visual data of the additional second images lack visual overlap information between the first rooms and the additional second rooms;
determining additional guidance related to one or more further acquisition locations for the building at which to acquire further images to provide the visual overlap information between the first rooms and the additional second rooms; and
providing updated information that includes visual representations of the generated partial floor plan and of the generated second partial floor plan, and that further includes the determined additional guidance related to the one or more further acquisition locations.

16. The system of claim 15 wherein the automated operations further include, after the providing of the updated information:
acquiring a plurality of additional third images at a plurality of additional third acquisition locations, wherein the third acquisition locations include the further acquisition locations;
analyzing further visual data of the additional third images, including to determine the visual overlap information between the first rooms and the additional second rooms;
generating a completed floor plan for the building that includes the generated partial floor plan and the generated second partial floor plan positioned relative to each other; and
providing a visual representation of the generated completed floor plan, to enable further navigation of the building.

17. The system of claim 8 wherein the determining of the guidance related to the one or more additional acquisition locations for the building is based on one or more problems identified in the visual data of the first images and includes generating one or more instructions to use in correcting the one or more problems.

18. The system of claim 17 wherein identifying of the one or more problems in the visual data of the first images is based on, for at least one of the first acquisition locations, at least one of a distance to at least one wall from the at least one first acquisition location, or at least one door blocking a view of another room separate from the room containing the at least one first acquisition location, or at least one object in the room containing the at least one first acquisition location that blocks at least some of that room, or at least one type of room that is not included in the two or more rooms, or a lack of inter-image line-of-sight between visual data of at least two of the first images.

19. The system of claim 8 wherein the providing of the information includes presenting, to a user participating in acquiring of images for the building, the generated partial floor plan and the determined guidance related to the one or more additional acquisition locations, including to present at least one of a location on the presented generated partial floor plan of one of the additional acquisition locations, or a direction on the presented generated partial floor plan to move toward one of the additional acquisition locations, or a location on the presented generated partial floor plan of a door to open, or a location on the presented generated partial floor plan of an obstacle to move, or a location on the presented generated partial floor plan of an obstacle to move around, or textual directions describing a location on the presented generated partial floor plan of one of the additional acquisition locations, or textual directions describing a direction to move toward one of the additional acquisition locations, or textual directions describing a door to open, or textual directions describing an obstacle to move, or textual directions describing an obstacle to move around, or textual directions describing at least one type of room that is not included in the two or more rooms and in which to acquire at least one additional image.

20. The system of claim 8 wherein the at least one computing device is a mobile computing device with one or more cameras, wherein the first images are each a panorama image having 360 degrees of horizontal visual coverage around a vertical axis, wherein acquiring of the first images is performed without using any depth information from any depth-sensing sensors for distances to surrounding surfaces and includes using one or more inertial measurement unit (IMU) sensors of the at least one computing device to acquire movement data, and wherein the stored instructions include software instructions that, when executed by the one or more hardware processors, cause the at least one computing device to perform further automated operations including:
determining, for each of the first images, acquisition pose information based at least in part on the movement data acquired by the one or more IMU sensors during acquiring of that first image and on visual data of that first image,
and wherein the determining of the initial estimated room shape for each of the one or more first images is based in part on the respective determined acquisition pose information for each of the one or more first images.

21. The system of claim 8 wherein the automated operations further include at least one of:
determining uncertainty information associated with one or more walls of the two or more rooms, and excluding the one or more walls from the generated initial room shapes based at least in part on the determined uncertainty information; or
determining uncertainty information associated with one or more walls of the two or more rooms, and representing the determined uncertainty information for the one or more walls in the generated initial room shapes; or
performing the generating of the initial room shapes of the two or more rooms by, for each of the two or more rooms, using one or more trained machine learning models to identify a boundary between at least one of a floor or a ceiling of that room and walls of that room, and creating the initial room shape for that room as a two-dimensional representation of the walls of that room; or
performing the generating of the initial room shapes of the two or more rooms by, for each of the two or more rooms, generating a three-dimensional model with planar surfaces that represent walls of that room, and using the generated three-dimensional model as the initial room shape for that room; or
performing the generating of the initial room shapes of the two or more rooms by, for each of the two or more rooms, generating a three-dimensional model having a plurality of three-dimensional data points that represent points on walls of that room, and using the generated three-dimensional model as the initial room shape for that room; or
fitting the generated partial floor plan to a portion of an outline of the building visible on an overhead image of the building, and performing the providing of the information by presenting, to a user participating in acquiring of images for the building and based on the fitting, the generated partial floor plan overlaid on the overhead image of the building; or
fitting the generated partial floor plan to a portion of an outline of the building visible on an overhead image of the building, and performing the providing of the information by presenting, to a user participating in acquiring of images for the building and based on the fitting, the determined guidance overlaid on the overhead image of the building at one or more positions related to the one or more additional acquisition locations; or
fitting the generated partial floor plan to a portion of one of a plurality of defined plan templates, and performing the providing of the information by presenting, to a user participating in acquiring of images for the building and based on the fitting, the generated partial floor plan overlaid on the one defined plan template; or
fitting the generated partial floor plan to a portion of one of a plurality of defined plan templates, and performing the providing of the information by presenting, to a user participating in acquiring of images for the building and based on the fitting, the determined guidance overlaid on the one defined plan template at one or more positions related to the one or more additional acquisition locations.

22. A non-transitory computer-readable medium having stored contents that cause one or more computing devices to perform automated operations including at least:
acquiring, by one of the computing devices that has one or more cameras, two or more first images at two or more first acquisition locations in a building having multiple rooms, wherein each of the first images has visual coverage of at least some walls of one of the rooms in which the respective first acquisition location for that first image is located;
analyzing, by the one or more computing devices, visual data of the first images to determine visual overlap between the first images and to generate one or more initial room shapes, including:
generating, for each of the first images, a shape of the one room in which the respective first acquisition location for that first image is located and that includes a representation of at least some walls of that one room; and
combining, for at least one room containing at least two of the first acquisition locations, the generated shapes of that room for the first images acquired at the at least two acquisition locations to produce one of the initial room shapes that is for that room;
generating, by the one or more computing devices, partial mapping information for the building using one or more defined room shapes of one or more rooms containing the first acquisition locations, including:

generating, by the one or more computing devices, a segmentation mask of an area of the generated one or more initial room shapes at one or more positions that reflect the determined visual overlap;

determining, by the one or more computing devices, a polygon shape for the generated segmentation mask that represents the one or more rooms; and producing, by the one or more computing devices, the one or more defined room shapes from the determined polygon shape;

determining, by the one or more computing devices and based at least in part on information associated with the generated partial mapping information, guidance related to one or more additional acquisition locations for the building at which to acquire one or more additional images; and providing, by the one or more computing devices, information that includes the generated partial mapping information and the determined guidance related to the one or more additional acquisition locations, to enable additional images to be acquired at the one or more additional acquisition locations for use in generating completed mapping information for the building.

23. The non-transitory computer-readable medium of claim 22 wherein the one computing device with the one or more cameras is a mobile computing device and the one or more computing devices include only that mobile computing device, wherein the acquiring of the first images is performed under control of a user, and wherein the providing of the information includes displaying, in a graphical user interface and to the user, a visual representation of the generated mapping information and the determined guidance.

24. The non-transitory computer-readable medium of claim 22 wherein the two or more first acquisition locations are in two or more rooms of the building, wherein generating of the one or more initial room shapes involves generating initial room shapes for the two or more rooms, including producing the initial room shape for the at least one room using the combining and further including producing an additional initial room shape for another room of the two or more rooms that contains only a single one of the first acquisition locations by selecting the shape generated for the first image acquired at that single one acquisition location as the additional initial room shape for the another room, wherein the generated partial mapping information includes a partial floor plan of the building with defined room shapes of the two or more rooms positioned relative to each other, wherein the generating of the partial mapping information further includes:

determining, by the one or more computing devices, relative positioning of the two or more rooms based at least in part on the visual overlap between the first images; and positioning, by the one or more computing devices, and using the determined relative positioning, the generated initial room shapes of the two or more rooms relative to each other, wherein the generating of the segmentation mask is for an area of the positioned generated initial room shapes of the two or more rooms, and wherein the producing of the one or more defined room shapes from the determined polygon shape includes separating the determined polygon shape into the defined room shapes of the two or more rooms.

25. The non-transitory computer-readable medium of claim 24 wherein the generating of the segmentation mask for the area of the positioned generated initial room shapes of the two or more rooms further incudes determining separate binary segmentation masks for each of the two or more rooms and combining the separate binary segmentation masks to generate an overall binary segmentation mask of the area of the positioned generated initial room shapes of the two or more rooms.

26. The non-transitory computer-readable medium of claim 22 wherein the automated operations further include acquiring the additional images and using additional visual data of the additional images to complete generation of the mapping information for the building and presenting the mapping information to enable interactions with the presented mapping information by one or more users, and wherein the mapping information for the building includes at least one of a three-dimensional model of an interior of the building or a virtual tour having user-selectable inter-connections between at least some of the first and additional images that represent at least inter-image directions.

* * * * *